United States Patent
Yamazaki et al.

(10) Patent No.: US 11,967,505 B2
(45) Date of Patent: Apr. 23, 2024

(54) METHOD FOR MANUFACTURING SPUTTERING TARGET, METHOD FOR FORMING OXIDE FILM, AND TRANSISTOR

(71) Applicant: Semiconductor Energy Laboratory Co., Ltd., Atsugi (JP)

(72) Inventors: Shunpei Yamazaki, Setagaya (JP); Masashi Tsubuku, Atsugi (JP); Masashi Oota, Atsugi (JP); Yoichi Kurosawa, Atsugi (JP); Noritaka Ishihara, Koza (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/137,572

(22) Filed: Apr. 21, 2023

(65) Prior Publication Data

US 2023/0260785 A1  Aug. 17, 2023

Related U.S. Application Data

(63) Continuation of application No. 17/491,637, filed on Oct. 1, 2021, now Pat. No. 11,637,015, which is a (Continued)

(30) Foreign Application Priority Data

Feb. 28, 2013  (JP) .................. 2013-038402

(51) Int. Cl.
  *H01L 29/04* (2006.01)
  *B82Y 30/00* (2011.01)
  (Continued)

(52) U.S. Cl.
  CPC ........ *H01L 21/02631* (2013.01); *B82Y 30/00* (2013.01); *C01G 15/006* (2013.01);
  (Continued)

(58) Field of Classification Search
  CPC ............ C01G 15/006; H01L 21/02565; H01L 29/045; H01L 29/66969; H01L 29/7869
  See application file for complete search history.

(56) References Cited

U.S. PATENT DOCUMENTS 5,528,032 A  6/1996  Uchiyama
5,731,856 A  3/1998  Kim et al.
(Continued)

FOREIGN PATENT DOCUMENTS

CN   101680081 A   3/2010
CN   102403361 A   4/2012
(Continued)

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
(Continued)

*Primary Examiner* — Khanh T Nguyen
(74) *Attorney, Agent, or Firm* — Eric J. Robinson; Robinson Intellectual Property Law Office, P.C.

(57) ABSTRACT

A method for manufacturing a sputtering target with which an oxide semiconductor film with a small amount of defects can be formed is provided. Alternatively, an oxide semiconductor film with a small amount of defects is formed. A method for manufacturing a sputtering target is provided, which includes the steps of: forming a polycrystalline In-M-Zn oxide (M represents a metal chosen among aluminum, titanium, gallium, yttrium, zirconium, lanthanum, cesium, neodymium, and hafnium) powder by mixing, sintering, and grinding indium oxide, an oxide of the metal, and zinc oxide; forming a mixture by mixing the polycrystalline In-M-Zn oxide powder and a zinc oxide powder; forming a compact by compacting the mixture; and sintering the compact.

5 Claims, 43 Drawing Sheets

Related U.S. Application Data continuation of application No. 16/730,292, filed on Dec. 30, 2019, now Pat. No. 11,139,166, which is a continuation of application No. 15/451,715, filed on Mar. 7, 2017, now Pat. No. 10,522,347, which is a continuation of application No. 15/006,607, filed on Jan. 26, 2016, now abandoned, which is a continuation of application No. 14/187,960, filed on Feb. 24, 2014, now Pat. No. 9,267,199.

(51) Int. Cl.
| | | |
|---|---|---|
| *C01G 15/00* | (2006.01) | |
| *C23C 14/08* | (2006.01) | |
| *C23C 14/34* | (2006.01) | |
| *C30B 1/04* | (2006.01) | |
| *C30B 23/08* | (2006.01) | |
| *C30B 28/02* | (2006.01) | |
| *C30B 29/22* | (2006.01) | |
| *C30B 29/68* | (2006.01) | |
| *H01J 37/34* | (2006.01) | |
| *H01L 21/02* | (2006.01) | |
| *H01L 29/24* | (2006.01) | |
| *H01L 29/66* | (2006.01) | |
| *H01L 29/786* | (2006.01) | |

(52) U.S. Cl.
CPC ............ *C23C 14/08* (2013.01); *C23C 14/086* (2013.01); *C23C 14/3414* (2013.01); *C30B 1/04* (2013.01); *C30B 23/08* (2013.01); *C30B 28/02* (2013.01); *C30B 29/22* (2013.01); *C30B 29/68* (2013.01); *H01J 37/3429* (2013.01); *H01L 21/02565* (2013.01); *H01L 21/02609* (2013.01); *H01L 29/045* (2013.01); *H01L 29/24* (2013.01); *H01L 29/66969* (2013.01); *H01L 29/7869* (2013.01); *H01L 29/78696* (2013.01); *C01P 2002/32* (2013.01); *C01P 2002/72* (2013.01); *C01P 2002/85* (2013.01); *C01P 2004/04* (2013.01); *C01P 2004/61* (2013.01); *C01P 2004/62* (2013.01); *C01P 2004/64* (2013.01); *H01J 2237/081* (2013.01); *H01J 2237/3322* (2013.01); *H01J 2237/3323* (2013.01)

(56) References Cited

U.S. PATENT DOCUMENTS

| | | |
|---|---|---|
| 5,744,864 A | 4/1998 | Cillessen et al. |
| 5,972,527 A | 10/1999 | Kaijou et al. |
| 6,294,274 B1 | 9/2001 | Kawazoe et al. |
| 6,534,183 B1 | 3/2003 | Inoue |
| 6,563,174 B2 | 5/2003 | Kawasaki et al. |
| 6,669,830 B1 | 12/2003 | Inoue et al. |
| 6,689,477 B2 | 2/2004 | Inoue |
| 6,727,522 B1 | 4/2004 | Kawasaki et al. |
| 6,907,849 B2 | 6/2005 | Galvin |
| 6,998,070 B2 | 2/2006 | Inoue et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,306,861 B2 | 12/2007 | Inoue et al. |
| 7,323,356 B2 | 1/2008 | Hosono et al. |
| 7,385,224 B2 | 6/2008 | Ishii et al. |
| 7,393,600 B2 | 7/2008 | Inoue et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito. et al. |
| 7,510,635 B2 | 3/2009 | Shindo. et al. |
| 7,648,657 B2 | 1/2010 | Inoue et al. |
| 7,674,650 B2 | 3/2010 | Akimoto et al. |
| 7,732,819 B2 | 6/2010 | Akimoto et al. |
| 7,959,982 B2 | 6/2011 | Le Craz |
| 8,058,645 B2 | 11/2011 | Jeong et al. |
| 8,137,594 B2 | 3/2012 | Imanishi et al. |
| 8,148,779 B2 | 4/2012 | Jeong et al. |
| 8,153,031 B2 | 4/2012 | Yano et al. |
| 8,178,926 B2 | 5/2012 | Nakayama |
| 8,202,365 B2 | 6/2012 | Umeda et al. |
| 8,274,078 B2 | 9/2012 | Itagaki et al. |
| 8,304,359 B2 | 11/2012 | Yano et al. |
| 8,319,218 B2 | 11/2012 | Yamazaki et al. |
| 8,329,506 B2 | 12/2012 | Akimoto et al. |
| 8,333,913 B2 | 12/2012 | Inoue et al. |
| 8,384,080 B2 | 2/2013 | Taniguchi et al. |
| 8,455,371 B2 | 6/2013 | Yano et al. |
| 8,492,862 B2 | 7/2013 | Yamazaki et al. |
| 8,502,217 B2 | 8/2013 | Sato et al. |
| 8,569,754 B2 | 10/2013 | Yamazaki et al. |
| 8,643,011 B2 | 2/2014 | Akimoto et al. |
| 8,669,556 B2 | 3/2014 | Yamazaki et al. |
| 8,680,522 B2 | 3/2014 | Yamazaki et al. |
| 8,680,529 B2 | 3/2014 | Kimura |
| 8,692,252 B2 | 4/2014 | Takata et al. |
| 8,710,762 B2 | 4/2014 | Takahashi et al. |
| 8,748,215 B2 | 6/2014 | Yamazaki |
| 8,748,881 B2 | 6/2014 | Yamazaki |
| 8,759,820 B2 | 6/2014 | Godo et al. |
| 8,779,420 B2 | 7/2014 | Yamazaki |
| 8,884,272 B2 | 11/2014 | Hama et al. |
| 8,912,536 B2 | 12/2014 | Maeng et al. |
| 8,941,127 B2 | 1/2015 | Koyama et al. |
| 8,952,377 B2 | 2/2015 | Yamazaki et al. |
| 8,994,021 B2 | 3/2015 | Yamazaki et al. |
| 9,040,995 B2 | 5/2015 | Kimura |
| 9,054,205 B2 | 6/2015 | Yamazaki et al. |
| 9,196,745 B2 | 11/2015 | Yamazaki et al. |
| 9,214,520 B2 | 12/2015 | Yamazaki |
| 9,252,288 B2 | 2/2016 | Akimoto et al. |
| 9,306,072 B2 | 4/2016 | Yamazaki et al. |
| 9,331,208 B2 | 5/2016 | Yamazaki et al. |
| 9,508,862 B2 | 11/2016 | Kimura |
| 9,520,287 B2 | 12/2016 | Yamazaki |
| 9,530,897 B2 | 12/2016 | Yamazaki et al. |
| 9,543,835 B2 | 1/2017 | Takahashi et al. |
| 9,711,655 B2 | 7/2017 | Yamazaki et al. |
| 9,887,298 B2 | 2/2018 | Yamazaki |
| 9,893,200 B2 | 2/2018 | Akimoto et al. |
| 10,043,918 B2 | 8/2018 | Yamazaki et al. |
| 10,068,926 B2 | 9/2018 | Kimura |
| 10,103,277 B2 | 10/2018 | Yamazaki et al. |
| 10,283,530 B2 | 5/2019 | Kimura |
| 10,403,763 B2 | 9/2019 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0222089 A1 | 11/2004 | Inoue et al. |
| 2005/0017302 A1 | 1/2005 | Hoffman |
| 2005/0170311 A1 | 8/2005 | Tardieu et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |

(56) References Cited

U.S. PATENT DOCUMENTS

| | | |
|---|---|---|
| 2006/0113565 A1 | 6/2006 | Abe et al. |
| 2006/0169973 A1 | 8/2006 | Isa. et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0098626 A1 | 5/2007 | Shindo. et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0197757 A1 | 8/2009 | Fukushima |
| 2009/0278122 A1 | 11/2009 | Hosono et al. |
| 2009/0280600 A1 | 11/2009 | Hosono et al. |
| 2010/0009314 A1 | 1/2010 | Tardieu et al. |
| 2010/0065844 A1 | 3/2010 | Tokunaga |
| 2010/0092800 A1 | 4/2010 | Itagaki et al. |
| 2010/0108502 A1 | 5/2010 | Inoue et al. |
| 2010/0109002 A1 | 5/2010 | Itagaki et al. |
| 2010/0173106 A1 | 7/2010 | Lecraz |
| 2010/0300878 A1 | 12/2010 | Osada et al. |
| 2010/0320458 A1 | 12/2010 | Umeda et al. |
| 2010/0320459 A1 | 12/2010 | Umeda et al. |
| 2011/0042668 A1 | 2/2011 | Hama et al. |
| 2011/0114480 A1 | 5/2011 | Yamazaki et al. |
| 2011/0114944 A1 | 5/2011 | Yamazaki et al. |
| 2011/0114999 A1 | 5/2011 | Yamazaki et al. |
| 2011/0127521 A1* | 6/2011 | Yamazaki ......... H01L 21/02488 156/60 |
| 2011/0140100 A1 | 6/2011 | Takata et al. |
| 2011/0151618 A1 | 6/2011 | Yamazaki et al. |
| 2011/0168994 A1 | 7/2011 | Kawashima et al. |
| 2011/0177696 A1 | 7/2011 | Yano et al. |
| 2011/0180392 A1 | 7/2011 | Yano et al. |
| 2011/0198594 A1 | 8/2011 | Yamazaki |
| 2011/0240935 A1 | 10/2011 | Yano et al. |
| 2011/0241011 A1 | 10/2011 | Koyama et al. |
| 2011/0244652 A1 | 10/2011 | Yamazaki et al. |
| 2011/0260118 A1 | 10/2011 | Yano et al. |
| 2011/0260157 A1 | 10/2011 | Yano et al. |
| 2011/0275032 A1 | 11/2011 | Tardieu et al. |
| 2011/0284848 A1 | 11/2011 | Yamazaki |
| 2012/0012847 A1 | 1/2012 | Koyama et al. |
| 2012/0032162 A1 | 2/2012 | Matsubayashi |
| 2012/0049183 A1 | 3/2012 | Yamazaki |
| 2012/0052606 A1 | 3/2012 | Yamazaki |
| 2012/0052624 A1 | 3/2012 | Yamazaki |
| 2012/0056176 A1 | 3/2012 | Yamazaki |
| 2012/0061663 A1 | 3/2012 | Yamazaki et al. |
| 2012/0062813 A1 | 3/2012 | Koyama |
| 2012/0062814 A1 | 3/2012 | Yamazaki et al. |
| 2012/0104385 A1 | 5/2012 | Godo et al. |
| 2012/0126223 A1 | 5/2012 | Maeng et al. |
| 2012/0138922 A1 | 6/2012 | Yamazaki et al. |
| 2012/0152728 A1 | 6/2012 | Yamazaki |
| 2012/0312681 A1 | 12/2012 | Yamazaki et al. |
| 2012/0319100 A1 | 12/2012 | Yoshioka et al. |
| 2013/0009219 A1 | 1/2013 | Yamazaki et al. |
| 2013/0133808 A1 | 5/2013 | Yamazaki et al. |
| 2014/0131696 A1 | 5/2014 | Ono et al. |
| 2017/0033231 A1 | 2/2017 | Yamazaki |
| 2017/0069765 A1 | 3/2017 | Yamazaki et al. |
| 2018/0308989 A1 | 10/2018 | Yamazaki et al. |
| 2018/0366588 A1 | 12/2018 | Yamazaki et al. |
| 2019/0081082 A1 | 3/2019 | Kimura |

FOREIGN PATENT DOCUMENTS

| | | |
|---|---|---|
| CN | 102867854 A | 1/2013 |
| EP | 0486182 A | 5/1992 |
| EP | 1737044 A | 12/2006 |
| EP | 2226847 A | 9/2010 |
| EP | 3249698 A | 11/2017 |
| JP | 60-198861 A | 10/1985 |
| JP | 62-122011 A | 6/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-104937 A | 4/1992 |
| JP | 05-251705 A | 9/1993 |
| JP | 06-088218 A | 3/1994 |
| JP | 06-340468 A | 12/1994 |
| JP | 07-333438 A | 12/1995 |
| JP | 08-264794 A | 10/1996 |
| JP | 11-505377 | 5/1999 |
| JP | 11-286002 A | 10/1999 |
| JP | 2000-044236 A | 2/2000 |
| JP | 2000-150900 A | 5/2000 |
| JP | 2002-076356 A | 3/2002 |
| JP | 2002-265221 A | 9/2002 |
| JP | 2002-289859 A | 10/2002 |
| JP | 2003-041362 A | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-073312 A | 3/2007 |
| JP | 2009-057605 A | 3/2009 |
| JP | 2009-141002 A | 6/2009 |
| JP | 2009-167095 A | 7/2009 |
| JP | 2009-275272 A | 11/2009 |
| JP | 2010-018457 A | 1/2010 |
| JP | 2010-070418 A | 4/2010 |
| JP | 2010-153802 A | 7/2010 |
| JP | 2010-177431 A | 8/2010 |
| JP | 2010-186860 A | 8/2010 |
| JP | 2011-058012 A | 3/2011 |
| JP | 2011-066375 A | 3/2011 |
| JP | 2011-084765 A | 4/2011 |

(56) References Cited

FOREIGN PATENT DOCUMENTS

| | | |
|---|---|---|
| JP | 2011-100979 A | 5/2011 |
| JP | 2011-124360 A | 6/2011 |
| JP | 2011-135063 A | 7/2011 |
| JP | 2011-135066 A | 7/2011 |
| JP | 2011-227477 A | 11/2011 |
| JP | 2012-019682 A | 1/2012 |
| JP | 2012-059860 A | 3/2012 |
| JP | 2012-064932 A | 3/2012 |
| JP | 2012-114426 A | 6/2012 |
| JP | 2012-134475 A | 7/2012 |
| JP | 2012-248829 A | 12/2012 |
| JP | 2012-248868 A | 12/2012 |
| JP | 2013-030682 A | 2/2013 |
| JP | 2013-038399 A | 2/2013 |
| KR | 2006-0056399 A | 5/2006 |
| KR | 2007-0087226 A | 8/2007 |
| KR | 2009-0122391 A | 11/2009 |
| KR | 2012-0026005 A | 3/2012 |
| KR | 2012-0054496 A | 5/2012 |
| KR | 2013-0006344 A | 1/2013 |
| WO | WO-2004/114391 | 12/2004 |
| WO | WO-2005/033355 | 4/2005 |
| WO | WO-2008/114588 | 9/2008 |
| WO | WO-2009/072532 | 6/2009 |
| WO | WO-2010/093051 | 8/2010 |
| WO | WO-2011/043176 | 4/2011 |
| WO | WO-2011/065216 | 6/2011 |
| WO | WO-2011/065243 | 6/2011 |
| WO | WO-2011/122271 | 10/2011 |
| WO | WO-2011/155295 | 12/2011 |
| WO | WO-2012/073844 | 6/2012 |

OTHER PUBLICATIONS

Nakamura.M et al., "Syntheses and crystal structures of new homologous compounds, indium iron zinc oxides (InFeO3(ZnO)m) (m natural number) and related compounds", Kotai Butsuri (Solid State Physics), 1993, vol. 28, No. 5, pp. 317-327.

Kobayashi.M et al., "InGaZnO TFT Deposition Technology for Large Substrates", ULVAC Technical Journal, 2010, No. 73E, pp. 10-17.

Ogawa.N et al., "Study of ZAO Targets—Effect of Target Crystallographic Orientation-", Journal of TOSOH Research, Jul. 1, 1992, vol. 36, No. 2, pp. 161-166.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Silva.J et al., "Rules of Structure Formation for the Homologous InMO3(ZnO)n Compounds", Phys. Rev. Lett. (Physical Review Letters), Jun. 27, 2008, vol. 100, pp. 255501-1-255501-4.

Yan.Y et al., "Polytypoid structures in annealed In2O3.ZnO films", Appl. Phys. Lett. (Applied Physics Letters), Nov. 2, 1998, vol. 73, No. 18, pp. 2585-2587.

Japanese Office Action (Application No. 2012-123954) dated Dec. 3, 2013.

Asakuma.N et al., "Crystallization and Reduction of Sol-Gel-Derived Zinc Oxide Films By Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions On Electron Devices, Jul. 1, 1995, vol. 42, No. 7, pp. 1240-1246.

Cho.D et al., "21.2:Al and Sn-Doped Zinc Indium Oxide Thin Film Transistors for Amoled Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS On Glass and Plastic Substrates Fabricated By TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis On Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects In ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters) , 2005, vol. 87, pp. 122102-1-122102-3.

Jeong.J et al., "3.1: Distinguished Paper: 12.1-Inch WXGA Amoled Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper: World-Largest (6.5") Flexible Full Color Top Emission Amoled Display On Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

(56) References Cited

OTHER PUBLICATIONS

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] At Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS On Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status Of, Challenges To, and Perspective View of Am-Oled ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors By DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics On Their Way To Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem Oleds", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. Qvga Amoled Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch Qvga Amoled Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size Amoled", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure To Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors By Ar Plasma Treatment", Appl. Phys. Lett. (Applied Physics Letters) , Jun. 26, 2007, vol. 90, No. 26, p. 262106-1-262106-3.

Park.S et al., "Challenge To Future Displays: Transparent Am-Oled Driven By Peald Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. Amoled Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA Amoled Driven By the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

(56) References Cited

OTHER PUBLICATIONS

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor On SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

* cited by examiner $InGaO_3(ZnO)_1$ $InGaO_3(ZnO)_3$ $InGaO_3(ZnO)_2$

Zn ● O

Zn ● O

Zn ● O

127a { }-(Ga,Zn)O
}-InO$_2$
}-(Ga,Zn)O

● In
○ Ga or Zn
● O

127b {
}-(Ga,Zn)O
}-(Ga,Zn)O
}-InO$_2$
}-(Ga,Zn)O
}-(Ga,Zn)O

● In
○ Ga or Zn
● O

129 {
}-(Ga,Zn)O
}-InO$_2$
}-(Ga,Zn)O
}-ZnO

● In
○ Ga or Zn
○ Zn
● O

Ga or Zn
O
In c-axis

Cleavage plane
1st layer
2nd layer

CAAC nc

Zn : ○   O : ●

FIG. 21A1
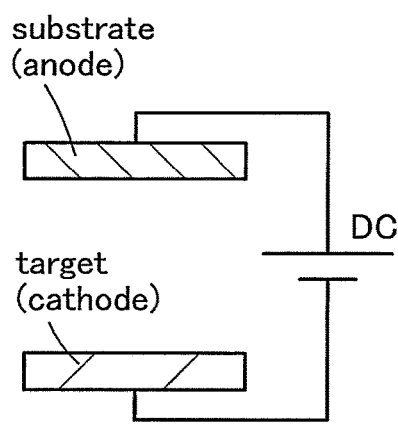
FIG. 21A2
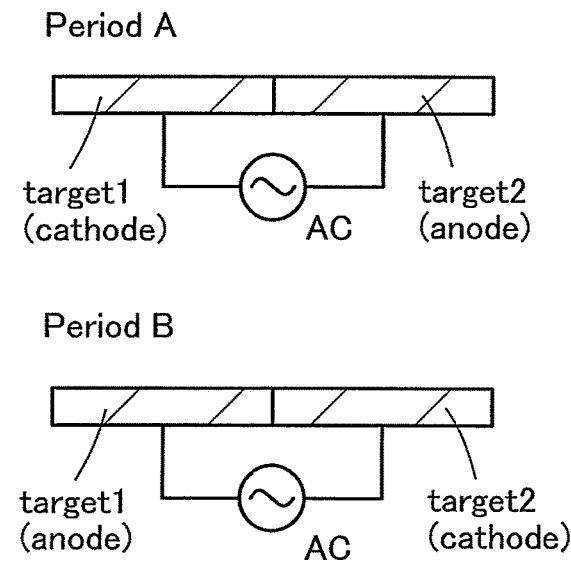
FIG. 21B1
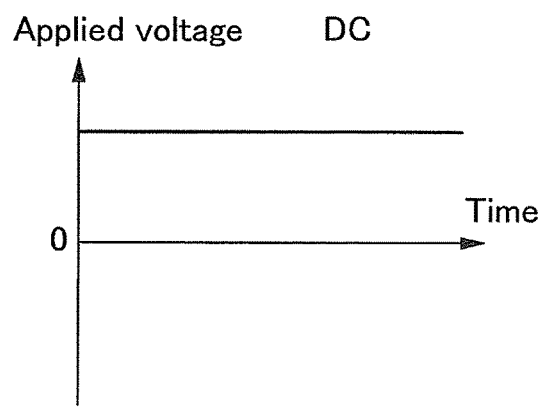
FIG. 21B2
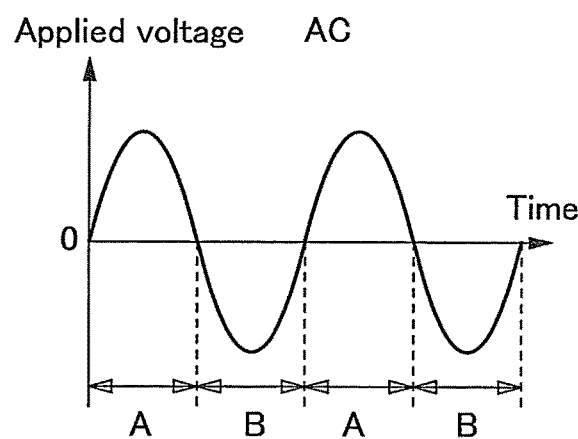

(In:Ga:Zn) indicates the composition of the sputtering target in atomic ratios s: spinel structure h: homologous structure
s: spinel structure h: homologous structure (In Ga Zn)
※Compositon of the sputtering target (in atomic ratio)

◆: In-Ga-Zn oxide film having a homologous tructure
■: In-Ga-Zn oxide film having a spinel structure
※White symbols: target composition
※Black symbols: film composition FIG. 37A    Sample 2   IGZO(In:Ga:Zn=1:3:4)    FIG. 37B
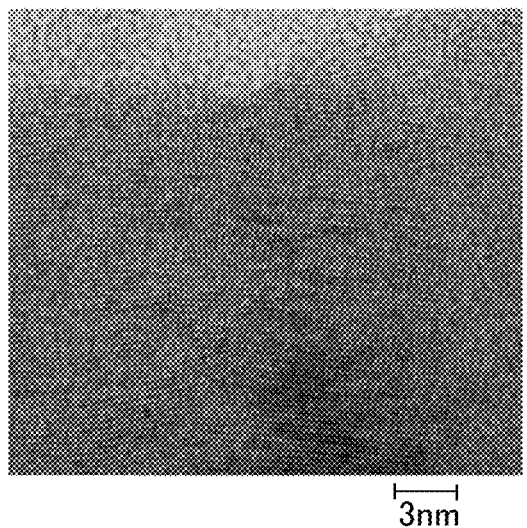
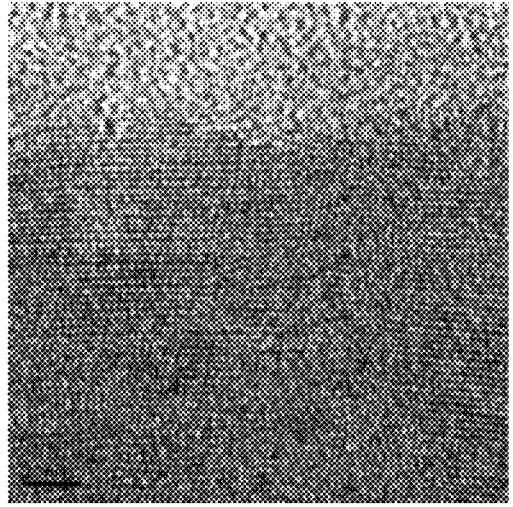
3nm
FIG. 37C    Sample 3    IGZO(In:Ga:Zn=1:3:6)    FIG. 37D
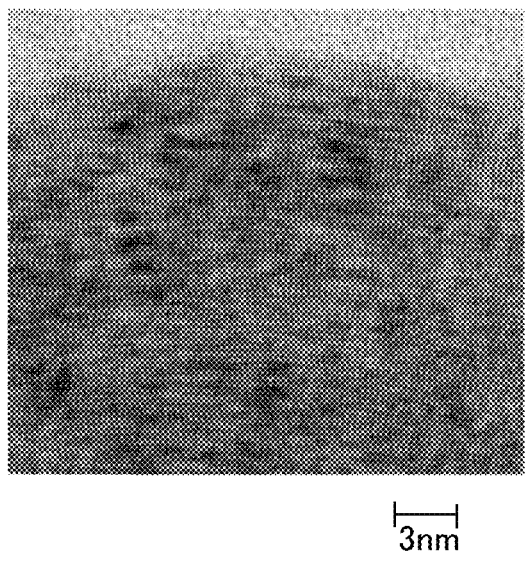
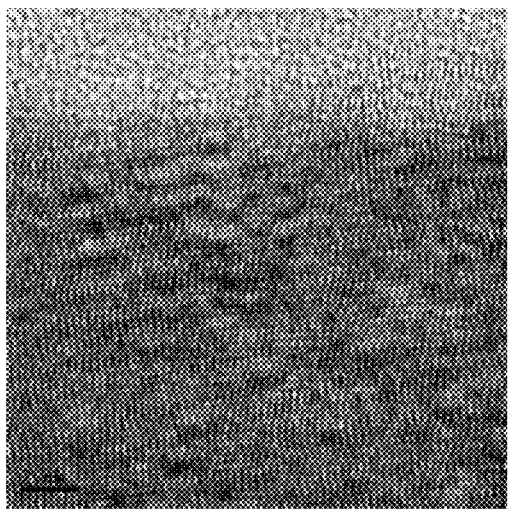
3nm FIG. 38A    Sample 2    IGZO(In:Ga:Zn=1:3:4)
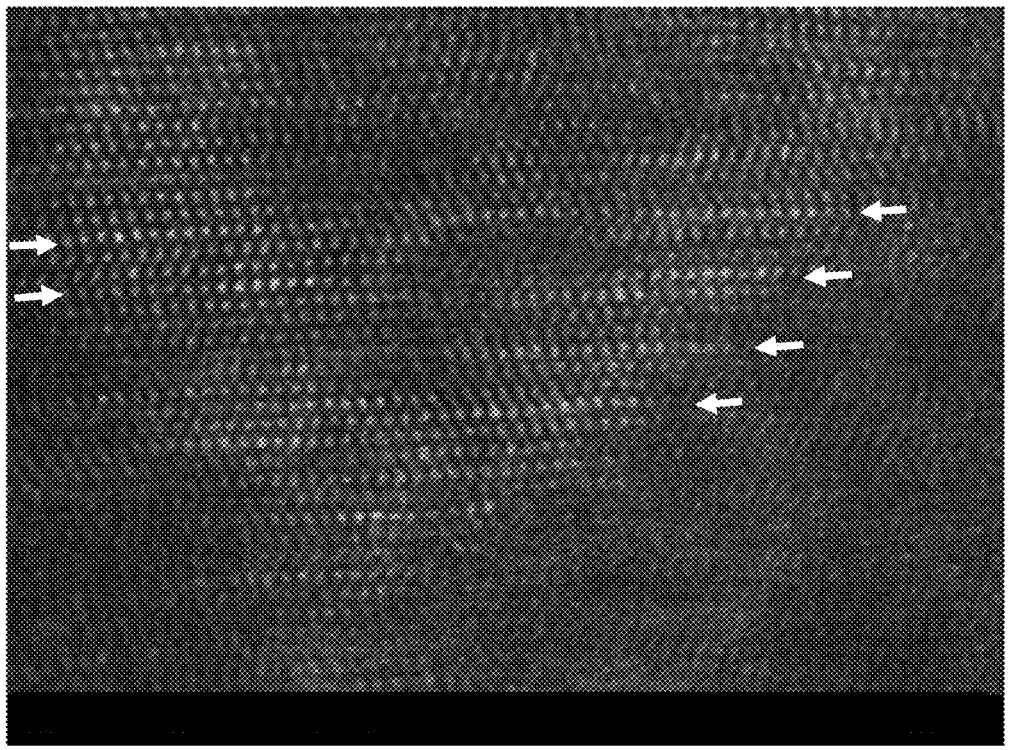
FIG. 38B    Sample 3    IGZO(In:Ga:Zn=1:3:6)
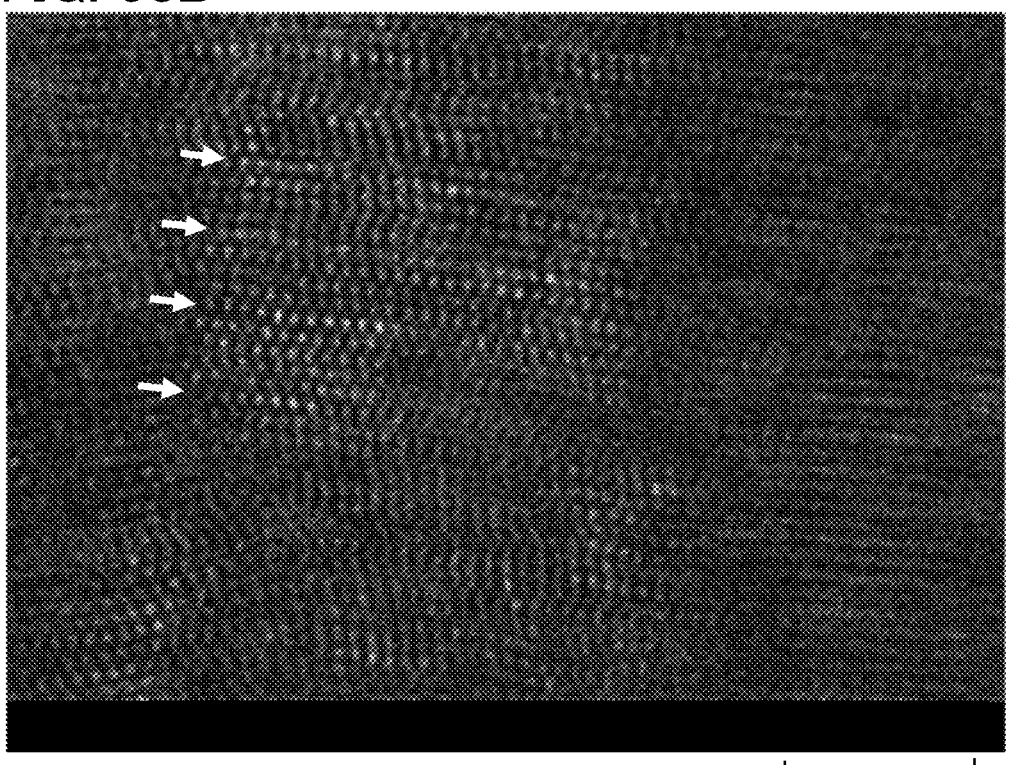
3nm

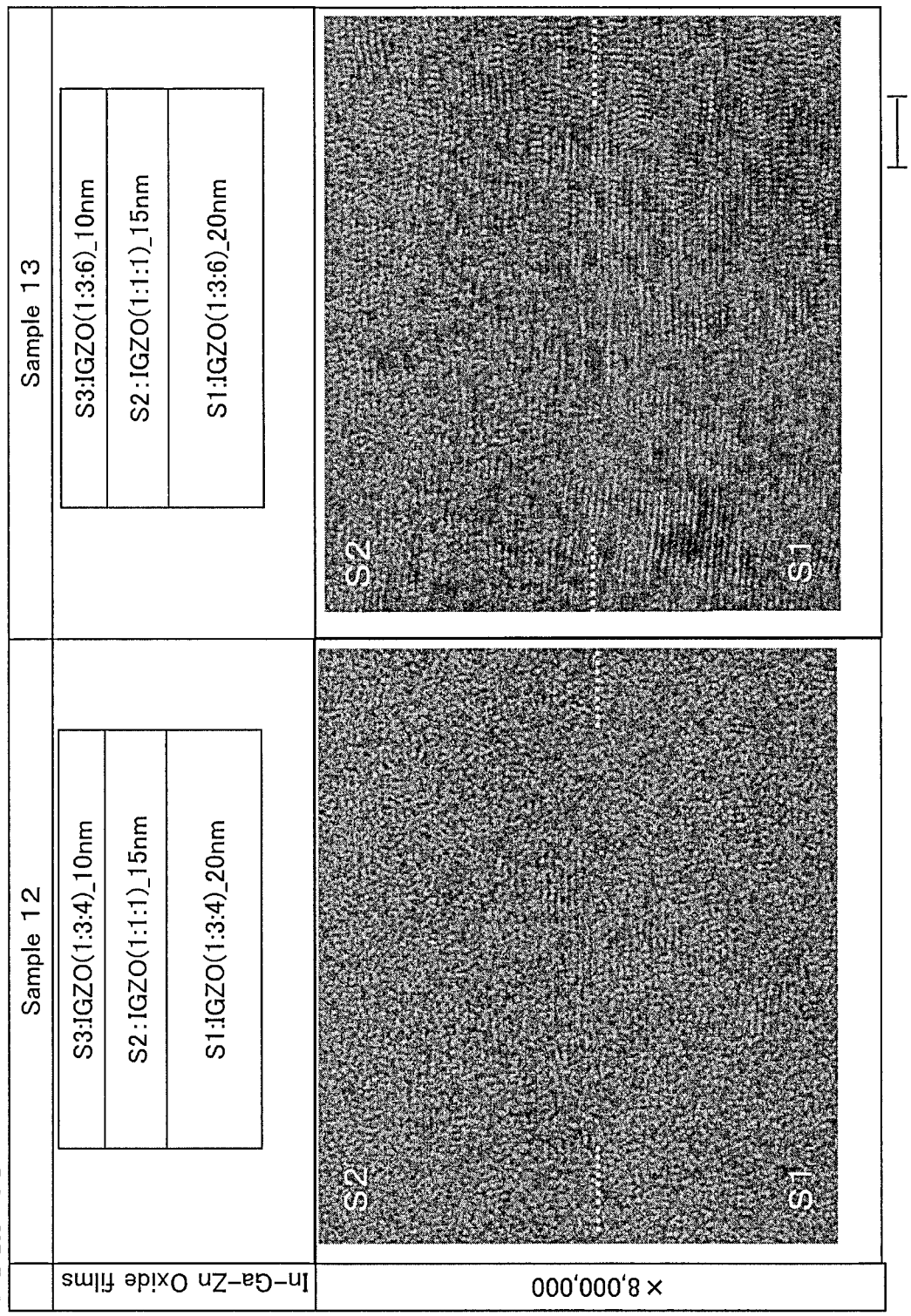

METHOD FOR MANUFACTURING SPUTTERING TARGET, METHOD FOR FORMING OXIDE FILM, AND TRANSISTOR

BACKGROUND OF THE INVENTION

1. Field of the Invention

The present invention relates to a method for manufacturing a sputtering target, a method for forming an oxide film, and a transistor.

2. Description of the Related Art

Transistors used for most flat panel displays typified by a liquid crystal display device or a light-emitting display device are formed using a silicon semiconductor such as amorphous silicon, single crystal silicon, or polycrystalline silicon provided over a glass substrate. Further, such a transistor employing such a silicon semiconductor is used in integrated circuits (ICs) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor.

For example, $InGaO_3(ZnO)_m$ (m: a natural number) having a homologous phase is known as an oxide semiconductor (see Non-Patent Documents 1 and 2).

In addition, Patent Document 1 discloses a transparent thin film field-effect transistor including a homologous compound $InMO_3(ZnO)_m$ (M represents In, Fe, Ga, or Al, and m is an integer greater than or equal to 1 and less than 50).

Patent Document

[Patent Document 1] Japanese Published Patent Application No. 2004-103957

Non-Patent Documents

[Non-Patent Document 1] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315

[Non-Patent Document 2] M. Nakamura, N. Kimizuka, T. Mohri, and M. Isobe, "Syntheses and crystal structures of new homologous compounds, indium iron zinc oxides $(InFeO_3(ZnO)_m)$ (m: natural number) and related compounds", *KOTAI BUTSURI (SOLID STATE PHYSICS)*, 1993, Vol. 28, No. 5, pp. 317-327

SUMMARY OF THE INVENTION

An oxide semiconductor film with low crystallinity is likely to include defects such as oxygen vacancies or dangling bonds.

In the case where stacked oxide semiconductor films formed using sputtering targets with different compositions have different crystallinities, defects are generated at the interface between the stacked oxide semiconductor films.

Defects included in an oxide semiconductor film or defects combined with hydrogen or the like might cause carrier generation and change electrical characteristics of the oxide semiconductor film. This results in poor electrical characteristics of a transistor and causes an increase in the amount of change in electrical characteristics of the transistor, typically the threshold voltage, due to a change over time or a stress test (e.g., a bias-temperature (BT) stress test or a BT photostress test).

Therefore, it is an object of one embodiment of the present invention to provide a method for manufacturing a sputtering target with which an oxide semiconductor film with a small amount of defects can be formed. It is another object of one embodiment of the present invention to form an oxide semiconductor film with a small amount of defects. Another object of one embodiment of the present invention is to improve electrical characteristics of a semiconductor device or the like including an oxide semiconductor film. Another object of one embodiment of the present invention is to improve reliability of a semiconductor device including an oxide semiconductor film. Note that in one embodiment of the present invention, there is no need to achieve all the objects.

One embodiment of the present invention is a method for manufacturing a sputtering target, which includes the steps of: forming a polycrystalline In-M-Zn oxide (M represents aluminum, titanium, gallium, yttrium, zirconium, lanthanum, cesium, neodymium, or hafnium) powder by mixing, sintering, and grinding indium oxide, a metal oxide (the metal is aluminum, titanium, gallium, yttrium, zirconium, lanthanum, cesium, neodymium, or hafnium), and zinc oxide; forming a mixture by mixing the polycrystalline In-M-Zn oxide powder and a zinc oxide powder; forming a compact by compacting the mixture; and sintering the compact.

Note that the atomic ratio of zinc in the sputtering target is higher than that of M (M represents aluminum, titanium, gallium, yttrium, zirconium, lanthanum, cesium, neodymium, or hafnium).

The polycrystalline In-M-Zn oxide powder used to manufacture a sputtering target is a homologous compound.

One embodiment of the present invention is a method for forming an oxide film including an In-M-Zn oxide (M represents aluminum, titanium, gallium, yttrium, zirconium, lanthanum, cesium, neodymium, or hafnium) by a sputtering method using a sputtering target containing indium, M, and zinc, and having an atomic ratio of zinc higher than that of M.

Note that the In-M-Zn oxide (M represents aluminum, titanium, gallium, yttrium, zirconium, lanthanum, cesium, neodymium, or hafnium) has a homologous structure.

The atomic ratio of Zn to M in the In-M-Zn oxide (M represents aluminum, titanium, gallium, yttrium, zirconium, lanthanum, cesium, neodymium, or hafnium) is higher than 0.5.

One embodiment of the present invention is a transistor containing the In-M-Zn oxide (M represents aluminum, titanium, gallium, yttrium, zirconium, lanthanum, cesium, neodymium, or hafnium).

In accordance with one embodiment of the present invention, a method for manufacturing a sputtering target with which an oxide semiconductor film with a small amount of defects can be formed can be provided. In accordance with one embodiment of the present invention, an oxide semiconductor film with a small amount of defects can be formed. In accordance with one embodiment of the present invention, electrical characteristics of a semiconductor device or the like including an oxide semiconductor film can be improved. In accordance with one embodiment of the present invention, reliability of a semiconductor device including an oxide semiconductor film can be improved.

BRIEF DESCRIPTION OF THE DRAWINGS

FIGS. 21A1, 21A2, 21B1, and 21B2 illustrate plasma discharge in a sputtering method using a DC power source or an AC power source.

FIGS. 37A to 37D are cross-sectional TEM images of samples 2 and 3.

FIGS. 38A and 38B are cross-sectional HAADF-STEM images.

FIG. 43 shows cross-sectional TEM images of samples 12 and 13.

DETAILED DESCRIPTION OF THE INVENTION

Figure 1A:
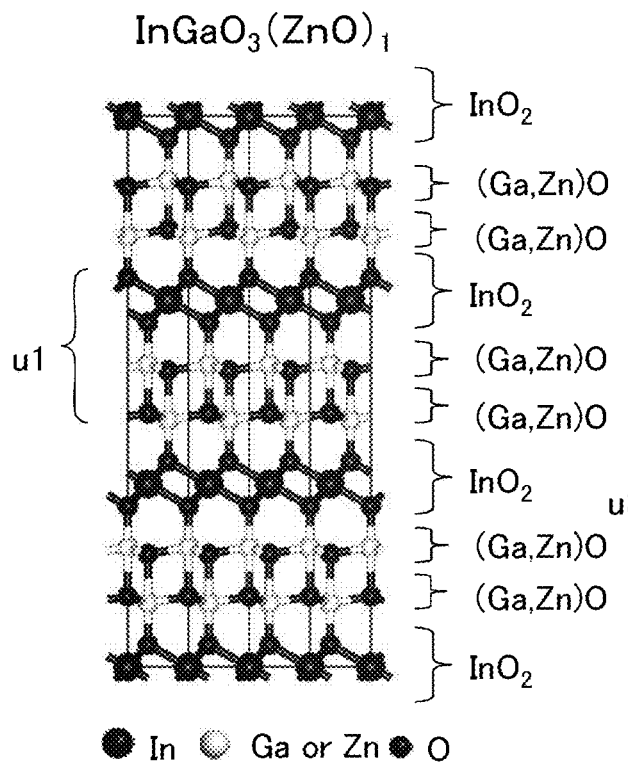
FIGS. 1A to 1C each illustrate a crystal structure of a homologous compound.

Embodiments of the present invention will be described in detail below with reference to drawings. Note that the present invention is not limited to the following description, and it is easily understood by those skilled in the art that various changes and modifications can be made without departing from the spirit and scope of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments and examples of the present invention are not necessarily limited to such scales.

Furthermore, terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes interchanged with each other when the direction of current flowing is changed in circuit operation, for example. Therefore, the terms "source" and "drain" can be used to denote the drain and the source, respectively, in this specification.

A voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is simply called a potential or a voltage, and a potential and a voltage are used as synonymous words in many cases. Thus, in this specification, a potential may be rephrased as a voltage and a voltage may be rephrased as a potential unless otherwise specified.

In this specification, in the case where an etching step is performed after a photolithography process, a mask formed in the photolithography process is removed after the etching step.

Embodiment 1

In this embodiment, a method for manufacturing a sputtering target will be described.

<Homologous Compound and Homologous Structure>

First, homologous compounds represented by $InMO_3(ZnO)_m$ (M represents Al, Ti, Ga, Y, Zr, La, Cs, Nd, or Hf, and m is a natural number) are described. The homologous compounds represented by $InMO_3(ZnO)_m$ have the same crystal structure as $LuFeO_3(ZnO)_m$ having a layered structure in which $LuO_2^-$ layers and $(FeZn_m)O_{m+1}^{1+}$ layers are stacked regularly and alternately, with the space group R-3m when m is an odd number and with the space group $P6_3/mmc$ when m is an even number. Note that $InMO_3(ZnO)_m$ (m=1) is also referred to as a $YbFe_2O_4$ structure. Such a crystal structure is referred to as a homologous structure. Note that in this specification, crystal structures are basically in hexagonal representation.

Figure 1C:
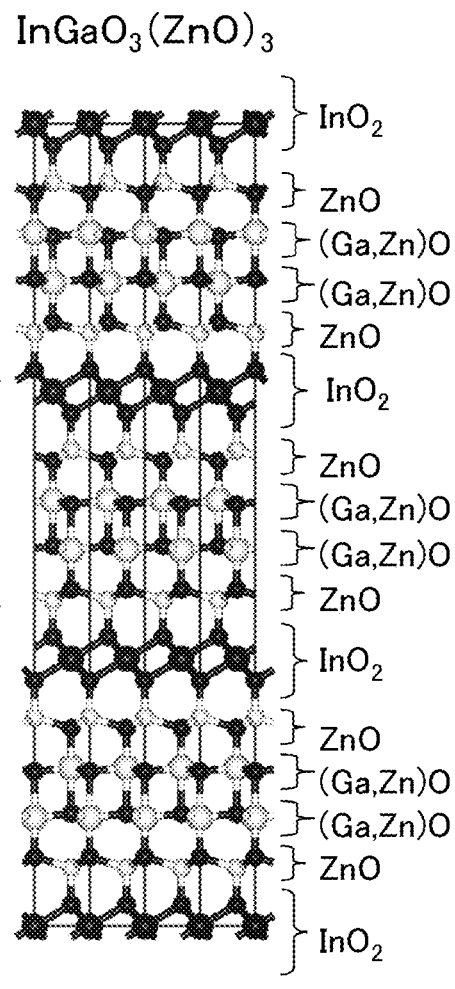
Figure 1B:
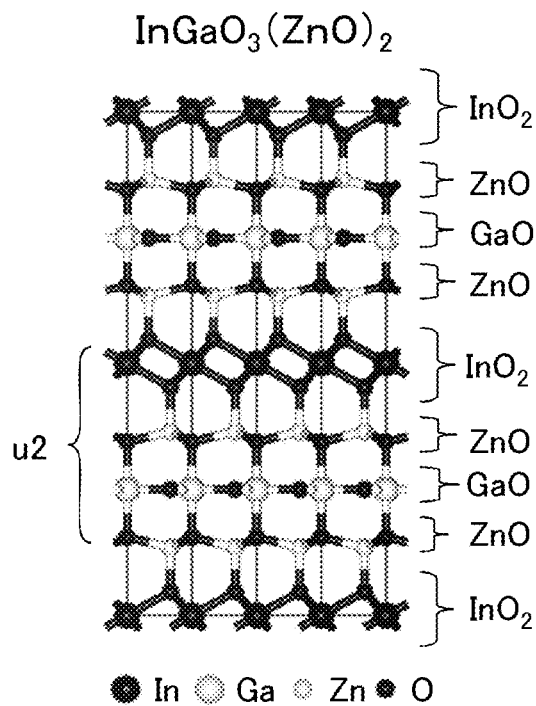

Next, crystal structures of homologous compounds are described using $InGaO_3(ZnO)_m$ as a typical example of $InMO_3(ZnO)_m$. FIGS. 1A to 1C illustrate crystal structures of $InGaO_3(ZnO)_m$ where m=1 (i.e., $InGaO_3(ZnO)_1$), where m=2 (i.e., $InGaO_3(ZnO)_2$), and where m=3 (i.e., $InGaO_3(ZnO)_3$), respectively.

As illustrated in FIGS. 1A to 1C, homologous compounds represented by $InMO_3(ZnO)_m$ have crystal structures in which pluralities of respective repeating units u1 to u3 each including a plurality of layers are stacked. In addition, in each crystal structure, there are (m+1) layers including gallium atoms and/or zinc atoms and oxygen atoms (ZnO, GaO, or (Ga,Zn)O) between adjacent $InO_2$ layers. Such a structure is referred to as a homologous structure. Note that a compound other than the homologous compounds represented by $InMO_3(ZnO)_m$ can have a homologous structure.

<CAAC-OS Film>

Next, a c-axis aligned crystalline oxide semiconductor (CAAC-OS) will be described. Note that only the crystal structure of the CAAC-OS will be described here, and details of CAAC-OS will be described in Embodiment 2.

The CAAC-OS refers to an oxide semiconductor including a c-axis aligned crystal (CAAC).

For example, the CAAC-OS includes a plurality of crystal parts. In the plurality of crystal parts, c-axes are aligned in a direction parallel to a normal vector of a surface where the CAAC-OS is formed or a top surface of the CAAC-OS in some cases. When the CAAC-OS is analyzed by an out-of-plane method with an X-ray diffraction (XRD) apparatus, a peak attributable to c-axis alignment, e.g., a peak attributable to the (00x) plane orientation, appears in some cases. Further, for example, spots (bright spots) are shown in an electron diffraction pattern of the CAAC-OS. In the CAAC-OS, for example, among crystal parts, the directions of the a-axis and the b-axis of one crystal part are different from those of another crystal part, in some cases.

According to a TEM image of the CAAC-OS film observed in a direction substantially parallel to a sample surface (cross-sectional TEM image), metal atoms are arranged in a layered manner in the crystal parts. Each metal atom layer has a morphology reflected by a surface where the CAAC-OS film is formed (hereinafter, a surface where the CAAC-OS film is formed is also referred to as a formation surface) or a top surface of the CAAC-OS film, and is arranged in parallel to the formation surface or the top surface of the CAAC-OS film.

On the other hand, according to a TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

In this specification, a simple term "perpendicular" includes a range from 800 to 100° or from 85° to 95°. In addition, a simple term "parallel" includes a range from −10° to 10° or from −5° to 5°.

The CAAC-OS has a homologous structure when having at least one layer including gallium atoms and/or zinc atoms and oxygen atoms (ZnO, GaO, or (Ga,Zn)O) between adjacent $InO_2$ layers.

<First Method for Manufacturing Sputtering Target>

Next, a method for manufacturing a sputtering target with which an In—Ga—Zn oxide film having a homologous structure can be formed will be described with reference to FIG. 2. In addition, a method for manufacturing a sputtering target with which a CAAC-OS film having a homologous structure can be formed will be described with reference to FIG. 2.

Figure 2:
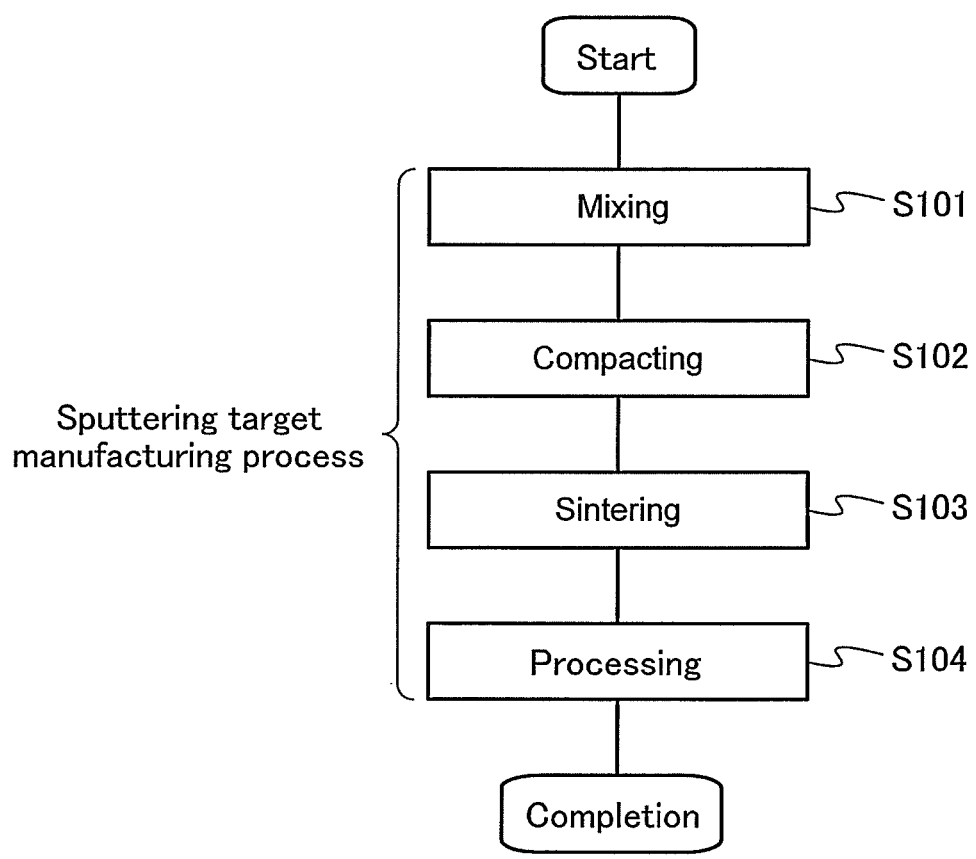
FIG. 2 illustrates a process for manufacturing a sputtering target.

As illustrated in FIG. 2, in a step S101, a mixture is formed by preparing, grinding, and mixing an indium oxide powder, a gallium oxide powder, and a zinc oxide powder that are materials of an In—Ga—Zn oxide. Powders with purities of 99.9% or higher, 99.99% or higher, or 99.999% or higher are used as the indium oxide, gallium oxide, and zinc oxide powders. Accordingly, the concentration of impurities contained in an oxide semiconductor film formed later can be reduced, and a transistor with excellent electrical characteristics can be manufactured.

Alternatively, a polycrystalline In—Ga—Zn oxide powder manufactured through steps S111 to S113 in FIG. 3 which will be described later and a zinc oxide powder can be used as materials of the In—Ga—Zn oxide. Alternatively, the polycrystalline In—Ga—Zn oxide powder manufactured through the steps S111 to S113 in FIG. 3 and a Ga—Zn oxide powder can be used as materials of the In—Ga—Zn oxide.

The materials of the In—Ga—Zn oxide are prepared such that the atomic ratio of Zn in the mixture is higher than that of Ga in the mixture. For example, the materials of the In—Ga—Zn oxide powder are prepared at In:Ga:Zn=1:3:4, In:Ga:Zn=1:3:5, In:Ga:Zn=1:3:6, In:Ga:Zn=1:3:7, In:Ga:Zn=1:3:8, In:Ga:Zn=1:3:9, In:Ga:Zn=1:3:10, In:Ga:Zn=1:4:5, In:Ga:Zn=1:4:6, In:Ga:Zn=1:4:7, In:Ga:Zn=1:4:8, In:Ga:Zn=1:4:9, In:Ga:Zn=1:4:10, In:Ga:Zn=1:5:6, In:Ga:Zn=1:5:7, In:Ga:Zn=1:5:8, In:Ga:Zn=1:5:9, In:Ga:Zn=1:5:10, In:Ga:Zn=1:6:7, In:Ga:Zn=1:6:8, In:Ga:Zn=1:6:9, or In:Ga:Zn=1:6:10. Accordingly, a sputtering target containing an In—Ga—Zn oxide having a homologous structure can be manufactured in a later sintering step.

The materials of the In—Ga—Zn oxide can be ground and mixed using a mixing grinder such as a ball mill, a bead mill, a roll mill, a jet mill, or an ultrasonic device. The use of the mixing grinder enables the materials of the In—Ga—Zn oxide to be ground into particles of a predetermined size and mixed.

The particles of the ground materials of the In—Ga—Zn oxide preferably have an average size of greater than or equal to 0.01 m and less than or equal to 3.0 m, or greater than or equal to 0.1 m and less than or equal to 2.0 m.

Next, in a step S102, the mixture is compacted to form a compact.

Examples of methods for forming the compact include metal molding, cold isostatic pressing, and the like. Note that in the compacting process, a compacting aid such as polyvinyl alcohol, methyl cellulose, polywax, or an oleic acid may be used as appropriate.

In the step S101, a slurry may be formed by mixing the materials of the In—Ga—Zn oxide with water, a dispersant, and a binder, and in the step S102, the compact may be formed by pouring the slurry into a mold, suctioning water from the bottom of the mold, and performing drying treatment. In the drying treatment, moisture contained in the compact can be removed by performing heat treatment at 300° C. to 700° C. after natural drying.

Next, in a step S103, the compact is sintered to form a sintered compact.

In the sintering step in the step S103, the compact is heated at 1200° C. to 1600° C., or 1300° C. to 1500° C. By this step, a polycrystalline In—Ga—Zn oxide can be formed as the sintered compact. In the polycrystalline In—Ga—Zn oxide, the atomic ratio of Zn is higher than that of Ga.

Then, the sintered compact may be subjected to heat treatment in a reducing atmosphere of hydrogen, methane, carbon monoxide, or the like or in an inert gas atmosphere of nitrogen, a rare gas, or the like. Accordingly, resistance variation of the sintered compact can be reduced.

Note that a sputtering target can be manufactured by performing the step S102 (the compacting step) and the step S103 (the sintering step) at the same time. Examples of such compacting methods include hot pressing, hot isostatic pressing, and the like.

Next, in a step S104, the sintered compact is processed to manufacture a sputtering target.

In the step S104, the sintered compact is processed by cutting and is then mounted on a mounting jig such as a backing plate. After the cutting, the sintered compact is subjected to mirror finishing to a surface roughness (Ra) of 5 µm or less, or 2 µm or less. Examples of mirror finishing methods include mechanical polishing, chemical polishing, CMP, and the like.

Through the above steps, the sputtering target can be manufactured. In the sputtering target manufactured in this embodiment, the atomic ratio of Zn is higher than that of Ga. By a sputtering method using such a sputtering target, a film of an In—Ga—Zn oxide having a homologous structure can be formed. Furthermore, a film of an In—Ga—Zn oxide that has a homologous structure and is CAAC-OS can be formed.

<Second Method for Manufacturing Sputtering Target>

Here, a method for manufacturing a sputtering target with which a film of a homologous compound represented by $InGaO_3(ZnO)_m$ can be formed will be described with reference to FIG. 3. In addition, a method for manufacturing a sputtering target with which a film of CAAC-OS that is a homologous compound represented by $InGaO_3(ZnO)_m$ can be formed will be described with reference to FIG. 3.

Figure 3:
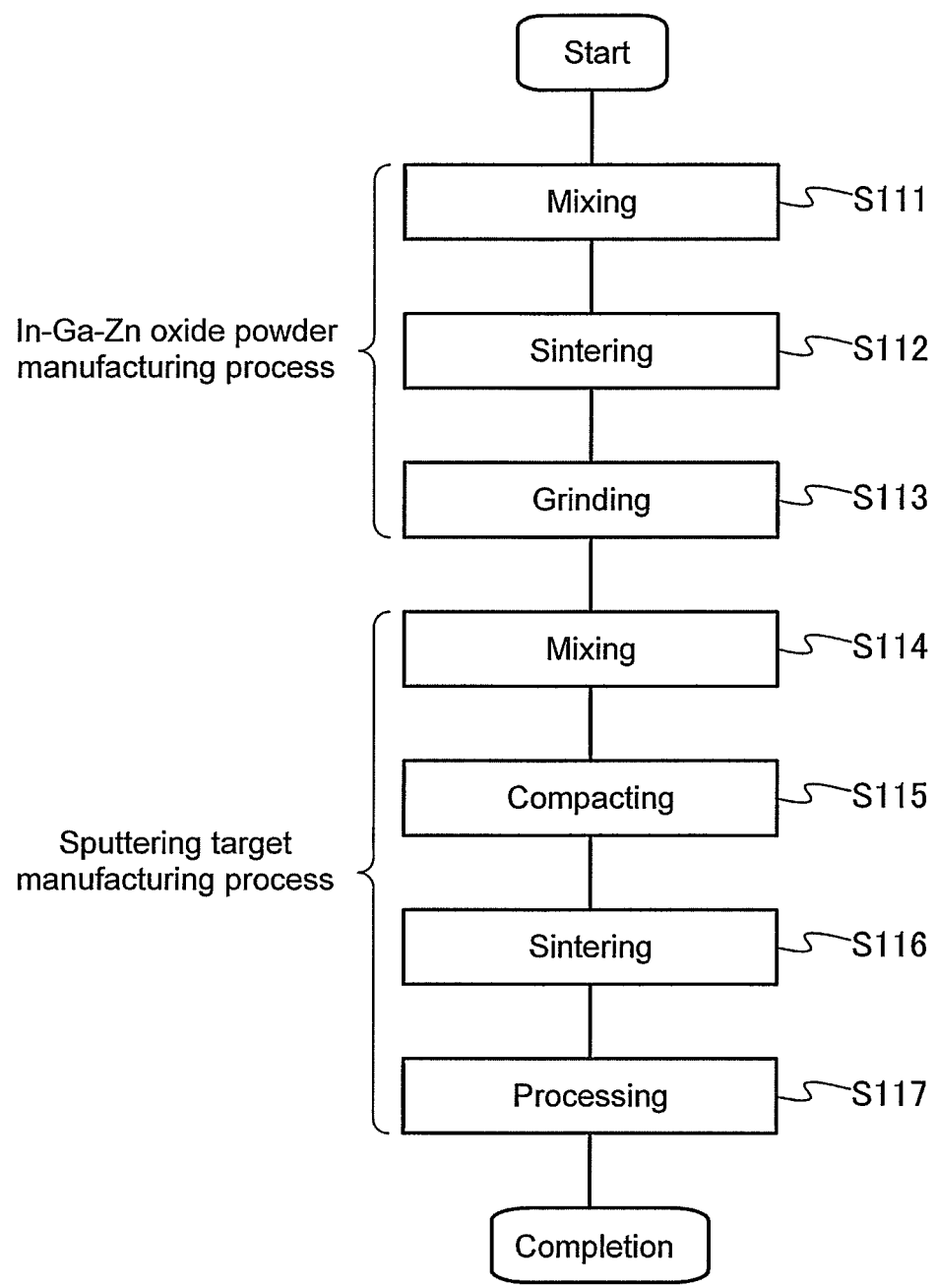
FIG. 3 illustrates a process for manufacturing a sputtering target.

As illustrated in FIG. 3, an In—Ga—Zn oxide powder is manufactured first.

In a step S111, a mixture is formed by preparing and mixing appropriate amounts of an indium oxide powder, a gallium oxide powder, and a zinc oxide powder that are materials of an In—Ga—Zn oxide. Powders with purities of 99.9% or higher, 99.99% or higher, or 99.999% or higher are used as the indium oxide, gallium oxide, and zinc oxide powders. Accordingly, the concentration of impurities contained in an oxide semiconductor film formed later can be reduced, and a transistor with excellent electrical characteristics can be manufactured.

The amounts of the indium oxide powder, the gallium oxide powder, and the zinc oxide powder are preferably adjusted such that the mixture includes metal elements at an atomic ratio of In:Ga:Zn=1:1:m (m is a natural number). Accordingly, a sputtering target containing an In—Ga—Zn oxide having a homologous structure and represented by $InGaO_3(ZnO)_m$ can be manufactured in a sintering step in a step S112.

Next, in the step S112, the mixture is sintered to form a polycrystalline In—Ga—Zn oxide.

The sintering step can be performed in a manner similar to that of the sintering step in the step S103 in FIG. 2. By this step, the polycrystalline In—Ga—Zn oxide can be formed. The polycrystalline In—Ga—Zn oxide is a homologous compound represented by $InGaO_3(ZnO)_m$, typical examples of which include $InGaZnO_4$, $InGaZn_2O_5$, $InGaZn_3O_6$, $InGaZn_4O_7$, $InGaZn_5O_8$, and the like.

Next, in the step S113, the polycrystalline In—Ga—Zn oxide is ground into a polycrystalline In—Ga—Zn oxide powder.

The polycrystalline In—Ga—Zn oxide can be ground using a grinding means such as a ball mill, a bead mill, a roll mill, a jet mill, or an ultrasonic device.

The ground polycrystalline In—Ga—Zn oxide powder preferably has an average particle size of greater than or equal to 0.01 µm and less than or equal to 3.0 µm, or greater than or equal to 0.1 µm and less than or equal to 2.0 µm.

Note that the grinding step in the step S113 is preferably performed again in the case where the average particle size of the ground polycrystalline In—Ga—Zn oxide powder is 3.0 µm or larger.

Next, a process for manufacturing a sputtering target will be described.

In a step S114, the polycrystalline In—Ga—Zn oxide powder and a zinc oxide powder are mixed to form a mixture. Note that in this mixing step, the polycrystalline In—Ga—Zn oxide powder and the zinc oxide powder may each be ground in order to improve the uniformity of powder particle size.

Here, the polycrystalline In—Ga—Zn oxide powder that is a homologous compound and obtained in the step S113 is mixed with a zinc oxide powder to form a mixture. The polycrystalline In—Ga—Zn oxide powder and the zinc oxide powder are adjusted such that the atomic ratio of Zn to Ga in the mixture is higher than or equal to (m+0.05) and lower than or equal to (m+0.5). For example, the polycrystalline In—Ga—Zn oxide powder and the zinc oxide powder are mixed at In:Ga:Zn=1:1:1.05, In:Ga:Zn=1:1:2.05, or In:Ga:Zn=1:1:3.05. Accordingly, a sputtering target of a homologous compound represented by $InGaO_3(ZnO)_m$ in which the number of atoms of zinc is larger than that of gallium can be manufactured in a later sintering step in a step S116.

Next, in a step S115, the mixture is compacted to form a compact.

The compact can be formed by compacting the mixture in a manner similar to that of the compacting step in the step S102 in FIG. 2.

In the step S114, a slurry may be formed by mixing the polycrystalline In—Ga—Zn oxide powder and the zinc oxide powder with water, a dispersant, and a binder, and in the step S115, the compact may be formed by pouring the slurry into a mold, suctioning water from the bottom of the mold, and performing drying treatment. In the drying treatment, moisture contained in the compact can be removed by performing heat treatment at 300° C. to 700° C. after natural drying.

Next, in the step S116, the compact is sintered to form a sintered compact.

In the sintering step in the step S116, the compact is heated at 800° C. to 1600° C., or 1300° C. to 1500° C. By this step, a polycrystalline In—Ga—Zn oxide can be formed as the sintered compact. In the polycrystalline In—Ga—Zn oxide, the atomic ratio of Zn is higher than that of Ga. The polycrystalline In—Ga—Zn oxide is a mixed crystal of ZnO and a homologous compound represented by $InGaO_3(ZnO)_m$.

Then, the sintered compact may be subjected to heat treatment in a reducing atmosphere of hydrogen, methane, carbon monoxide, or the like or in an inert gas atmosphere of nitrogen, a rare gas, or the like. Accordingly, resistance variation of the sintered compact can be reduced.

Note that the sintered compact can be formed by performing the step S115 (the compacting step) and the step S116 (the sintering step) at the same time. Examples of such compacting methods include hot pressing, hot isostatic pressing, and the like.

Next, in a step S117, the sintered compact is processed to manufacture a sputtering target.

In the step S117, the processing step in the step S104 in FIG. 2 can be employed as appropriate.

Through the above steps, the sputtering target can be manufactured. The sputtering target manufactured in this embodiment is a mixed crystal of ZnO and a homologous compound represented by $InGaO_3(ZnO)_m$, and the atomic ratio of Zn to Ga in the sputtering target is higher than or equal to (m+0.05) and lower than or equal to (m+0.5). By a sputtering method using such a sputtering target, a film of an In—Ga—Zn oxide that is a homologous compound can be formed. Furthermore, a film of an In—Ga—Zn oxide that is a homologous compound and is CAAC-OS can be formed.

Embodiment 2

A method for forming an oxide film using the sputtering target manufactured in Embodiment 1 will be described in this embodiment with reference to FIGS. 4A to 4C, FIGS. 5A to 5F, FIGS. 6A to 6C, FIGS. 7A and 7B, FIGS. 8A to 8C, FIGS. 9A to 9C, FIGS. 10A and 10B, FIG. 11, FIGS. 12A to 12C, FIGS. 13A and 13B, FIGS. 14A to 14C, FIG. 15, FIGS. 16A to 16C, FIGS. 17A to 17C, and FIGS. 18A and 18B. Here, a description is given using an In—Ga—Zn oxide as a typical example of an In-M-Zn oxide (M represents Al, Ti, Ga, Y, Zr, La, Cs, Nd, or Hf).

FIGS. 4A to 4C, FIGS. 8A to 8C, FIGS. 14A to 14C, FIGS. 16A to 16C, FIGS. 17A to 17C, and FIGS. 18A and 18B are schematic diagrams illustrating a sputtering process in a deposition chamber of a deposition apparatus. Note that the deposition chamber of the deposition apparatus will be briefly described in this embodiment and will be described in detail in Embodiment 3.

<Heating Deposition (Deposition Temperature: Higher than or Equal to 150° C. and Lower than 600° C.)>

Figure 4A:
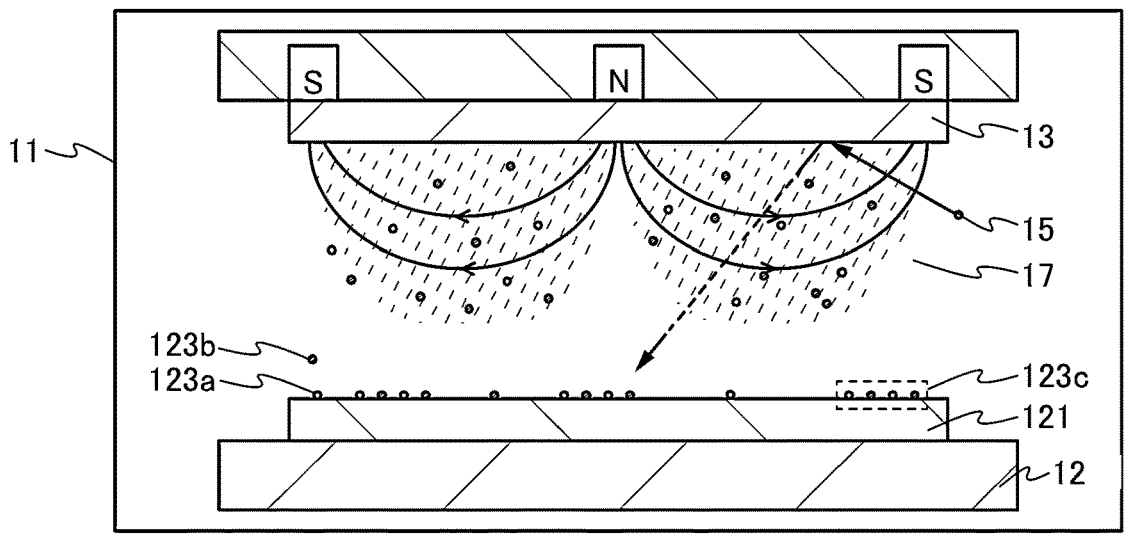
FIGS. 4A to 4C are schematic diagrams illustrating a method for manufacturing an oxide.

As illustrated in FIG. 4A, a substrate stage 12 and a sputtering target 13 manufactured in Embodiment 1 are provided so as to face each other in a deposition chamber 11 of a deposition apparatus. The substrate stage 12 is provided with a substrate 121.

A sputtering gas such as oxygen or an inert gas like argon is introduced into the deposition chamber 11 that is under reduced pressure, and a voltage is applied to the sputtering target 13 to generate plasma 17. The sputtering gas is ionized in the plasma 17, and ions 15 are generated. When the ions 15 collide with the sputtering target 13, interatomic bonds in the sputtering target 13 are cut and particles are separated from the sputtering target 13. Therefore, ions, sputtered particles, electrons, and/or the like exist in the plasma 17. Here, particles separated from a sputtering target are referred to as sputtered particles.

An example of the ions 15 is oxygen cations. With use of oxygen cations as the ions 15, plasma damage during deposition, for example, can be reduced. In addition, with use of oxygen cations as the ions 15, the sputtering target 13 can be prevented from decreasing its crystallinity or becoming amorphous by collision of the ions 15 with a surface of the sputtering target 13, for example. Furthermore, with use of oxygen cations as the ions 15, the crystallinity of the sputtering target 13 may be increased by collision of the ions 15 with a surface of the sputtering target 13, for example. Note that cations of a rare gas (such as helium, neon, argon, krypton, or xenon), for example, may be used as the ions 15.

Examples of the sputtered particles include zinc particles, oxygen particles, zinc oxide particles, In—Ga—Zn oxide particles, and the like. The sputtering target manufactured in Embodiment 1 contains Zn at a higher ratio than that of Ga. For this reason, a description is given here using a model in which zinc particles, oxygen particles, or zinc oxide particles are preferentially separated from the sputtering target 13 and then zinc particles, oxygen particles, zinc oxide particles, and In—Ga—Zn oxide particles are separated.

First, zinc particles 123a and oxygen particles 123b are separated as sputtered particles from the sputtering target 13. Next, the zinc particles 123a and the oxygen particles 123b move to the substrate 121, whereby a hexagonal crystal grain 123c of zinc oxide is formed over the substrate.

Figure 5A:
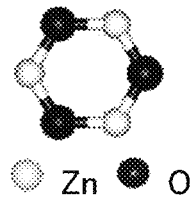
FIGS. 5A to 5F are schematic diagrams illustrating oxides.

FIG. 5A illustrates a model of a top-view shape of the hexagonal crystal grain 123c of zinc oxide. As illustrated in FIG. 5A, Zn atoms and O atoms are bound in a hexagonal shape in the hexagonal crystal grain 123c of zinc oxide.

Figure 4B:
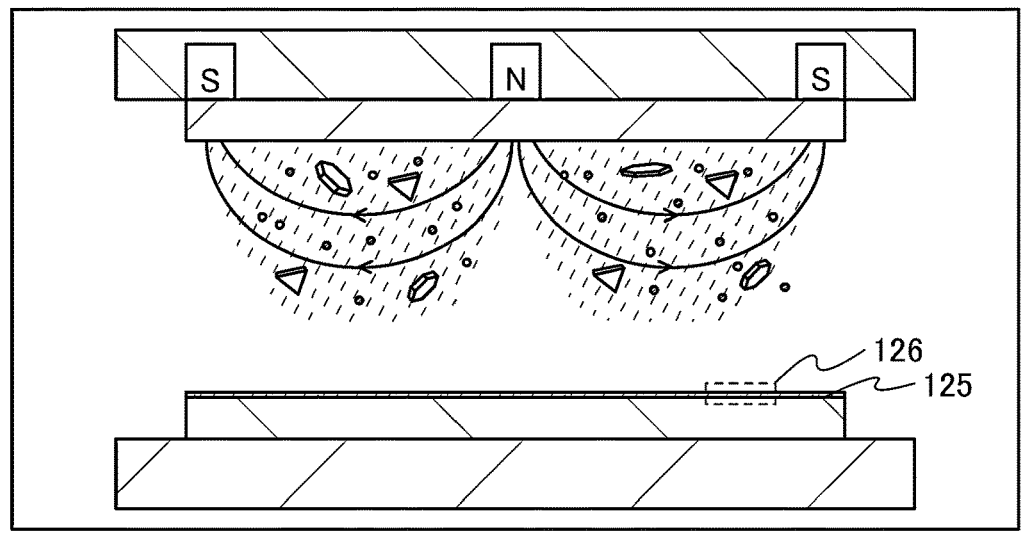

As will be described later in the section "Mechanism of Zinc Oxide Crystal Growth," the crystal of zinc oxide grows rapidly in a direction parallel to the a-b plane. Therefore, the hexagonal crystal grain 123c of zinc oxide grows in a direction parallel to a surface of the substrate 121, that is, in a lateral direction in a cross section of a zinc oxide film, at a substrate temperature of higher than or equal to 150° C. and lower than 600° C. As a result, a hexagonal-crystal zinc oxide film 125 is formed as illustrated in FIG. 4B. That is, the hexagonal-crystal zinc oxide film 125 includes a single crystal region. Note that the hexagonal-crystal zinc oxide film 125 may include a non-single-crystal region.

Figure 5B:
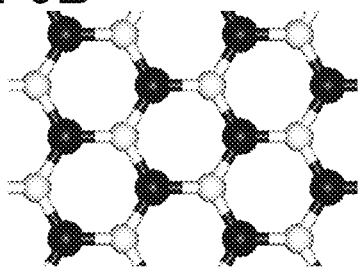
Figure 5C:

FIG. 5B illustrates a model of a top-view shape of a region 126 of the hexagonal-crystal zinc oxide film 125, and FIG. 5C illustrates a model of a cross-sectional shape of the region 126. As illustrated in FIG. 5B, Zn atoms and O atoms are bound in a hexagonal shape in the hexagonal-crystal zinc oxide film 125. The binding of Zn atoms and O atoms in the hexagonal shape extends over the a-b plane.

Figure 4C:
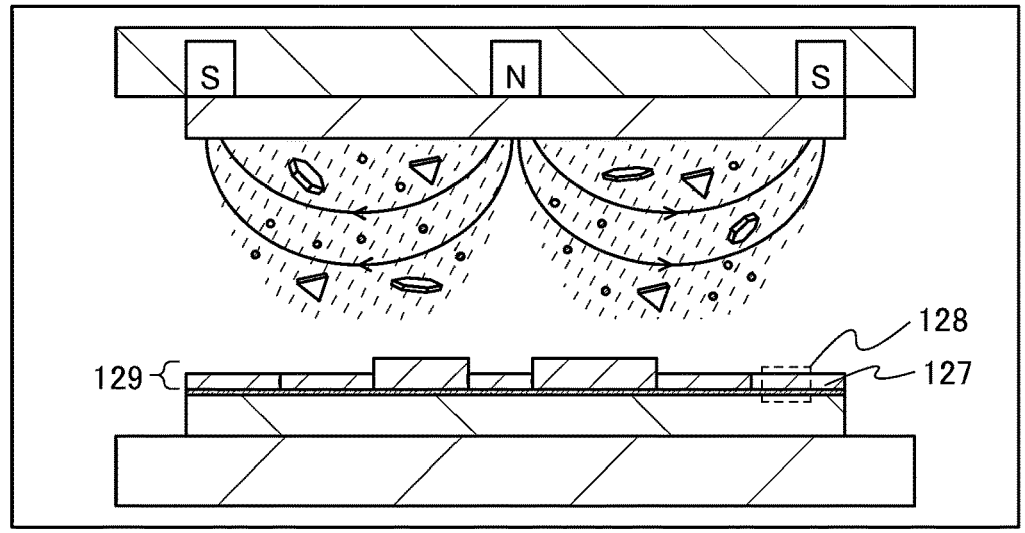

Next, sputtered particles are released from the sputtering target. Here, In—Ga—Zn oxide particles are separated as the sputtered particles, and as illustrated in FIG. 4C, In—Ga—Zn oxide particles 127 are deposited over the hexagonal-crystal zinc oxide film 125, whereby a film 129 including the In—Ga—Zn oxide particles is formed. Note that zinc particles, oxygen particles, and zinc oxide particles, which are also separated in this step as sputtered particles, are omitted here.

The In—Ga—Zn oxide particles 127 have crystallinity and are typically single crystal. Note that the In—Ga—Zn oxide particles 127 may be polycrystalline.

Figure 6A:
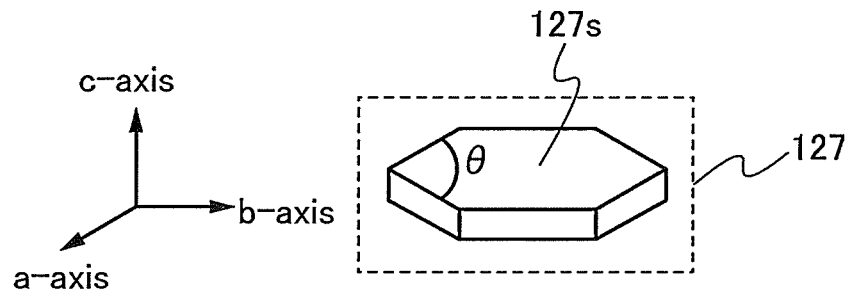
FIGS. 6A to 6C are schematic diagrams each illustrating a sputtered particle.
Figure 6B:
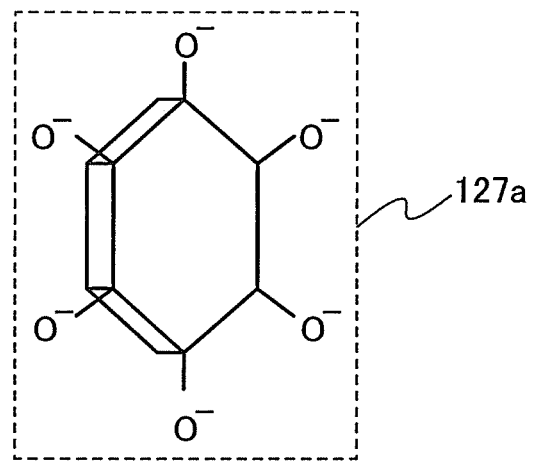
Figure 6C:
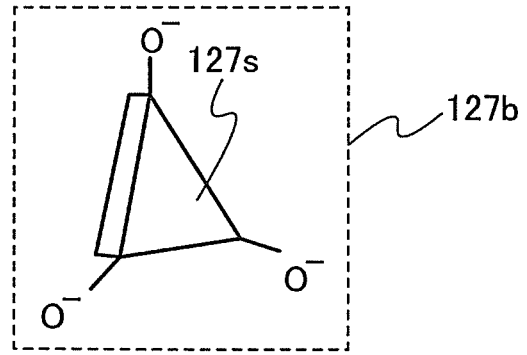

Here, the shape of the In—Ga—Zn oxide particle 127 will be described with reference to FIGS. 6A to 6C. As illustrated in FIG. 6A, the In—Ga—Zn oxide particle 127 has a flat-plate-like or flat shape having a length larger than a thickness in a cross section. Note that the length in the cross section corresponds to a side parallel to the c-axis of the In—Ga—Zn oxide particle 127, and the thickness in the cross section corresponds to a side parallel to an axis intersecting the c-axis of the In—Ga—Zn oxide particle 127. As illustrated in FIG. 6A, the In—Ga—Zn oxide particle 127 preferably has two parallel planes 127s in the form of a regular hexagon that is a hexagon whose interior angles are all 120°. Alternatively, as illustrated in FIG. 6C, the In—Ga—Zn oxide particle 127 preferably has two parallel planes 127s in the form of a regular triangle that is a triangle whose interior angles are all 60°. The In—Ga—Zn oxide particle 127 can be referred to as a pellet. The planes 127s of the pellet are parallel to the a-b plane of a crystal, for example. Furthermore, the planes 127s of the pellet are perpendicular to the c-axis direction of the crystal, for example. The planes of the pellet have a size of greater than or equal to 1 nm and less than or equal to 100 nm, greater than or equal to 1 nm and less than or equal to 30 nm, or greater than or equal to 1 nm and less than or equal to 10 nm, for example.

Note that the In—Ga—Zn oxide particle 127 is positively or negatively charged. This is because part of oxygen of an In—Ga—Zn oxide particle 127a is charged by collision with ions, or because part of oxygen of the In—Ga—Zn oxide particle 127a is charged by exposure to the plasma. FIG. 6B is a schematic diagram of the In—Ga—Zn oxide particle 127a which is negatively charged. As illustrated in FIG. 6B, part of oxygen included in the In—Ga—Zn oxide particle 127a may be negatively charged. Alternatively, oxygen ions may be bound to the In—Ga—Zn oxide particle 127a.

Figure 7A:
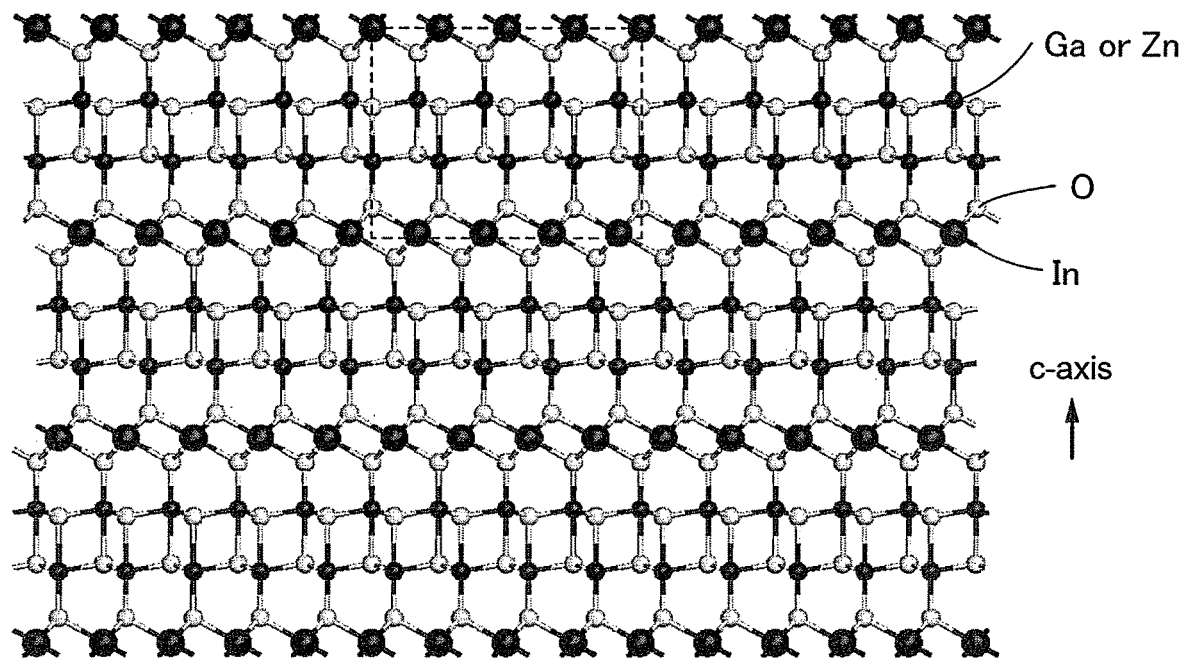
FIGS. 7A and 7B illustrate a crystal structure of a homologous compound.
Figure 7B:
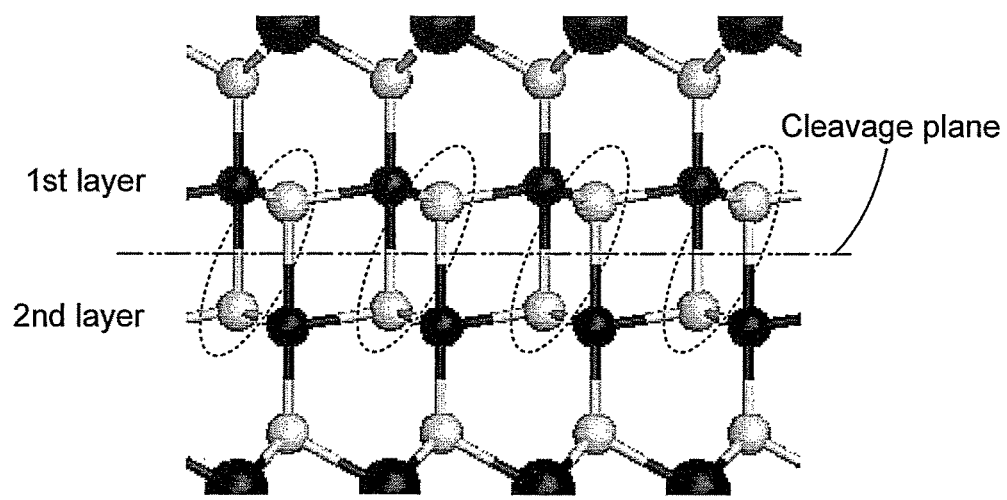

Here, a crystal structure of a homologous compound represented by $InGaO_3(ZnO)_m$ (m is a natural number) where m=1, when seen in a direction parallel to the a-b plane is shown as an example of a crystal included in a sputtering target (see FIG. 7A). FIG. 7B illustrates an enlarged view of a portion surrounded by a dashed line in FIG. 7A.

For example, in a crystal included in a sputtering target, there may be a cleavage plane between a first layer including gallium atoms and/or zinc atoms and oxygen atoms and a second layer including gallium atoms and/or zinc atoms and oxygen atoms, as illustrated in FIG. 7B. This is because oxygen atoms in the first layer and oxygen atoms in the second layer are close to each other (see surrounded portions in FIG. 7B). For example, since the oxygen atoms have negative charge, the binding between the layers can be weakened by the oxygen atoms close to each other. In other words, chemical bonds within each of the first and second layers become much stronger than chemical bonds between the first and second layers, and the cleavage plane is formed between the first and second layers. In this manner, the cleavage plane may be a plane parallel to the a-b plane.

In addition, the crystal structure illustrated in FIGS. 7A and 7B has a regular triangular or regular hexagonal atomic arrangement of metal atoms in the direction perpendicular to the a-b plane. Therefore, in the case where the sputtering target including the crystal having the crystal structure illustrated in FIGS. 7A and 7B is used, the probability of the In—Ga—Zn oxide particle 127 becoming a shape having regular hexagonal planes with internal angles of 120° or regular triangular planes with internal angles of 60° is thought to be high.

Figure 5D:
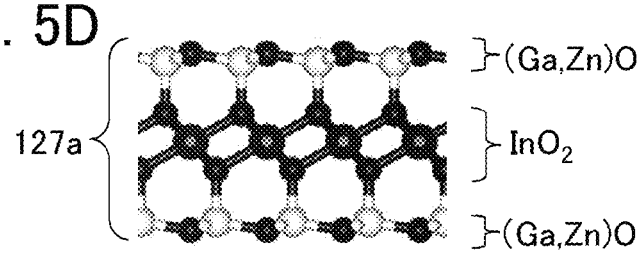
Figure 5E:
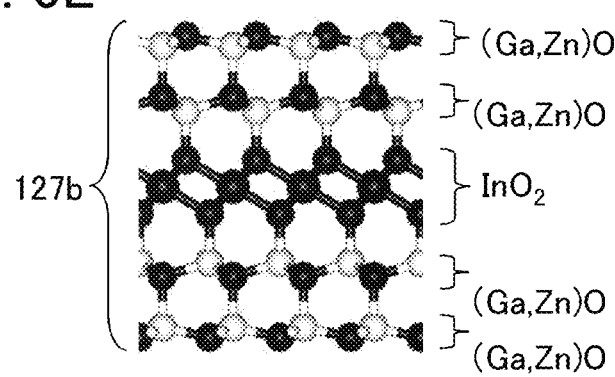

Here, typical examples of the crystal structure of the In—Ga—Zn oxide particle 127 formed by separation along the cleavage plane illustrated in FIG. 7B are illustrated in FIGS. 5D and 5E.

An In—Ga—Zn oxide particle 127a illustrated in FIG. 5D has a structure in which three layers of a first layer including gallium atoms and/or zinc atoms and oxygen atoms (denoted by (Ga,Zn)O), an indium oxide layer ($InO_2$), and a second layer including gallium atoms and/or zinc atoms and oxygen atoms (denoted by (Ga,Zn)O) are bound in this order.

An In—Ga—Zn oxide particle 127b illustrated in FIG. 5E has a structure in which five layers of a first layer including gallium atoms and/or zinc atoms and oxygen atoms (denoted by (Ga,Zn)O), a second layer including gallium atoms and/or zinc atoms and oxygen atoms (denoted by (Ga,Zn)O), an indium oxide layer ($InO_2$), a third layer including gallium atoms and/or zinc atoms and oxygen atoms (denoted by (Ga,Zn)O), and a fourth layer including gallium atoms and/or zinc atoms and oxygen atoms (denoted by (Ga,Zn)O) are bound in this order.

In the case where the hexagonal-crystal zinc oxide film 125 is formed over the substrate 121, the In—Ga—Zn oxide particle 127 is deposited so as to be aligned with the orientation of the hexagonal-crystal zinc oxide film 125. Specifically, since the substrate is heated, the In—Ga—Zn oxide particle 127 separated from the sputtering target 13 is moved or rotated by thermal energy in the vicinity of the hexagonal-crystal zinc oxide film 125 such that the c-axis of the In—Ga—Zn oxide particle 127 is parallel to the c-axis of the hexagonal-crystal zinc oxide film 125, and after that, the In—Ga—Zn oxide particle 127 is deposited over the hexagonal-crystal zinc oxide film 125.

At this time, the a-b plane of the In—Ga—Zn oxide particle 127 may be rotated and bound such that the a-axis and b-axis directions thereof are aligned with those of the In—Ga—Zn oxide particle that has already been deposited. As a result, the a-axis and b-axis directions are aligned with those of an adjacent In—Ga—Zn oxide particle, and therefore, a single crystal region is formed in the film 129 including the In—Ga—Zn oxide particles. In other words, there is a case where the crystal orientation of the film 129 including the In—Ga—Zn oxide particles is uniform over the entire area of the hexagonal-crystal zinc oxide film 125, and the film 129 including the In—Ga—Zn oxide particles is single crystal. Alternatively, there is a case where a plurality of single crystal regions are formed in the film 129 including the In—Ga—Zn oxide particles and the single crystal regions are aligned only in the c-axis direction and not in the a-axis and b-axis directions.

Figure 5F:
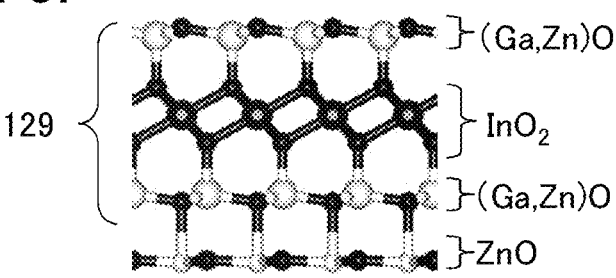

FIG. 5F illustrates a model of a cross-sectional shape of the vicinity of the interface between the zinc oxide film and the film 129 including the In—Ga—Zn oxide particles in the region 128 illustrated in FIG. 4C. As illustrated in FIG. 5F, Zn of the hexagonal-crystal zinc oxide film is bound to oxygen of a layer including gallium atoms and/or zinc atoms and oxygen atoms (denoted by (Ga,Zn)O) which is included in the film 129 including the In—Ga—Zn oxide particles.

Since the hexagonal-crystal zinc oxide film 125 has high crystallinity, the crystallinity of the film 129 including the In—Ga—Zn oxide particles can be increased using the hexagonal-crystal zinc oxide film 125 as a seed crystal.

Figure 8A:
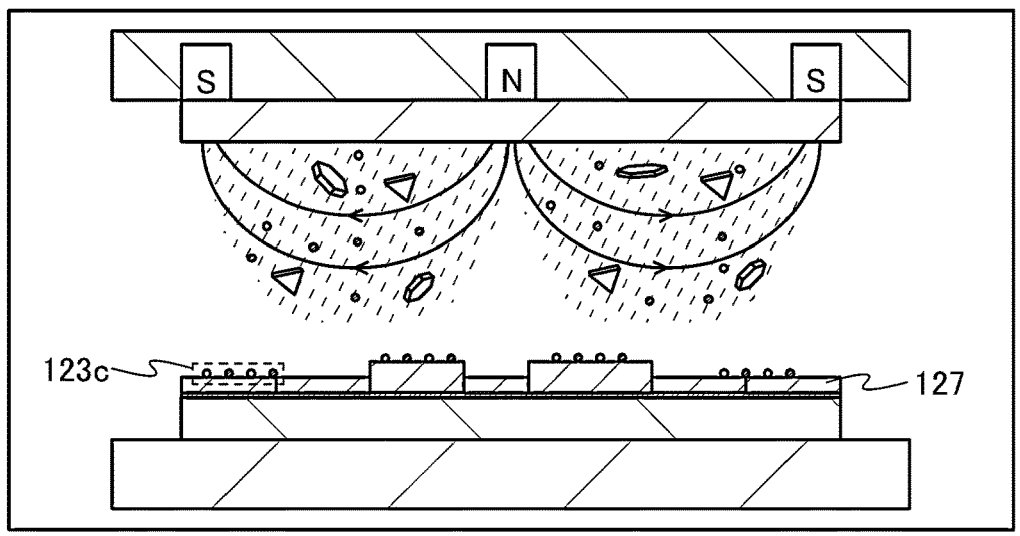
FIGS. 8A to 8C are schematic diagrams illustrating a method for manufacturing an oxide.

Next, as illustrated in FIG. 8A, zinc particles 123a and oxygen particles 123b are separated from the sputtering target and moved to the In—Ga—Zn oxide particle 127, whereby a hexagonal crystal grain 123c of zinc oxide is formed over the substrate in a manner similar to that in FIG. 4A.

Figure 8B:
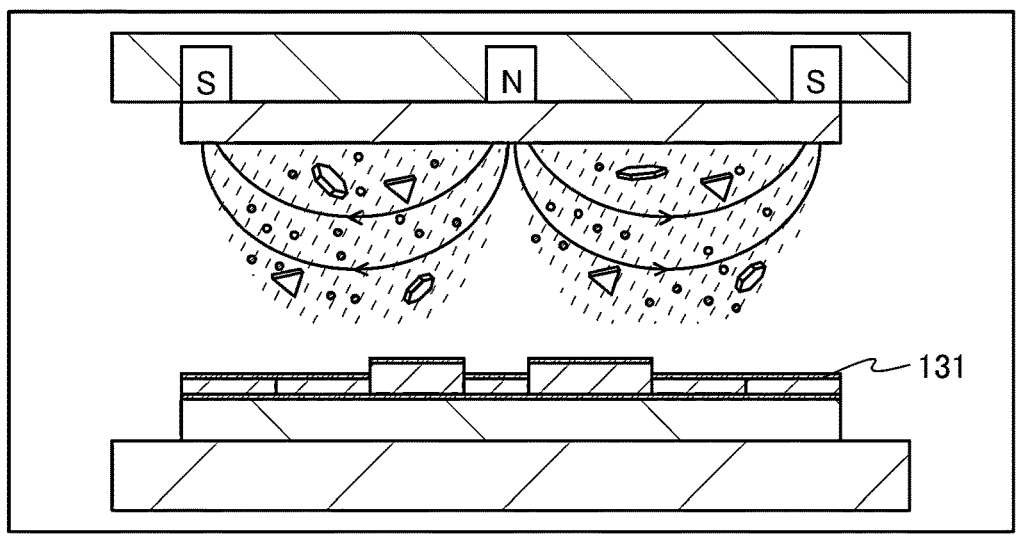

Since the crystal of zinc oxide grows rapidly in a direction parallel to the a-b plane, the hexagonal crystal grain 123c of zinc oxide grows in a direction parallel to the surface of the substrate 121, that is, a lateral direction in a cross section of a zinc oxide film, whereby a hexagonal-crystal zinc oxide film 131 is formed in a manner similar to that in FIG. 4B (see FIG. 8B). That is, the hexagonal-crystal zinc oxide film 131 includes a single crystal region.

Figure 8C:
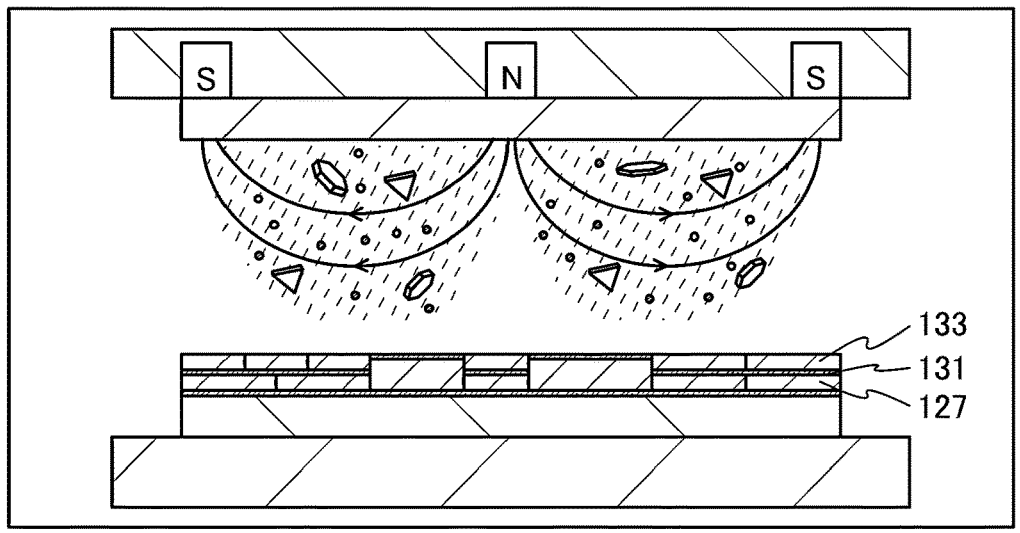

After that, sputtered particles are released from the sputtering target, and In—Ga—Zn oxide particles 133 are deposited over the hexagonal-crystal zinc oxide film 131 as illustrated in FIG. 8C, in a manner similar to that in FIG. 4C. In addition, another In—Ga—Zn oxide particle is deposited over the In—Ga—Zn oxide particles 133.

A highly crystalline oxide film can be formed by repeating the step of forming the hexagonal-crystal zinc oxide film 131 which is illustrated in FIG. 8B and the step of depositing the In—Ga—Zn oxide particles 133 which is illustrated in FIG. 8C.

The atomic ratio of Ga to In (Ga/In) and the atomic ratio of Zn to In (Zn/In) in an In—Ga—Zn oxide formed by a sputtering method using the sputtering target of Embodiment 1 are lower than those in the sputtering target. The atomic ratio of Zn to Ga (Zn/Ga) in the In—Ga—Zn oxide film is higher than or equal to 0.5.

Note that since the In—Ga—Zn oxide particles are deposited so as to be aligned with the c-axis direction of the hexagonal-crystal zinc oxide film, the oxide film obtained through this process is a CAAC-OS film with the c-axis aligned in a direction parallel to a normal vector of a formation surface or a normal vector of a surface of the CAAC-OS film.

A crystal structure of an oxide film obtained through the deposition process in FIGS. 4A to 4C and FIGS. 8A to 8C is described with reference to FIGS. 9A to 9C. The oxide film obtained through the deposition process in FIGS. 4A to 4C and FIGS. 8A to 8C has a homologous structure because a plurality of In—Ga—Zn oxide particles each having at least one layer including gallium atoms and/or zinc atoms and oxygen atoms between two indium oxide layers ($InO_2$) are stacked.

Figure 9A:
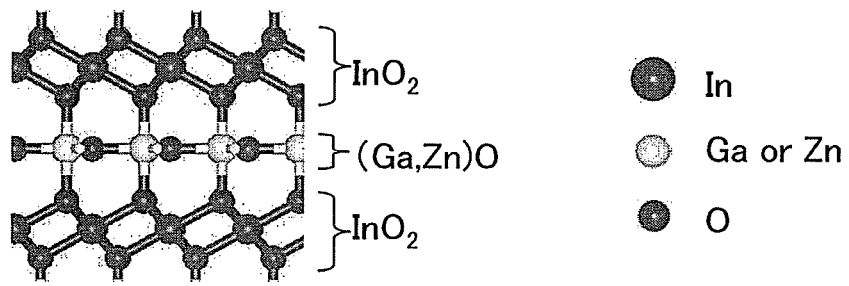
FIGS. 9A to 9C are schematic diagrams each illustrating an oxide.

As illustrated in FIG. 9A, the oxide film obtained through the deposition process in FIGS. 4A to 4C and FIGS. 8A to 8C has a structure in which three layers of a first indium oxide layer ($InO_2$), a layer including gallium atoms and/or zinc atoms and oxygen atoms (denoted by (Ga,Zn)O), and a second indium oxide layer ($InO_2$) are bound in this order. In other words, one layer including gallium atoms and/or zinc atoms and oxygen atoms is provided between indium oxide layers.

Figure 9B:
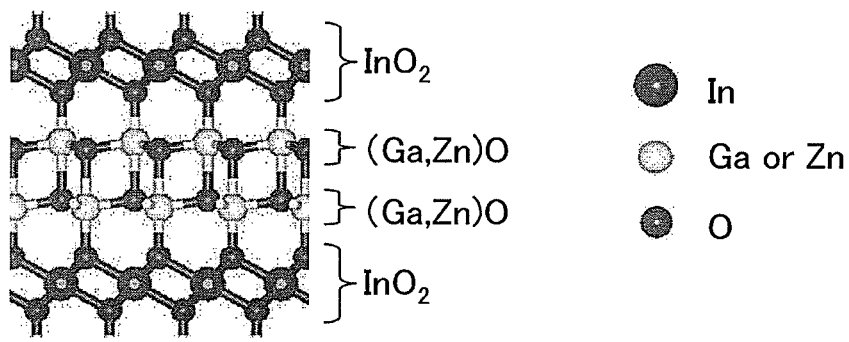

Alternatively, as illustrated in FIG. 9B, the oxide film obtained through the deposition process in FIGS. 4A to 4C and FIGS. 8A to 8C has a structure in which four layers of a first indium oxide layer ($InO_2$), a first layer including gallium atoms and/or zinc atoms and oxygen atoms (denoted by (Ga,Zn)O), a second layer including gallium atoms and/or zinc atoms and oxygen atoms (denoted by (Ga,Zn)O), and a second indium oxide layer ($InO_2$) are bound in this order. In other words, two layers including gallium atoms and/or zinc atoms and oxygen atoms are provided between indium oxide layers.

Figure 9C:
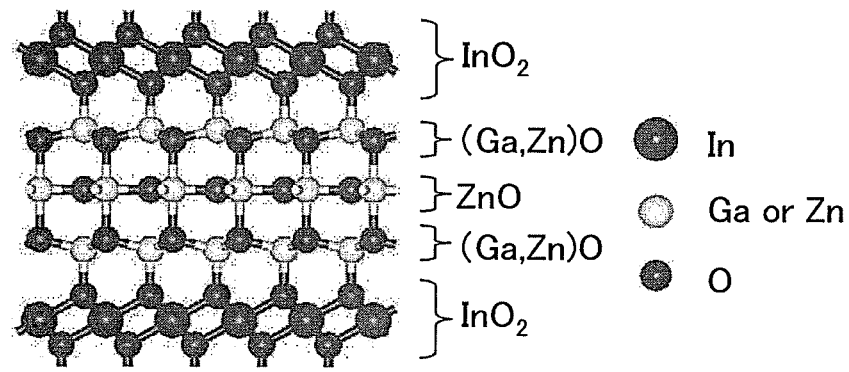

Alternatively, as illustrated in FIG. 9C, the oxide film obtained through the deposition process in FIGS. 4A to 4C and FIGS. 8A to 8C has a structure in which five layers of a first indium oxide layer ($InO_2$), a first layer including gallium atoms and/or zinc atoms and oxygen atoms (denoted by (Ga,Zn)O), a zinc oxide layer (ZnO), a second layer including gallium atoms and/or zinc atoms and oxygen atoms (denoted by (Ga,Zn)O), and a second indium oxide layer ($InO_2$) are bound in this order. In other words, two layers including gallium atoms and/or zinc atoms and oxygen atoms and a zinc oxide layer are provided between indium oxide layers.

Note that a repeating unit structure including a zinc oxide layer between a plurality of layers including gallium atoms and/or zinc atoms and oxygen atoms (denoted by (Ga,Zn)O) is formed in a region where the In—Ga—Zn oxide particle 127, the hexagonal-crystal zinc oxide film 131, and the In—Ga—Zn oxide particle 133 are stacked, as illustrated in FIG. 8C.

Note that although the step of forming the hexagonal-crystal zinc oxide film 131 which is illustrated in FIG. 8B and the step of depositing the In—Ga—Zn oxide particles 133 which is illustrated in FIG. 8C are described here as different steps, these steps may be performed at the same time. In that case, in the step of FIG. 8B, the hexagonal-crystal zinc oxide film 131 may be formed on side surfaces as well as top surfaces of the In—Ga—Zn oxide particles.

Through the above process, the CAAC-OS film can be formed. In addition, an In—Ga—Zn oxide film having a homologous structure can be formed. Note that with use of Al, Ti, Y, Zr, La, Cs, Nd, or Hf as appropriate instead of Ga in the In—Ga—Zn oxide, an In-M-Zn oxide (M represents Al, Ti, Y, Zr, La, Cs, Nd, or Hf) can be deposited. Note that instead of the model in which the crystal grain 123c is formed over the substrate 121, the CAAC-OS film can be formed according to a model in which the In—Ga—Zn oxide particle 127a illustrated in FIG. 5D or the In—Ga—Zn oxide particle 127b illustrated in FIG. 5E is formed over the substrate 121. In addition, a film of an In—Ga—Zn oxide having a homologous structure can be formed.

Here, details of the CAAC-OS film formed are described.

The CAAC-OS film is one of oxide semiconductor films including a plurality of c-axis aligned crystal parts.

In a transmission electron microscope (TEM) image of the CAAC-OS film, it is difficult to clearly find a boundary between crystal parts, that is, a grain boundary. Thus, in the CAAC-OS film, a reduction in electron mobility due to the grain boundary is less likely to occur.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are concatenated to each other, one large crystal region is formed in some cases. For example, a crystal region with an area of 2500 $nm^2$ or more, 5 $\mu m^2$ or more, or 1000 $\mu m^2$ or more is observed in some cases in the plan TEM image.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak attributable to c-axis alignment, e.g., a peak attributable to the (00x) plane orientation, appears in some cases.

In the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Further, for example, spots (bright spots) are shown in an electron diffraction pattern of the CAAC-OS. Furthermore, electron diffraction using an electron beam having a probe diameter (e.g., larger than or equal to 1 nm and smaller than or equal to 30 nm) close to or smaller than the size of a crystal part is also referred to as a nanobeam electron diffraction.

Figure 10A:
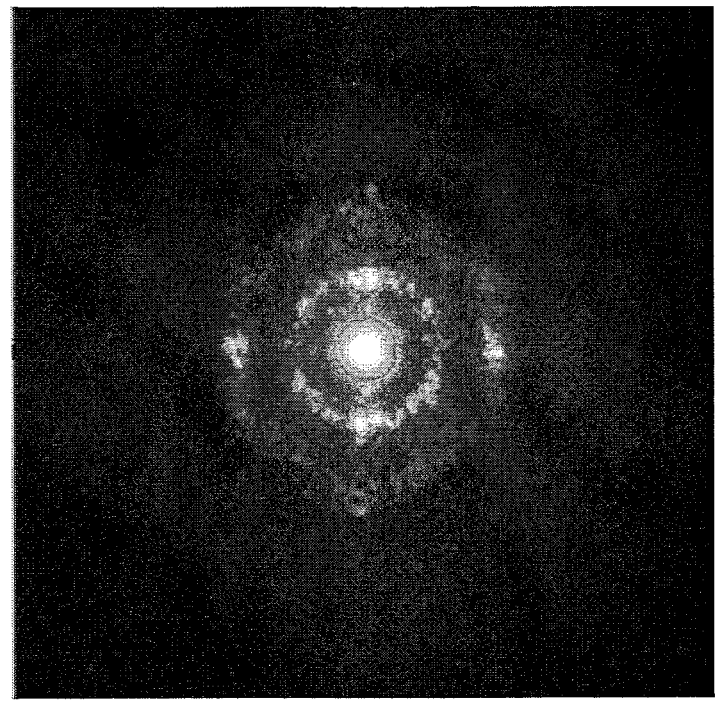
FIGS. 10A and 10B show nanobeam electron diffraction patterns of CAAC-OS and nc-OS.

FIG. 10A shows an example of a nanobeam electron diffraction pattern of a sample including CAAC-OS. Here, the sample is cut in the direction perpendicular to a surface where the CAAC-OS is formed and the thickness thereof is reduced to about 40 nm. Further, an electron beam with a diameter of 1 nmφ enters from the direction perpendicular to the cut surface of the sample. FIG. 10A shows that spots are observed in the nanobeam electron diffraction pattern of the CAAC-OS.

The CAAC-OS film is an oxide semiconductor film with a low impurity concentration. The impurity is an element other than the main components of the oxide semiconductor film, such as hydrogen, carbon, silicon, or a transition metal element. In particular, an element, such as silicon, that has higher bonding strength to oxygen than a metal element included in the oxide semiconductor film disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and has high reliability. Electric charges trapped by the carrier traps in the oxide semiconductor film take a long time to be released, and might behave like fixed electric charges. Thus, the transistor which includes the oxide semiconductor film having high impurity concentration and a high density of defect states has unstable electrical characteristics in some cases.

With the use of highly purified intrinsic or substantially highly purified intrinsic CAAC-OS in a transistor, variation in electrical characteristics of the transistor due to irradiation with visible light or ultraviolet light is small.

<Mechanism of Zinc Oxide Crystal Growth>

Here, a mechanism of crystal growth of the zinc oxide film 125 illustrated in FIG. 4B is described with reference to FIG. 11, FIGS. 12A to 12C, and FIGS. 13A and 13B.

Motion of atoms in heat treatment was examined by a classical molecular dynamics method. An empirical potential which characterizes the interaction between atoms is defined in a classical molecular dynamics method, so that force that acts on each atom can be determined. Here, a law of classical mechanics was applied to each atom and Newton's equation of motion was numerically solved, whereby motion (time-dependent change) of each atom was examined. In this calculation, a Born-Mayer-Huggins potential was used as the empirical potential.

Figure 11:
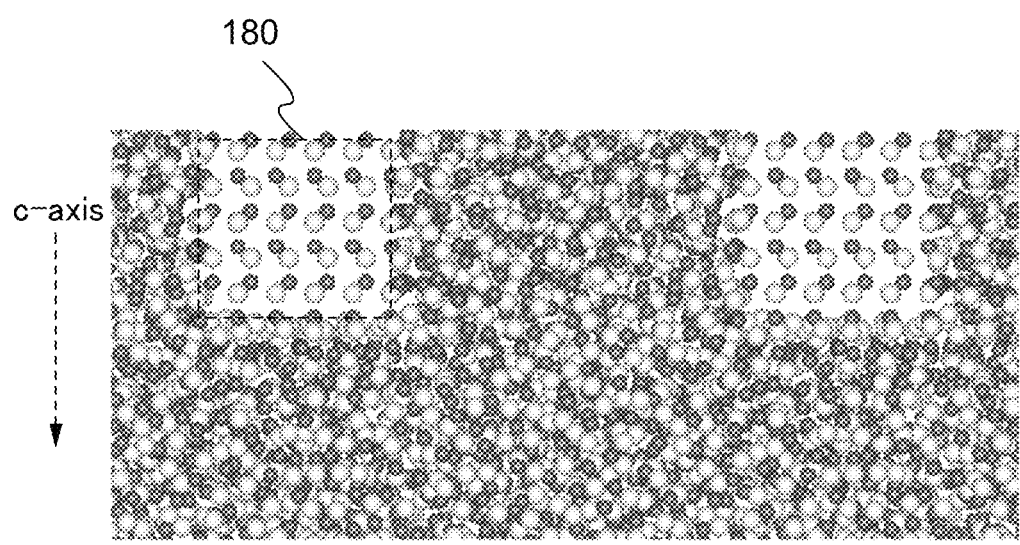
FIG. 11 illustrates a process of crystal growth of zinc oxide.

A model in which crystal nuclei 180 that are single crystal zinc oxide (hereinafter referred to as c-ZnO) having a width of 1 nm are provided at equal intervals in amorphous zinc oxide (hereinafter referred to as a-ZnO) was formed as illustrated in FIG. 11. Note that the density of a-ZnO and c-ZnO was 5.5 g/cm$^3$. The vertical direction was a c-axis direction.

Next, the model in FIG. 11 was subjected to classical molecular dynamics calculation at 700° C. for 100 psec (in increments of 0.2 fsec in 500,000 steps) with fixed c-ZnO under three-dimensional periodic boundary conditions. Results thereof are shown in FIGS. 12A to 12C and FIGS. 13A and 13B.

Figure 12A:
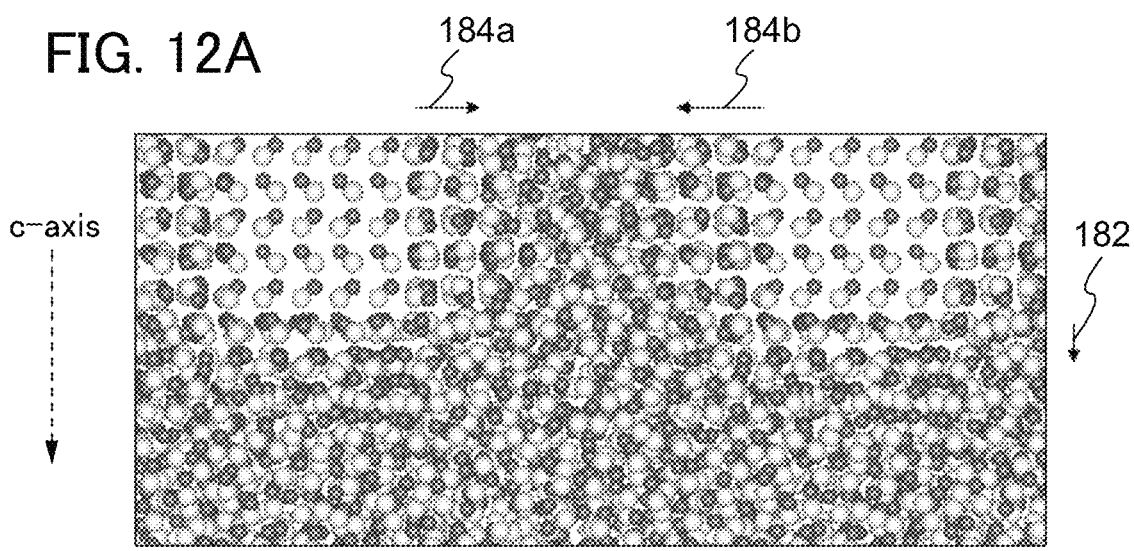
FIGS. 12A to 12C illustrate a process of crystal growth of zinc oxide.
Figure 12B:
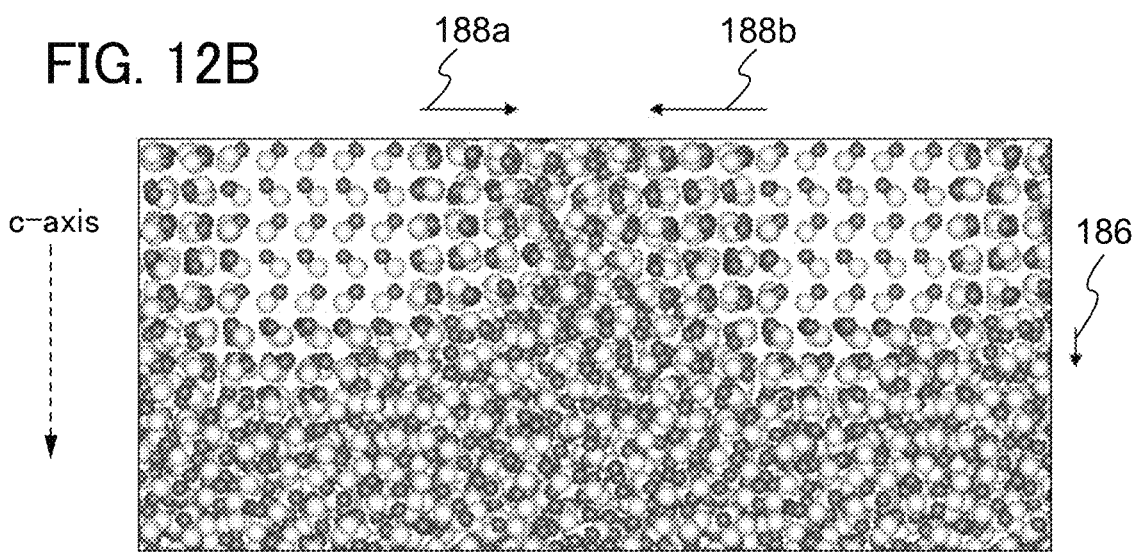
Figure 12C:
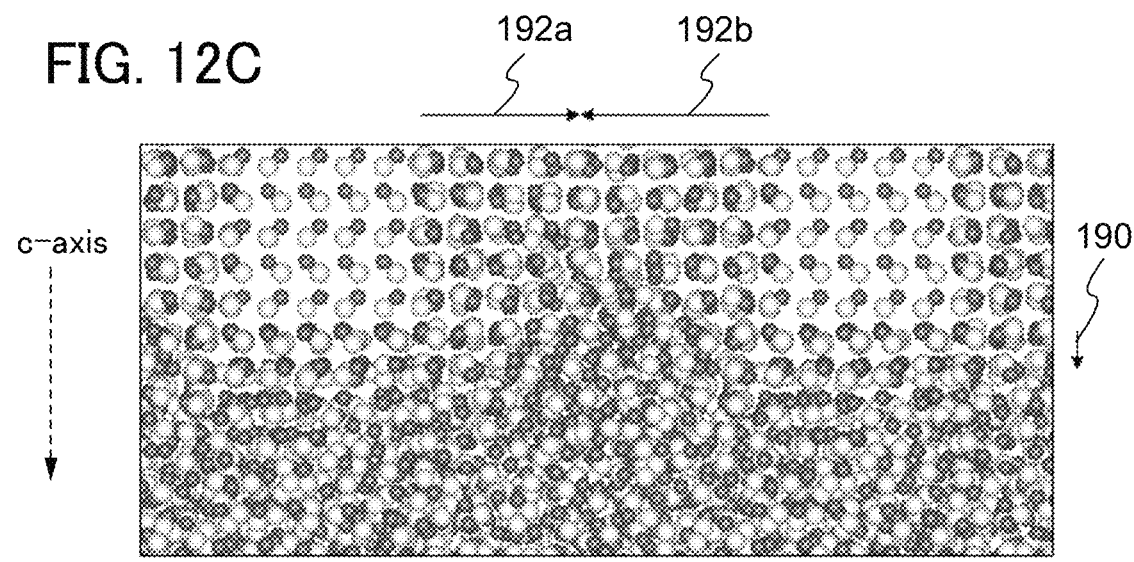
Figure 13A:
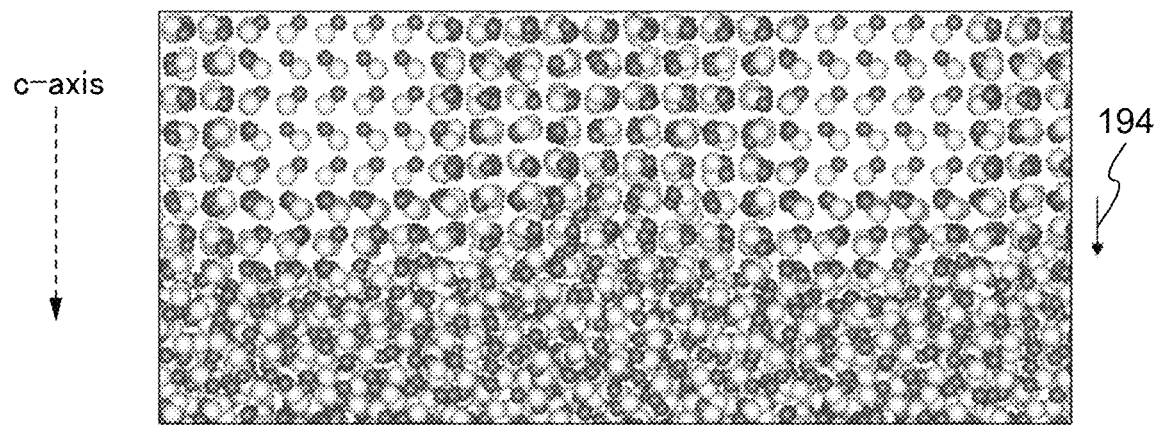
FIGS. 13A and 13B illustrate a process of crystal growth of zinc oxide.
Figure 13B:
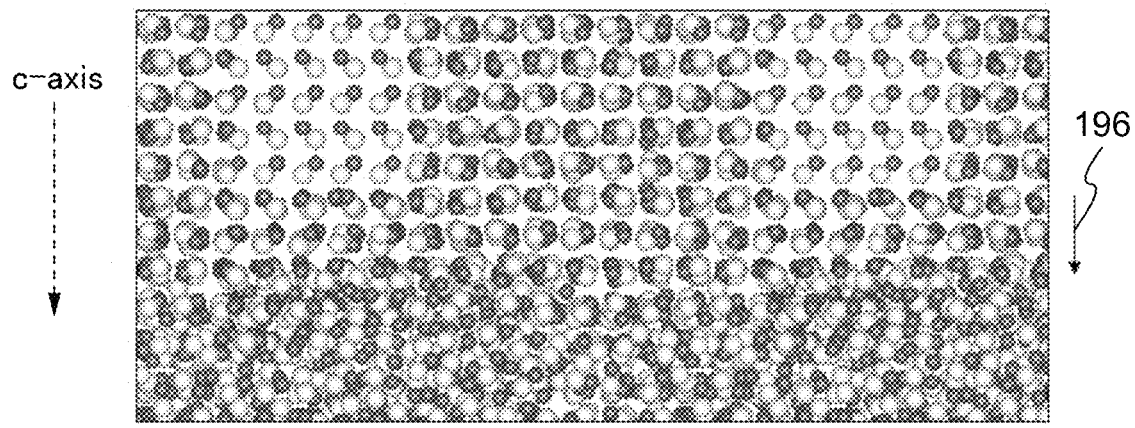

FIGS. 12A, 12B, and 12C respectively show the changes of atomic positions after 20 psec, 40 psec, and 60 psec. FIGS. 13A and 13B respectively show the changes of atomic positions after 80 psec and 100 psec. In each drawing, the distance and direction of crystal growth are denoted by the length and pointing direction of arrows.

Table 1 shows rates of crystal growth in the vertical direction (c-axis [001] direction) and in the horizontal direction perpendicular thereto.

TABLE 1

| Direction | Rate of crystal growth (nm/psec) |
| --- | --- |
| vertical | $6.1 \times 10^{-3}$ |
| horizontal | $3.0 \times 10^{-2}$ |

In FIGS. 12A to 12C, arrows 184*a*, 184*b*, 188*a*, 188*b*, 192*a*, and 192*b* in the horizontal direction (a direction perpendicular to a c-axis direction) are longer than arrows 182, 186, and 190 in the vertical direction (the c-axis direction). Therefore, it is found that crystal growth in the horizontal direction is preferential and that the crystal growth is finished between adjacent crystal nuclei in FIG. 12C.

In FIGS. 13A and 13B, it is found that crystal growth is carried out in the vertical direction (the c-axis direction) using crystal regions formed at the surface as seed crystals as indicated by arrows 194 and 196.

It is found from Table 1 that the rate of crystal growth in the horizontal direction is approximately 4.9 times as high as that in the vertical direction (c-axis [001] direction). Accordingly, crystal growth of ZnO first proceeds in a direction parallel to a surface (a-b plane). At this time, crystal growth proceeds in the horizontal direction on the a-b plane, and a single crystal region is formed. Next, crystal growth proceeds in the c-axis direction, i.e., a direction perpendicular to the surface (a-b plane), using the single crystal region formed at the surface (a-b plane) as a seed crystal. Therefore, ZnO tends to have c-axis alignment. In this manner, the single crystal region is formed by preferential crystal growth in the direction parallel to the surface (a-b plane) and then by crystal growth in the c-axis direction, which is the direction perpendicular to the surface (also referred to as epitaxial growth or axial growth).

<Heating Deposition (Deposition Temperature: Higher than or Equal to 600° C. and Lower than Substrate Strain Point)>

Next, a deposition method different from that in FIGS. 4A to 4C, FIGS. 5A to 5F, FIGS. 6A to 6C, FIGS. 7A and 7B, FIGS. 8A to 8C, and FIGS. 9A to 9C is described with reference to FIGS. 14A to 14C, FIG. 15, and FIGS. 16A to 16C. A deposition temperature in the deposition method illustrated in FIGS. 14A to 14C, FIG. 15, and FIGS. 16A to 16C is higher than that in the deposition method illustrated in FIGS. 4A to 4C, FIGS. 5A to 5F, FIGS. 6A to 6C, FIGS. 7A and 7B, FIGS. 8A to 8C, and FIGS. 9A to 9C. Zinc oxide is likely to vaporize at 600° C. or higher in a reduced-pressure atmosphere. Therefore, oxide films formed using the deposition method illustrated in FIGS. 4A to 4C, FIGS. 5A to 5F, FIGS. 6A to 6C, FIGS. 7A and 7B, FIGS. 8A to 8C, and FIGS. 9A to 9C and the deposition method illustrated in FIGS. 14A to 14C, FIG. 15, and FIGS. 16A to 16C have different crystal structures.

Figure 14A:
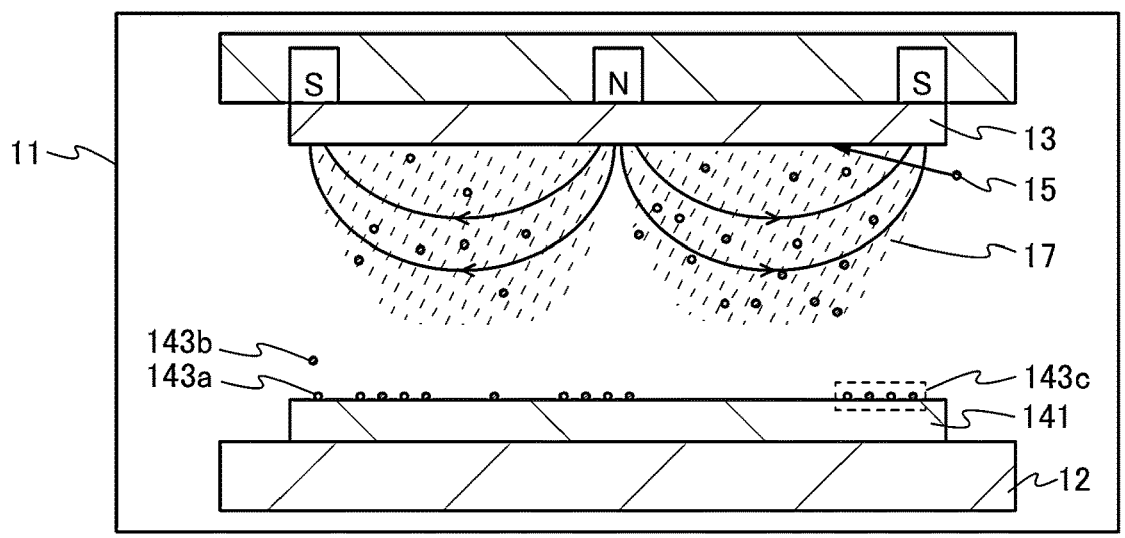
FIGS. 14A to 14C are schematic diagrams illustrating a method for manufacturing an oxide.

As illustrated in FIG. 14A, the ions 15 collide with the sputtering target 13 and sputtered particles are released from the sputtering target 13 in a manner similar to that in FIG. 4A. Therefore, ions, sputtered particles, electrons, and/or the like are included in the plasma 17.

Examples of the sputtered particles include zinc particles, oxygen particles, zinc oxide particles, In—Ga—Zn oxide particles, and the like. The sputtering target manufactured in Embodiment 1 contains Zn at a higher ratio than that of Ga. For this reason, a description is given here using the model in which zinc particles, oxygen particles, or zinc oxide particles are preferentially separated from the sputtering target 13 and then zinc particles, oxygen particles, zinc oxide particles, and In—Ga—Zn oxide particles are separated.

First, zinc particles 143*a* and oxygen particles 143*b* are separated as sputtered particles from the sputtering target 13. Next, the zinc particles 143*a* and the oxygen particles 143*b* move to a substrate 141, whereby a hexagonal crystal grain 143*c* of zinc oxide is formed over the substrate.

Figure 14B:
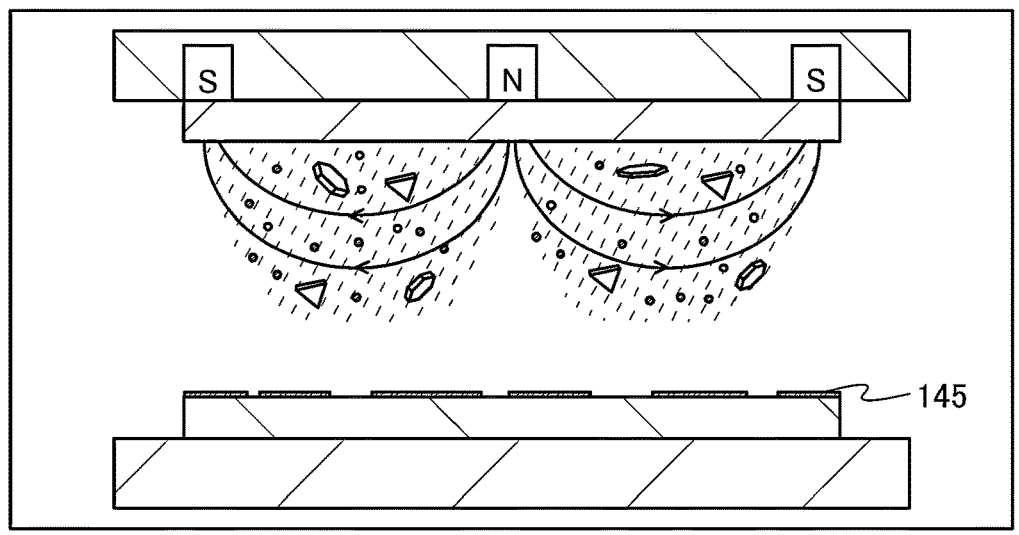

Note that because the substrate temperature here is 600° C. or higher, crystal growth occurs in the horizontal direction on the a-b plane parallel to a surface of the substrate 141. As a result, a hexagonal-crystal zinc oxide film 145 is formed as illustrated in FIG. 14B. That is, the hexagonal-crystal zinc oxide film 145 includes a single crystal region. Note that the hexagonal-crystal zinc oxide film 145 is discontinuous because part of zinc oxide is vaporized unlike in the deposition step illustrated in FIG. 4B.

Figure 15:
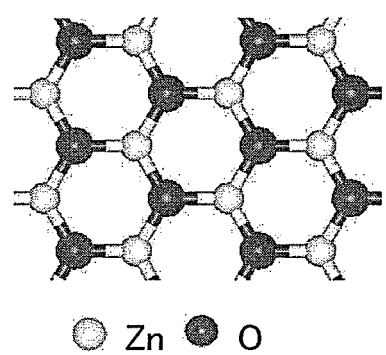
FIG. 15 is a schematic diagram illustrating an oxide.

FIG. 15 illustrates a model of a top-view shape of the hexagonal-crystal zinc oxide film 145. As illustrated in FIG. 15, Zn atoms and O atoms are bound in a hexagonal shape in the hexagonal-crystal zinc oxide film 145. The binding of Zn atoms and O atoms in the hexagonal shape extends over the a-b plane.

Figure 14C:
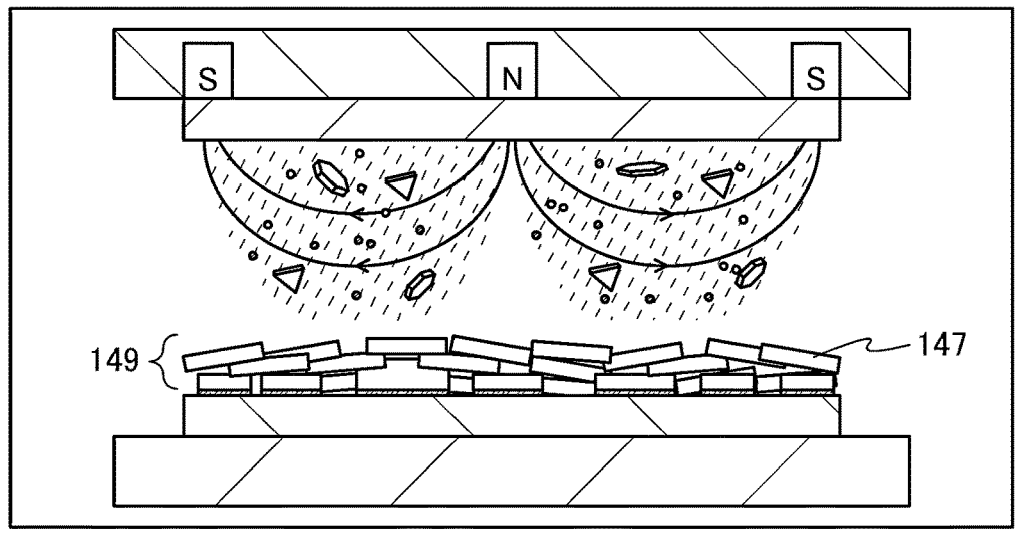

Next, sputtered particles are released from the sputtering target. Here, In—Ga—Zn oxide particles are separated as the sputtered particles, and as illustrated in FIG. 14C, In—Ga—Zn oxide particles 147 are deposited over the hexagonal-crystal zinc oxide film 145, whereby a film 149 including the In—Ga—Zn oxide particles is formed. The In—Ga—Zn oxide particles 147 have a structure similar to that of the In—Ga—Zn oxide particles 127. Note that zinc particles and oxygen particles, which are also separated in this step as sputtered particles, are omitted here.

Here, the hexagonal-crystal zinc oxide film 145 formed over the substrate 141 is discontinuous and does not cover the substrate 141 entirely. Therefore, the In—Ga—Zn oxide particle 147 is deposited over the hexagonal-crystal zinc oxide film 145 so as to be aligned with the crystal orientation of the hexagonal-crystal zinc oxide film 145. Specifically, the In—Ga—Zn oxide particle 147 separated from the sputtering target 13 is moved or rotated in the vicinity of the hexagonal-crystal zinc oxide film 145 such that the c-axis of the In—Ga—Zn oxide particle 147 is parallel to the c-axis of the hexagonal-crystal zinc oxide film 145, and after that, the In—Ga—Zn oxide particle 147 is deposited over the hexagonal-crystal zinc oxide film 145.

On the other hand, the In—Ga—Zn oxide particles 147 have random crystal orientations in a region where the hexagonal-crystal zinc oxide film 145 is not formed.

Figure 16A:
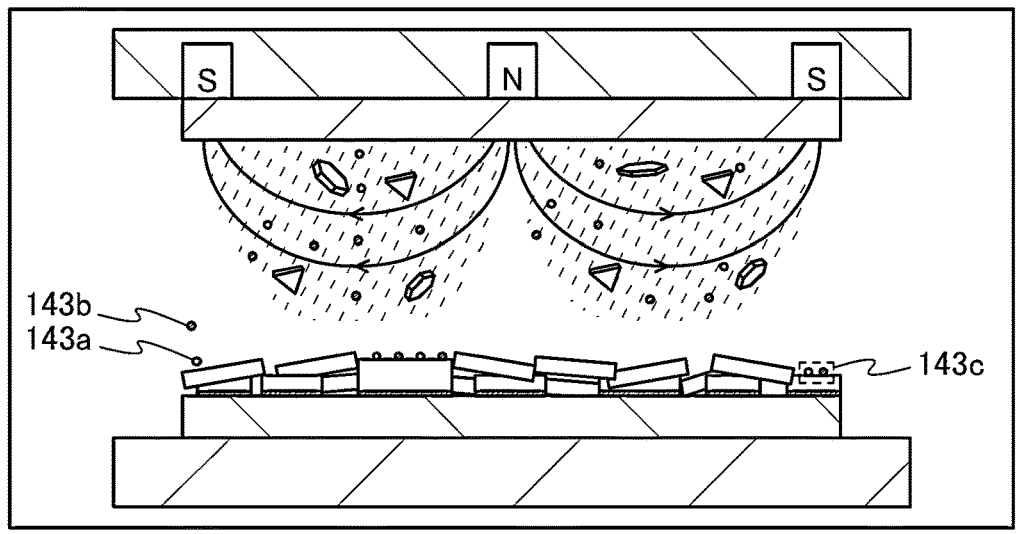
FIGS. 16A to 16C are schematic diagrams illustrating a method for manufacturing an oxide.

Next, as illustrated in FIG. 16A, zinc particles 143*a* and oxygen particles 143*b* are separated from the sputtering target and are transferred and attached to the In—Ga—Zn oxide particles 147, in a manner similar to that in FIG. 14A. As a result, a hexagonal-crystal zinc oxide film 151 is formed as illustrated in FIG. 16B.

Figure 16B:
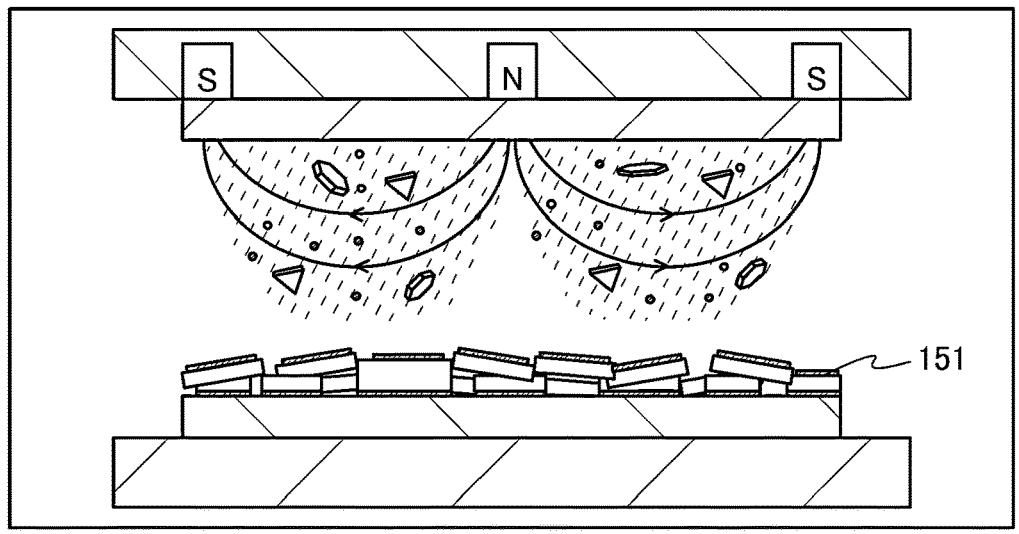
Figure 16C:
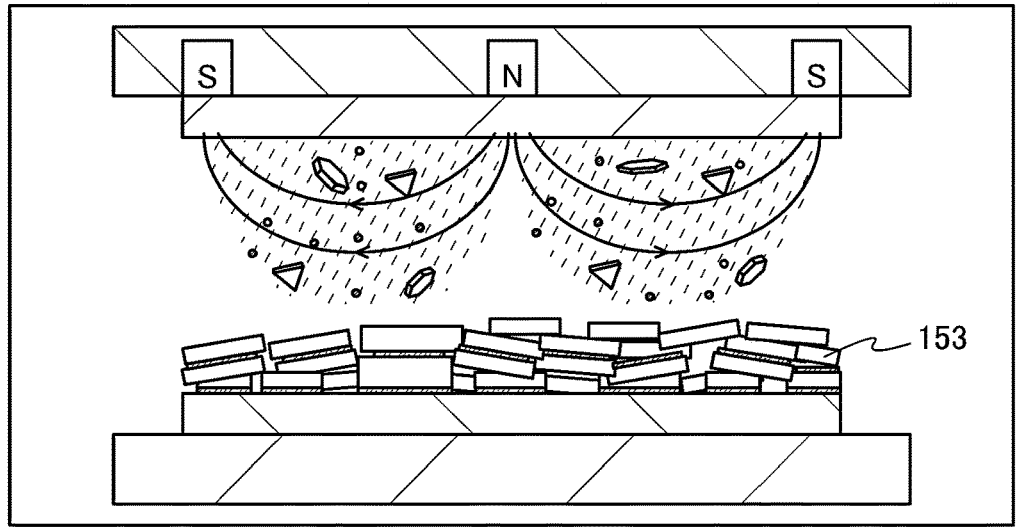

After that, sputtered particles are released from the sputtering target in a manner similar to that in FIG. 14B, and In—Ga—Zn oxide particles 153 are deposited over the hexagonal-crystal zinc oxide film 151 as illustrated in FIG. 16C. In addition, another In—Ga—Zn oxide particle is deposited over the In—Ga—Zn oxide particles 153.

A highly crystalline oxide film can be formed by repeating the step of forming the hexagonal-crystal zinc oxide film 151 which is illustrated in FIG. 16B and the step of depositing the In—Ga—Zn oxide particles 153 which is illustrated in FIG. 16C.

The atomic ratio of Ga to In (Ga/In) and the atomic ratio of Zn to In (Zn/In) in an In—Ga—Zn oxide formed by a sputtering method using the sputtering target of Embodiment 1 are lower than those in the sputtering target. The atomic ratio of Zn to Ga (Zn/Ga) in the In—Ga—Zn oxide film is higher than or equal to 0.5.

Note that an oxide film obtained through the deposition process illustrated in FIGS. 14A to 14C, FIG. 15, and FIGS. 16A to 16C has random crystal orientations and therefore has a polycrystalline structure. However, sputtered particles deposited in the process of forming the film each have a homologous structure. Thus, the oxide film obtained through the deposition process illustrated in FIGS. 14A to 14C, FIG. 15, and FIGS. 16A to 16C includes homologous structure regions and has high crystallinity.

Through the above process, the In—Ga—Zn oxide film having a polycrystalline structure can be formed. Note that with use of Al, Ti, Y, Zr, La, Cs, Nd, or Hf as appropriate instead of Ga in the In—Ga—Zn oxide, an In-M-Zn oxide (M represents Al, Ti, Y, Zr, La, Cs, Nd, or Hf) having a polycrystalline structure can be deposited.

Here, the deposited In-M-Zn oxide having a polycrystalline structure is described. Note that the In-M-Zn oxide having a polycrystalline structure is hereinafter referred to as a polycrystalline oxide semiconductor. The polycrystalline oxide semiconductor includes a plurality of crystal grains.

In an image of a polycrystalline oxide semiconductor film which is obtained with a TEM, crystal grains can be found. In most cases, the size of the crystal grains in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in an image of the polycrystalline oxide semiconductor film which is obtained with the TEM, a boundary between crystal grains can be found in some cases.

For example, the polycrystalline oxide semiconductor film may include a plurality of crystal grains, and the plurality of crystal grains may be oriented in different directions. A polycrystalline oxide semiconductor film is subjected to structural analysis with an XRD apparatus. For example, when a polycrystalline oxide semiconductor film including an $InGaZnO_4$ crystal is analyzed by an out-of-plane method, peaks of $2\theta$ appear at around 31°, 36°, and the like in some cases.

For example, the polycrystalline oxide semiconductor film has high crystallinity and thus has high electron mobility in some cases. Accordingly, a transistor including the polycrystalline oxide semiconductor film as a channel formation region has high field-effect mobility. Note that there are cases in which an impurity is segregated at the grain boundary in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, the transistor including the polycrystalline oxide semiconductor film as a channel formation region has larger variation in electrical characteristics and lower reliability than a transistor including a CAAC-OS film as a channel formation region in some cases.

<Room-Temperature Deposition (Deposition Temperature: Higher than or Equal to 20° C. and Lower than or Equal to 150° C.)>

Next, a deposition method different from that in FIGS. 4A to 4C, FIGS. 5A to 5F, FIGS. 6A to 6C, FIGS. 7A and 7B, FIGS. 8A to 8C, and FIGS. 9A to 9C is described with reference to FIGS. 17A to 17C and FIGS. 18A and 18B. A deposition temperature in the deposition method illustrated in FIGS. 17A to 17C and FIGS. 18A and 18B is lower than that in the deposition method illustrated in FIGS. 4A to 4C, FIGS. 5A to 5F, FIGS. 6A to 6C, FIGS. 7A and 7B, FIGS. 8A to 8C, and FIGS. 9A to 9C.

Figure 17A:
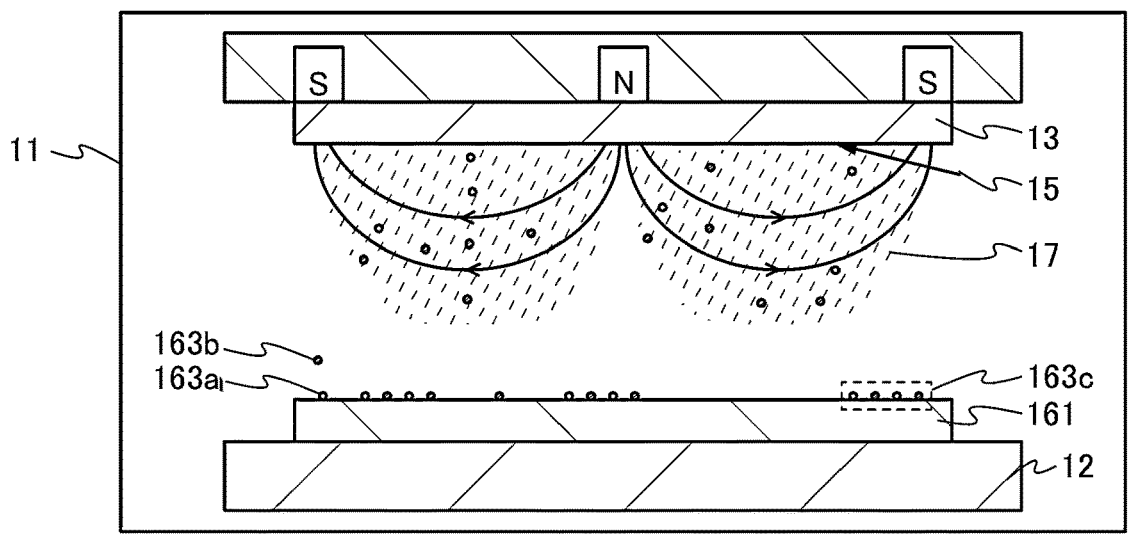
FIGS. 17A to 17C are schematic diagrams illustrating a method for manufacturing an oxide.

As illustrated in FIG. 17A, the ions 15 collide with the sputtering target 13 and sputtered particles are released from the sputtering target 13 in a manner similar to that in FIG. 4A. Therefore, ions, sputtered particles, electrons, and/or the like are included in the plasma 17.

Examples of the sputtered particles include zinc particles, oxygen particles, zinc oxide particles, In—Ga—Zn oxide particles, and the like. The sputtering target manufactured in Embodiment 1 contains Zn at a higher ratio than that of Ga. For this reason, a description is given here using the model in which zinc particles, oxygen particles, or zinc oxide particles are preferentially separated from the sputtering target 13 and then zinc particles, oxygen particles, zinc oxide particles, and In—Ga—Zn oxide particles are separated.

Figure 17B:
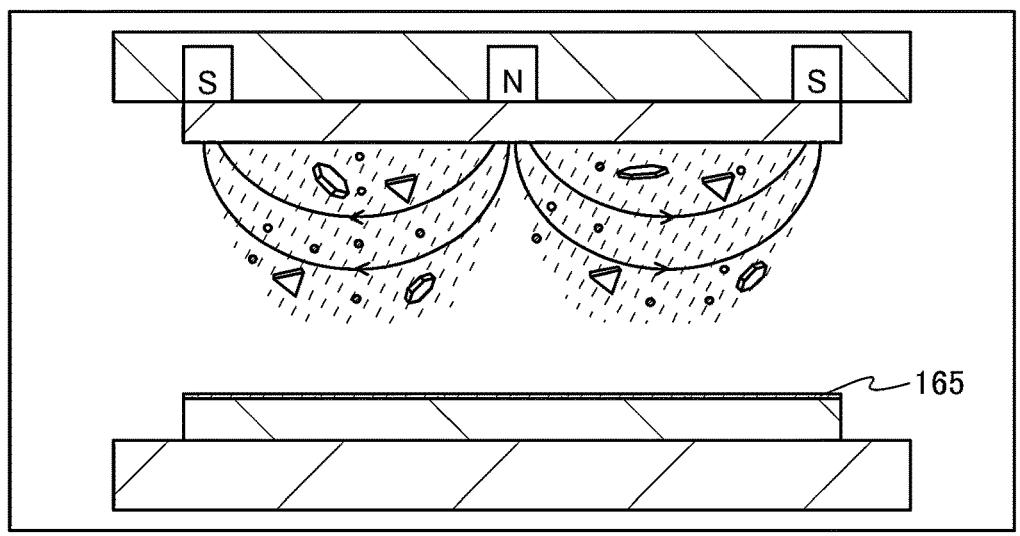

First, zinc particles 163a and oxygen particles 163b are separated as sputtered particles from the sputtering target 13 and are transferred to a substrate 161, whereby a zinc oxide film 165 is formed over the substrate 161 as illustrated in FIG. 17B.

Note that because the substrate temperature here is higher than or equal to 20° C. and lower than or equal to 150° C., the zinc oxide film 165 has low crystallinity.

Figure 17C:
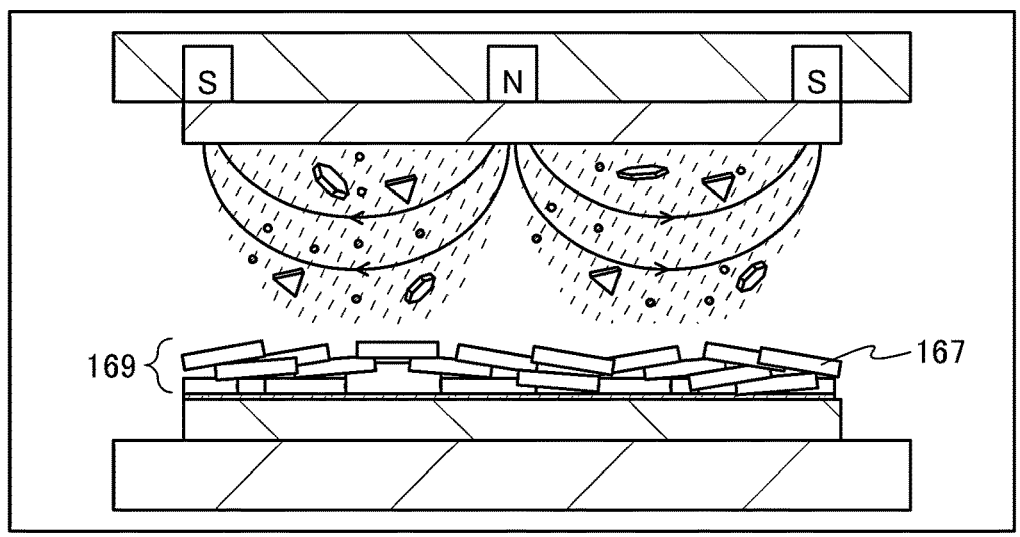

Next, sputtered particles are released from the sputtering target. Here, In—Ga—Zn oxide particles are separated as the sputtered particles, and as illustrated in FIG. 17C, In—Ga—Zn oxide particles 167 are deposited over the zinc oxide film 165, whereby a film 169 including the In—Ga—Zn oxide particles is formed. The In—Ga—Zn oxide particles 167 have a structure similar to that of the In—Ga—Zn oxide particles 127. Note that zinc particles and oxygen particles, which are also separated in this step as sputtered particles, are omitted here.

Since the zinc oxide film 165 has low crystallinity here, the In—Ga—Zn oxide particles 167 deposited over the zinc oxide film 165 have random crystal orientations.

Figure 18A:
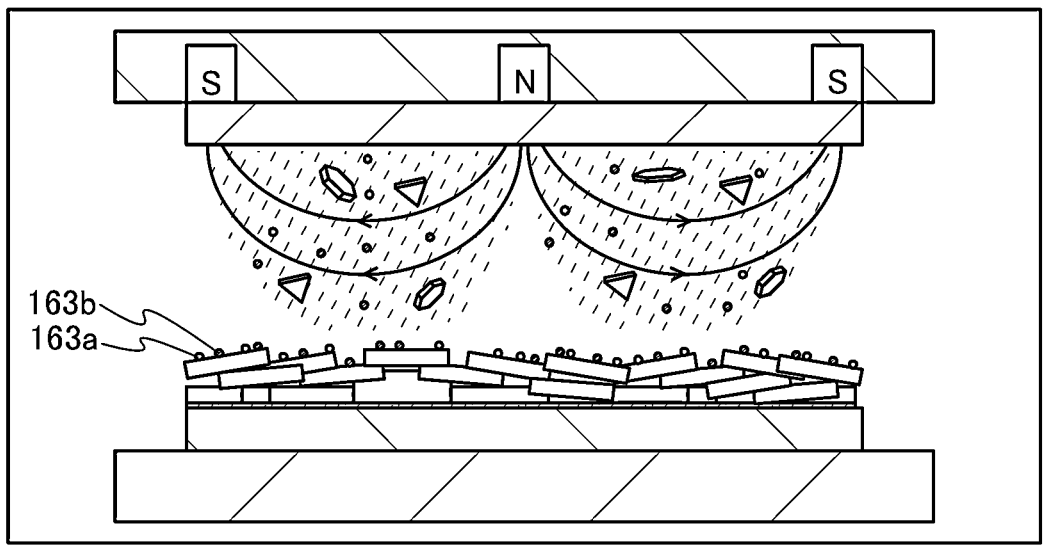
FIGS. 18A and 18B are schematic diagrams illustrating a method for manufacturing an oxide.

Then, as illustrated in FIG. 18A, zinc particles 163a and oxygen particles 163b are separated from the sputtering target and are transferred and attached to the In—Ga—Zn oxide particles 167. As a result, a zinc oxide film with low crystallinity is formed. Furthermore, other sputtered particles as well as the zinc particles 163a and the oxygen particles 163b are deposited at the same time over the In—Ga—Zn oxide particles 167 or the zinc oxide film with low crystallinity. Accordingly, a zinc oxide film 169a with low crystallinity and sputtered particles 169b are mixed as illustrated in FIG. 18B.

Figure 18B:
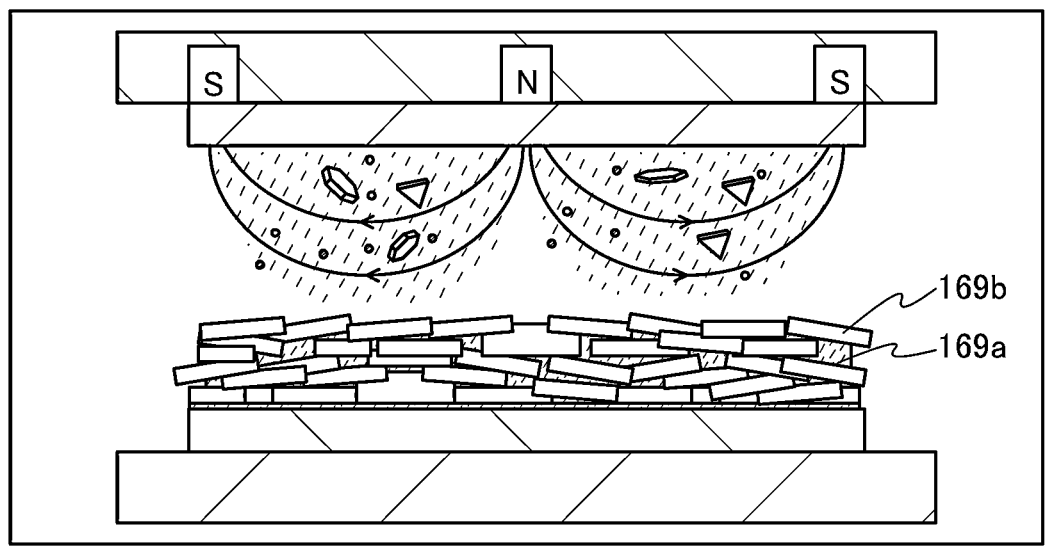

An In—Ga—Zn oxide film having a microcrystalline structure can be formed by repeating the step of transferring and attaching the zinc particles 163a and the oxygen particles 163b to the In—Ga—Zn oxide particles 167 which is illustrated in FIG. 18A and the step of depositing the In—Ga—Zn oxide particles 169b which is illustrated in FIG. 18B.

The atomic ratio of Ga to In (Ga/In) and the atomic ratio of Zn to In (Zn/In) in an In—Ga—Zn oxide formed by a sputtering method using the sputtering target of Embodiment 1 are lower than those in the sputtering target. The atomic ratio of Zn to Ga (Zn/Ga) in the In—Ga—Zn oxide film is higher than or equal to 0.5.

Note that an oxide film obtained through the deposition process illustrated in FIGS. 17A to 17C and FIGS. 18A and 18B has random crystal orientations. Furthermore, the oxide film is deposited at a lower temperature than that for the oxide film obtained through the deposition process illustrated in FIGS. 14A to 14C, FIG. 15, and FIGS. 16A to 16C, and therefore has lower crystallinity. However, sputtered particles deposited in the process of forming the film each have a homologous structure. Thus, the oxide film obtained through the deposition process illustrated in FIGS. 17A to 17C and FIGS. 18A and 18B has higher crystallinity than an oxide film having an amorphous structure.

Through the above process, the In—Ga—Zn oxide film having a microcrystalline structure can be formed. Note that with use of Al, Ti, Y, Zr, La, Cs, Nd, or Hf as appropriate instead of Ga in the In—Ga—Zn oxide, an In-M-Zn oxide (M represents Al, Ti, Y, Zr, La, Cs, Nd, or Hf) having a microcrystalline structure can be deposited.

Here, the formed oxide film having a microcrystalline structure is described below. Note that an In-M-Zn oxide having a microcrystalline structure is hereinafter referred to as a microcrystalline oxide semiconductor.

In an image of the microcrystalline oxide semiconductor film which is obtained with the TEM, it may be difficult to clearly find crystal parts in some cases. In most cases, the size of a crystal part in the microcrystalline oxide semiconductor film is greater than or equal to 1 nm and less than or equal to 100 nm, or greater than or equal to 1 nm and less than or equal to 10 nm, for example. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In an image of the nc-OS film which is obtained with the TEM, for example, it may be difficult to clearly find a crystal grain in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Furthermore, there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak which shows a crystal plane does not appear. Further, a diffraction pattern like a halo pattern appears in a selected-area electron diffraction pattern of the nc-OS film which is obtained by using an electron beam having a probe diameter (e.g., larger than or equal to 50 nmϕ) larger than the size of a crystal part. Meanwhile, spots are observed in an electron diffraction pattern of the nc-OS film obtained by using an electron beam having a probe diameter (e.g., larger than or equal to 1 nm and smaller than or equal to 30 nm) close to or smaller than the size of a crystal part. Also in a nanobeam electron diffraction pattern of the nc-OS film, a plurality of spots are shown in a ring-like region in some cases.

Figure 10B:
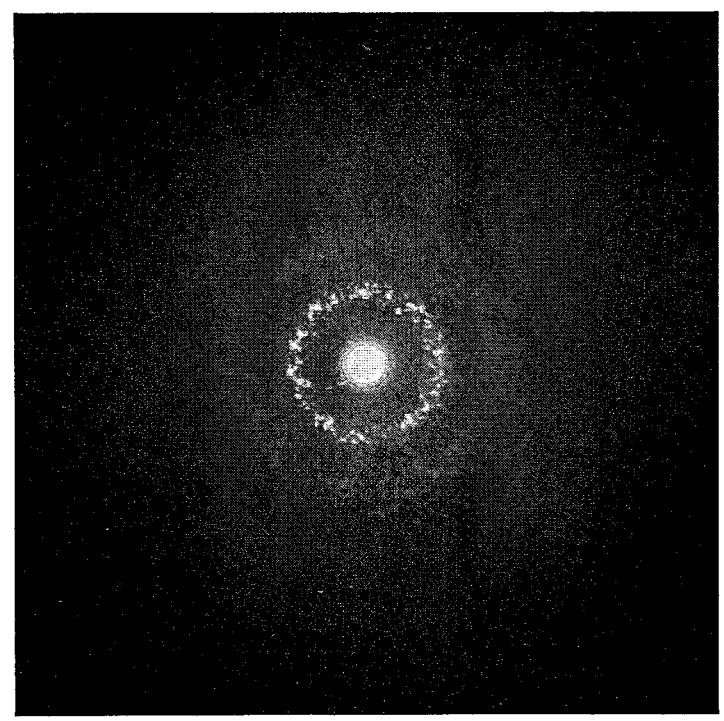

FIG. 10B shows an example of a nanobeam electron diffraction pattern of a sample including an nc-OS film. The measurement position is changed. Here, the sample is cut in the direction perpendicular to a surface where the nc-OS film is formed and the thickness thereof is reduced to be less than or equal to 10 nm. Further, an electron beam with a probe diameter of 1 nm enters from the direction perpendicular to the cut surface of the sample. FIG. 10B shows that, when a nanobeam electron diffraction is performed on the sample including the nc-OS film, a diffraction pattern exhibiting a crystal plane is obtained, but orientation along a crystal plane in a particular direction is not observed.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Accordingly, the nc-OS film has higher carrier density than the CAAC-OS film in some cases. An oxide semiconductor film with a high carrier density tends to have a high electron mobility. Therefore, a transistor including the nc-OS film as a channel formation region has a high field-effect mobility in some cases. The nc-OS film has a higher density of defect states than the CAAC-OS film, and thus may have a lot of carrier traps. Consequently, the transistor including the nc-OS film as a channel formation region has larger variation in electrical characteristics and lower reliability than a transistor including the CAAC-OS film as a channel formation region. Note that the nc-OS film can be easily formed as compared to the CAAC-OS film because the nc-OS film can be obtained even when the amount of impurity contained therein is relatively large; thus, the nc-OS film is sometimes preferably used depending on the application. Therefore, a semiconductor device including the transistor including the nc-OS film can be manufactured with high productivity.

Embodiment 3

In this embodiment, a deposition apparatus for depositing a highly crystalline oxide film will be described with reference to FIGS. 19 and 20.

First, a structure of a deposition apparatus that hardly allows the entry of impurities into a film during deposition will be described with reference to FIGS. 19 and 20.

Figure 19:
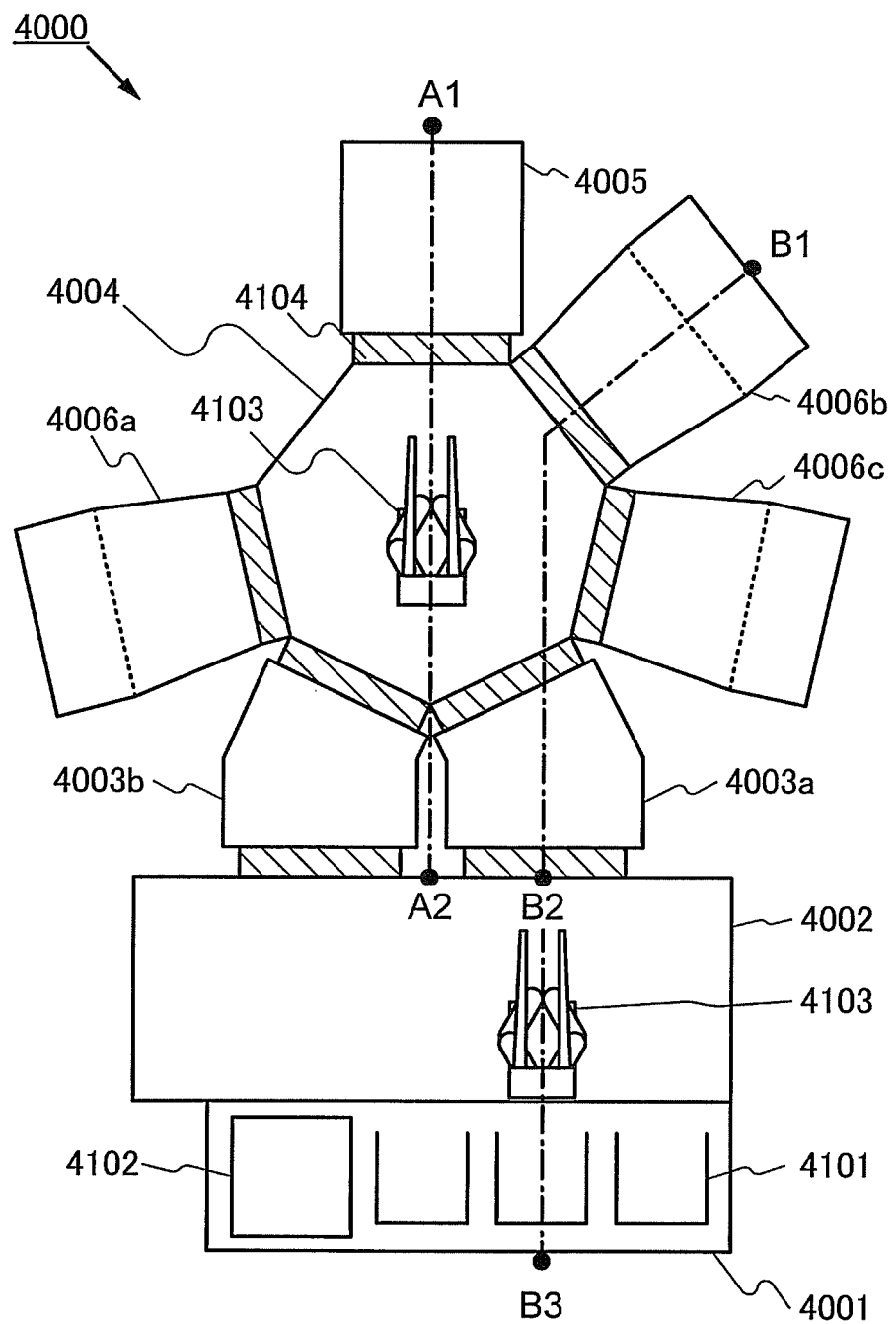
FIG. 19 is a top view of a deposition apparatus.

FIG. 19 is a schematic top view of a single wafer multi-chamber deposition apparatus 4000. The deposition apparatus 4000 includes an atmosphere-side substrate supply chamber 4001 including a cassette port 4101 for storing substrates and an alignment port 4102 for performing alignment of substrates, an atmosphere-side substrate transfer chamber 4002 through which a substrate is transferred from the atmosphere-side substrate supply chamber 4001, a load lock chamber 4003a where a substrate is carried in and the pressure is switched from atmospheric pressure to reduced pressure or from reduced pressure to atmospheric pressure, an unload lock chamber 4003b where a substrate is carried out and the pressure is switched from reduced pressure to atmospheric pressure or from atmospheric pressure to reduced pressure, a transfer chamber 4004 where a substrate is transferred in a vacuum, a substrate heating chamber 4005 where a substrate is heated, and deposition chambers 4006a, 4006b, and 4006c in each of which a sputtering target is placed for deposition.

Note that a plurality of cassette ports 4101 may be provided as illustrated in FIG. 19 (in FIG. 19, three cassette ports 4101 are provided).

The atmosphere-side substrate transfer chamber 4002 is connected to the load lock chamber 4003a and the unload lock chamber 4003b, the load lock chamber 4003a and the unload lock chamber 4003b are connected to the transfer chamber 4004, and the transfer chamber 4004 is connected to the substrate heating chamber 4005 and the deposition chambers 4006a, 4006b, and 4006c.

Note that gate valves 4104 are provided in connecting portions between the chambers so that each chamber excluding the atmosphere-side substrate supply chamber 4001 and the atmosphere-side substrate transfer chamber 4002 can be independently kept in a vacuum state. In each of the atmosphere-side substrate supply chamber 4002 and the transfer chamber 4004, a substrate transfer robot 4103 is provided, which is capable of transferring glass substrates.

In the deposition apparatus 4000, substrates can be transferred without being exposed to the air between treatments, and adsorption of impurities to substrates can be suppressed. Note that the number of transfer chambers, the number of deposition chambers, the number of load lock chambers, the number of unload lock chambers, and the number of substrate heating chambers are not limited to the above, and the numbers thereof can be set as appropriate depending on the space for installation or the process conditions.

Figure 20:
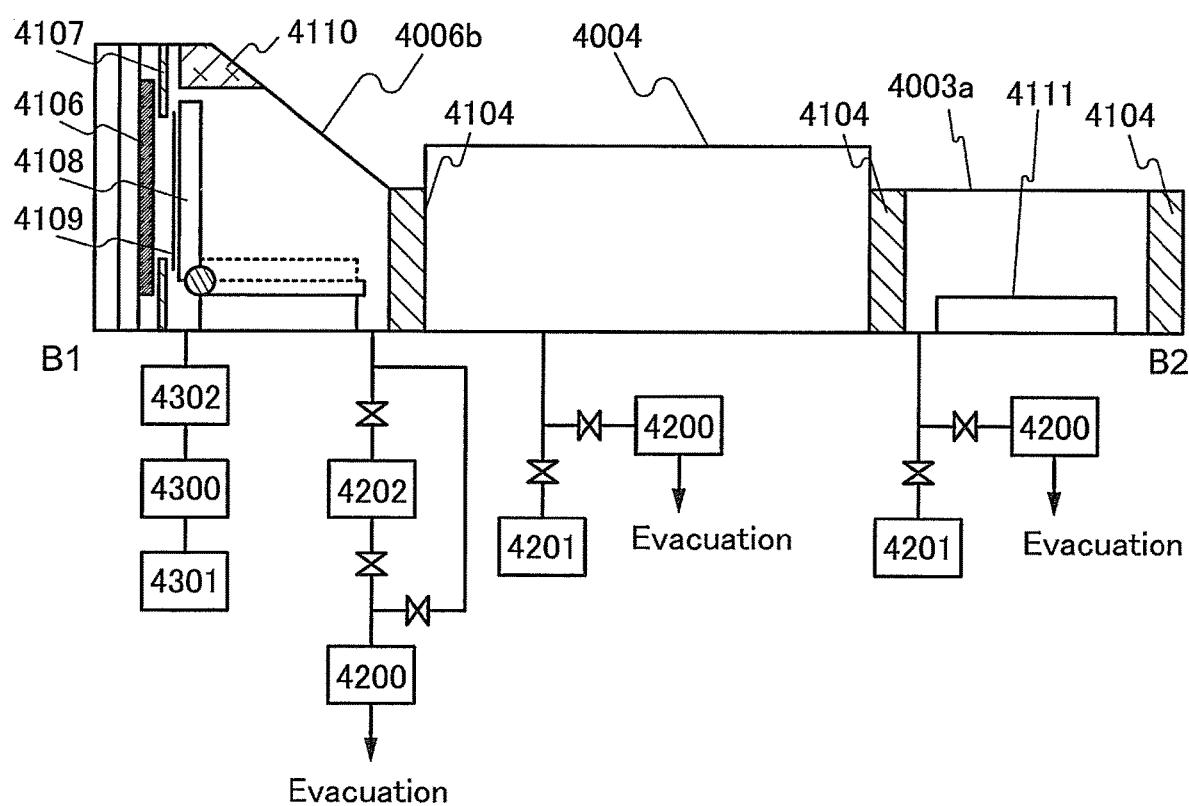
FIG. 20 is a cross-sectional view of a deposition apparatus.

FIG. 20 is a cross-section view taken along dashed-dotted line B1-B2 in the deposition apparatus 4000 illustrated in FIG. 19.

A heating mechanism which can be used in the substrate heating chamber 4005 may be a heating mechanism which uses a resistance heater or the like for heating. Alternatively, it may be a heating mechanism which uses heat conduction or heat radiation from a medium such as a heated gas for heating. For example, rapid thermal annealing (RTA), such as gas rapid thermal annealing (GRTA) or lamp rapid thermal annealing (LRTA), can be used. In LRTA, an object is heated by radiation of light (an electromagnetic wave) emitted from a lamp, such as a halogen lamp, a metal halide lamp, a xenon arc lamp, a carbon arc lamp, a high-pressure sodium lamp, or a high-pressure mercury lamp. In GRTA, heat treatment is performed using a high-temperature gas. As the gas, an inert gas is used.

The transfer chamber 4004 includes the substrate transfer robot 4103. The substrate transfer robot 4103 includes a plurality of movable portions and an arm for holding a substrate and can transfer a substrate to each chamber. Further, the transfer chamber 4004 is connected to a vacuum pump 4200 and a cryopump 4201 through valves. With such a structure, the transfer chamber 4004 is evacuated from the atmospheric pressure to a low or medium vacuum (about 0.1 Pa to several hundred pascals) by using the vacuum pump 4200 and then evacuated from the medium vacuum to a high or ultrahigh vacuum (0.1 Pa to $1\times10^{-7}$ Pa) by switching between the valves and using the cryopump 4201.

Alternatively, two or more cryopumps 4201 may connected in parallel to the transfer chamber 4004. With such a structure, even when one of the cryopumps is in regeneration, evacuation can be performed using any of the other cryopumps. Note that the above regeneration refers to treatment for discharging molecules (or atoms) trapped in the cryopump. When molecules (or atoms) are trapped too much in a cryopump, the evacuation capability of the cryopump is lowered; therefore, regeneration is performed regularly.

FIG. 20 shows a cross section of the deposition chamber 4006b, the transfer chamber 4004, and the load lock chamber 4003a. The load lock chamber 4003a includes a substrate delivery stage 4111.

Here, the details of the deposition chamber will be described with reference to FIG. 20. As the deposition chamber, a sputtering chamber, a plasma treatment chamber, or the like can be used as appropriate. Here, a description is given using a sputtering chamber as the deposition chamber. Note that the deposition chamber corresponds to the deposition chamber described in Embodiment 2. In the deposition chamber described in Embodiment 2, the sputtering target and the substrate are illustrated as being placed horizontally, whereas in the deposition chamber described in this embodiment, a sputtering target and a substrate are illustrated as being placed vertically.

The deposition chamber 4006b illustrated in FIG. 20 includes a sputtering target 4106, a deposition shield 4107, and a substrate stage 4108. Note that the substrate stage 4108 here is provided with a substrate 4109. Although not illustrated, the substrate stage 4108 may be provided with a substrate holding mechanism for holding the substrate 4109, a back side heater for heating the substrate 4109 from the back side, or the like.

A direct-current (DC) power source is preferably used as a power source for applying a voltage to a sputtering target. Alternatively, a radio frequency (RF) power source or an alternating-current (AC) power source can be used. However, in the case of using a sputtering method with an RF power source, uniform plasma discharge to a large area is difficult. Therefore, it is sometimes inappropriate to employ a sputtering method using an RF power source for deposition on a large-sized substrate. In addition, a DC power source is preferred to an AC power source from the following viewpoint.

In a sputtering method using a DC power source, a DC voltage is applied between a sputtering target and a substrate as illustrated in FIG. 21A1, for example. Accordingly, the difference in potential between the sputtering target and the substrate during the DC voltage application is constant as shown in FIG. 21B1. Thus, the sputtering method using a DC power source can maintain constant plasma discharge.

In contrast, in a sputtering method using an AC power source, a cathode and an anode switch between adjacent sputtering targets on the period basis (period A and period B) as illustrated in FIG. 21A2, for example. In period A in FIG. 21B2, for example, a sputtering target 1 functions as a cathode and a sputtering target 2 functions as an anode. Further, in period B in FIG. 21B2, for example, the sputtering target 1 functions as an anode and the sputtering target 2 functions as a cathode. The sum of period A and period B is approximately 20 microseconds to 50 microseconds, for example. Thus, in the sputtering method using an AC power source, plasma is discharged during alternating periods A and B.

Note that the substrate stage 4108 is held substantially vertically to a floor during deposition and is held substantially parallel to the floor when the substrate is delivered. In FIG. 20, the position where the substrate stage 4108 is held when the substrate is delivered is denoted by a dashed line. With such a structure, the probability that dust or a particle which might be mixed into a film during deposition is attached to the substrate 4109 can be lowered as compared to the case where the substrate stage 4108 is held parallel to the floor. However, there is a possibility that the substrate 4109 falls when the substrate stage 4108 is held vertically (90°) to the floor; therefore, the angle of the substrate stage 4108 to the floor is preferred to be greater than or equal to 80° and lower than 90°.

The deposition shield 4107 can prevent sputtered particles separated from the sputtering target 4106 from being deposited on a region where deposition is not necessary. Moreover, the deposition shield 4107 is preferably processed to prevent accumulated sputtered particles from being separated. For example, blasting treatment which increases surface roughness may be performed, or roughness may be formed on the surface of the deposition shield 4107.

The deposition chamber 4006b is connected to a mass flow controller 4300 via a gas heating mechanism 4302, and the gas heating mechanism 4302 is connected to a refiner 4301 via the mass flow controller 4300. With the gas heating mechanism 4302, gases to be introduced into the deposition chamber 4006b can be heated to a temperature higher than or equal to 40° C. and lower than or equal to 400° C., or higher than or equal to 50° C. and lower than or equal to 200° C. Note that although the gas heating mechanism 4302, the mass flow controller 4300, and the refiner 4301 can be provided for each of a plurality of kinds of gases, only one gas heating mechanism 4302, one mass flow controller 4300, and one refiner 4301 are provided for simplicity. As the gas introduced into the deposition chamber 4006b, a gas whose dew point is −80° C. or lower, −100° C. or lower, or −120° C. or lower can be used; for example, an oxygen gas, a nitrogen gas, and a rare gas (e.g., an argon gas) are used.

The deposition chamber 4006b is connected to a turbo molecular pump 4202 and a vacuum pump 4200 via valves.

In addition, the deposition chamber 4006b is provided with a cryotrap 4110.

The cryotrap 4110 is a mechanism which can adsorb a molecule (or an atom) having a relatively high melting point, such as water. The turbo molecular pump 4202 is capable of stably evacuating a large-sized molecule (or atom), needs low frequency of maintenance, and thus enables high productivity, whereas it has a low capability in evacuating hydrogen and water. Hence, the cryotrap 4110 is connected to the deposition chamber 4006b so as to have a high capability in evacuating water or the like. The temperature of a refrigerator of the cryotrap 4110 is 100 K or lower, or 80 K or lower. In the case where the cryotrap 4110 includes a plurality of refrigerators, it is preferable to set the temperatures of the refrigerators at different temperatures because efficient evacuation is possible. For example, the temperatures of a first-stage refrigerator and a second-stage refrigerator may be set to 100 K or lower and 20 K or lower, respectively.

Note that the evacuation method of the deposition chamber 4006b is not limited to the above, and a structure similar to that in the evacuation method described in the transfer chamber 4004 (the evacuation method using the cryopump and the vacuum pump) may be employed. Needless to say, the evacuation method of the transfer chamber 4004 may have a structure similar to that of the deposition chamber 4006b (the evacuation method using the turbo molecular pump and the vacuum pump).

Note that in each of the above transfer chamber 4004, the substrate heating chamber 4005, and the deposition chamber 4006b, the back pressure (total pressure) and the partial pressure of each gas molecule (atom) are preferably set as follows. In particular, the back pressure and the partial pressure of each gas molecule (atom) in the deposition chamber 4006b need to be noted because impurities might enter a film to be formed.

In each of the above chambers, the back pressure (total pressure) is less than or equal to $1\times10^{-4}$ Pa, less than or equal to $3\times10^{-5}$ Pa, or less than or equal to $1\times10^{-5}$ Pa. In each of the above chambers, the partial pressure of a gas molecule (atom) having a mass-to-charge ratio (m/z) of 18 is less than or equal to $3\times10^{-5}$ Pa, less than or equal to $1\times10^{-5}$ Pa, or less than or equal to $3\times10^{-6}$ Pa. Moreover, in each of the above chambers, the partial pressure of a gas molecule (atom) having a mass-to-charge ratio (m/z) of 28 is less than or equal to $3\times10^{-5}$ Pa, less than or equal to $1\times10^{-5}$ Pa, or less than or equal to $3\times10^{-6}$ Pa. Moreover, in each of the above chambers, the partial pressure of a gas molecule (atom) having a mass-to-charge ratio (m/z) of 44 is less than or equal to $3\times10^{-5}$ Pa, less than or equal to $1\times10^{-5}$ Pa, or less than or equal to $3\times10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. can be used.

Moreover, the above transfer chamber 4004, the substrate heating chamber 4005, and the deposition chamber 4006b preferably have a small amount of external leakage or internal leakage.

For example, in each of the above transfer chamber 4004, the substrate heating chamber 4005, and the deposition chamber 4006b, the leakage rate is less than or equal to $3\times10^{-6}$ Pa·m³/s, or less than or equal to $1\times10^{-6}$ Pa·m³/s. The leakage rate of a gas molecule (atom) having a mass-to-charge ratio (m/z) of 18 is less than or equal to $1\times10^{-7}$ Pa·m³/s, or less than or equal to $3\times10^{-8}$ Pa·m³/s. The leakage rate of a gas molecule (atom) having a mass-to-charge ratio (m/z) of 28 is less than or equal to $1\times10^{-5}$ Pa·m³/s, or less than or equal to $1\times10^{-6}$ Pa·m³/s. The leakage rate of a gas molecule (atom) having a mass-to-charge ratio (m/z) of 44 is less than or equal to $3\times10^{-6}$ Pa·m³/s, or less than or equal to $1\times10^{-6}$ Pa·m³/s.

Note that a leakage rate can be derived from the total pressure and partial pressure measured using the mass analyzer.

When an oxide film is formed with the use of the above deposition apparatus, the entry of impurities to the oxide film can be suppressed.

Embodiment 4

In this embodiment, a semiconductor device which is one embodiment of the present invention and a manufacturing method thereof are described with reference to drawings.

In a transistor including an oxide semiconductor film, oxygen vacancies are given as an example of a defect which leads to poor electrical characteristics of the transistor. For example, the threshold voltage of a transistor including an oxide semiconductor film which contains oxygen vacancies in the film easily shifts in the negative direction, and such a transistor tends to have normally-on characteristics. This is because electric charges are generated owing to oxygen vacancies in the oxide semiconductor film and the resistance is thus reduced. The transistor having normally-on characteristics causes various problems in that malfunction is likely to be caused when in operation and that power consumption is increased when not in operation, for example. Further, there is a problem in that the amount of change in electrical characteristics, typically in threshold voltage, of the transistor is increased by change over time or a stress test.

One of the factors in generating oxygen vacancies is damage caused in a manufacturing process of a transistor. For example, when an insulating film, a conductive film, or the like is formed over an oxide semiconductor film by a plasma CVD method or a sputtering method, the oxide semiconductor film might be damaged depending on formation conditions thereof.

Another factor in generating oxygen vacancies is release of oxygen from the oxide semiconductor film due to heat treatment. For example, there is a case where heat treatment is performed to remove impurities such as hydrogen, water, or the like contained in the oxide semiconductor film. When the heat treatment is performed with the oxide semiconductor film exposed, oxygen is released from the oxide semiconductor film, thereby forming an oxygen vacancy.

Further, not only oxygen vacancies but also impurities such as silicon or carbon which is a constituent element of the insulating film cause poor electrical characteristics of a transistor. Therefore, there is a problem in that mixing of the impurities into an oxide semiconductor film reduces the resistance of the oxide semiconductor film and the amount of change in electrical characteristics, typically in threshold voltage, of the transistor is increased by change over time or a stress test.

Thus, an object of this embodiment is to reduce oxygen vacancies in an oxide semiconductor film serving as a channel region and the concentration of impurities in the oxide semiconductor film, in a semiconductor device including a transistor having the oxide semiconductor film.

Meanwhile, there is a trend in a commercially available display device toward a larger screen, e.g., a 60-inch diagonal screen, and further, the development of a display device is aimed even at a screen size of a diagonal of 120 inches or more. Hence, a glass substrate for a display device has grown in size, e.g., to the 8th generation or more. However, in the case of using a large-sized substrate, because heat treatment is performed at high temperatures, e.g., at 450° C. or higher, an expensive, large-sized heating apparatus is needed. Accordingly, the manufacturing cost is increased. Further, high-temperature heat treatment causes a warp or a shrink of the substrate, which leads to a reduction in yield.

Thus, one object of this embodiment is to manufacture a semiconductor device using heat treatment at a temperature which allows the use of a large-sized substrate and using a small number of heat treatment steps.

Figure 22A:
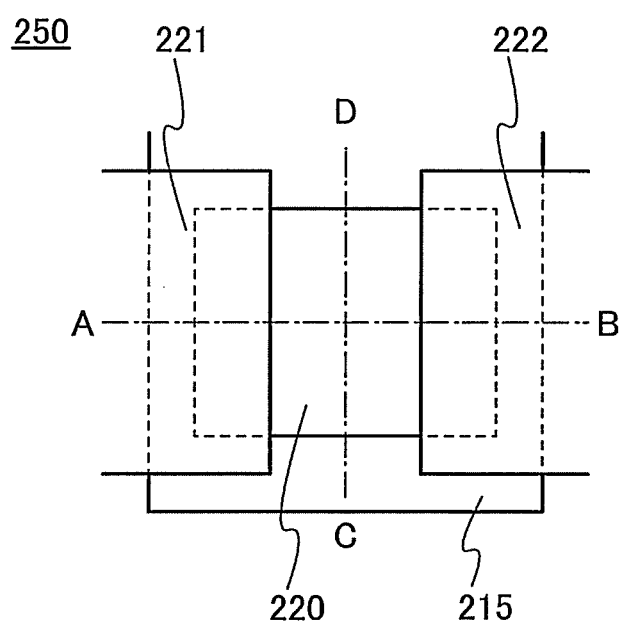
FIGS. 22A to 22C are a top view and cross-sectional views illustrating one embodiment of a transistor.
Figure 22C:
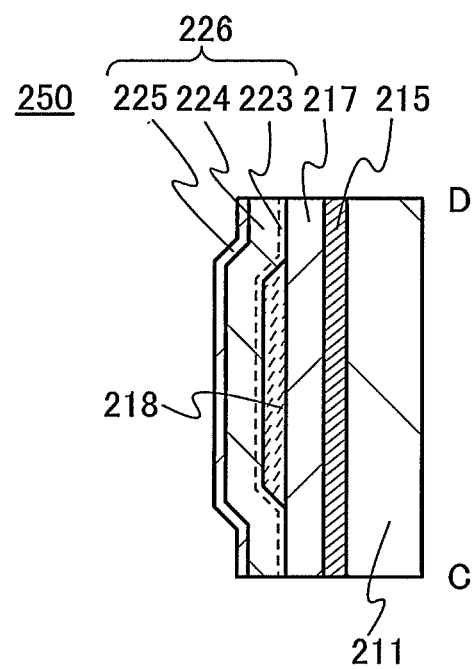
Figure 22B:
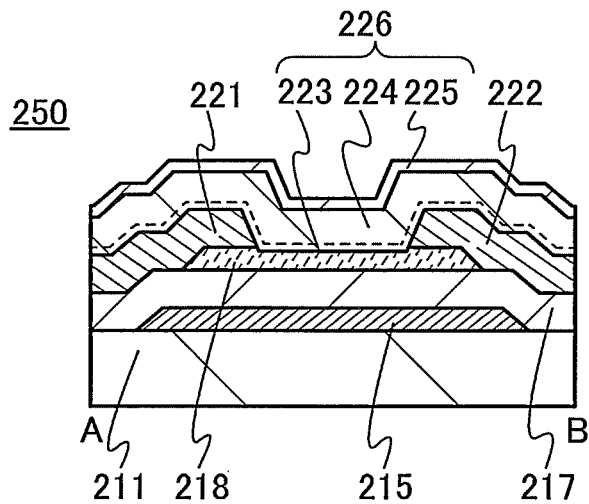

FIGS. 22A to 22C are a top view and cross-sectional views of a transistor 250 of a semiconductor device. The transistor 250 shown in FIGS. 22A to 22C is a channel-etched transistor. FIG. 22A is a top view of the transistor 250, FIG. 22B is a cross-sectional view taken along dashed-dotted line A-B in FIG. 22A, and FIG. 22C is a cross-sectional view taken along dashed-dotted line C-D in FIG. 22A. Note that in FIG. 22A, a substrate 211, one or more of components of the transistor 250 (e.g., a gate insulating film 217), an oxide insulating film 223, an oxide insulating film 224, a nitride insulating film 225, and the like are not illustrated for clarity.

The transistor 250 shown in FIGS. 22B and 22C includes a gate electrode 215 provided over the substrate 211. Moreover, the gate insulating film 217 over the substrate 211 and the gate electrode 215, an oxide semiconductor film 218 overlapping with the gate electrode 215 with the gate insulating film 217 provided therebetween, and a pair of electrodes 221 and 222 being in contact with the oxide semiconductor film 218 are included. Furthermore, a protective film 226 including the oxide insulating film 223, the oxide insulating film 224, and the nitride insulating film 225 is formed over the gate insulating film 217, the oxide semiconductor film 218, and the pair of electrodes 221 and 222.

The transistor 250 described in this embodiment includes the oxide semiconductor film 218. Further, part of the oxide semiconductor film 218 serves as a channel region. Furthermore, the oxide insulating film 223 is formed in contact with the oxide semiconductor film 218, and the oxide insulating film 224 is formed in contact with the oxide insulating film 223.

The oxide semiconductor film 218 is typically an In-M-Zn oxide film (M represents Al, Ti, Ga, Y, Zr, La, Cs, Nd, or Hf).

It is preferable that the atomic ratio of metal elements of a sputtering target used for forming a film of the In-M-Zn oxide satisfy In M and Zn M. As the atomic ratio of metal elements of such a sputtering target, In:M:Zn=1:1:1 and In:M:Zn=3:1:2 are preferable.

In the case where the oxide semiconductor film 218 is an In-M-Zn oxide film, the proportions of In and M when summation of In and M is assumed to be 100 atomic % are preferably as follows: the atomic percentage of In is greater than or equal to 25 atomic % and the atomic percentage of M is less than 75 atomic %, or the atomic percentage of In is greater than or equal to 34 atomic % and the atomic percentage of M is less than 66 atomic %.

The energy gap of the oxide semiconductor film 218 is 2 eV or more, 2.5 eV or more, or 3 eV or more. With the use of an oxide semiconductor having such a wide energy gap, the off-state current of the transistor 250 can be reduced.

The thickness of the oxide semiconductor film 218 is greater than or equal to 3 nm and less than or equal to 200 nm, greater than or equal to 3 nm and less than or equal to 100 nm, or greater than or equal to 3 nm and less than or equal to 50 nm.

The oxide semiconductor film 218 is preferably formed using the sputtering target described in Embodiment 1, and typically, a sputtering target with an atomic ratio of In:M:Zn=1:1:1.05 to 1:1:1.5 can be used. Note that the atomic ratio of M to In and the atomic ratio of Zn to In in the oxide semiconductor film 218 formed using such a sputtering target are lower than those in the sputtering target.

An In—Ga—Zn oxide film formed using such a sputtering target has a homologous structure.

An oxide semiconductor film with low carrier density is used as the oxide semiconductor film 218. For example, an oxide semiconductor film whose carrier density is $1\times10^{17}/cm^3$ or lower, $1\times10^{15}/cm^3$ or lower, $1\times10^{13}/cm^3$ or lower, or $1\times10^{11}/cm^3$ or lower is used as the oxide semiconductor film 218.

Note that, without limitation to that described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 218 be set to be appropriate.

Note that it is preferable to use, as the oxide semiconductor film 218, an oxide semiconductor film in which the impurity concentration is low and the density of defect states is low, in which case the transistor can have more excellent electrical characteristics. Further, a highly purified intrinsic or substantially highly purified intrinsic oxide semiconductor film has an extremely low off-state current; even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases.

Hydrogen contained in the oxide semiconductor film reacts with oxygen bonded to a metal atom to form water, and in addition, an oxygen vacancy is formed in a lattice from which oxygen is released (or a portion from which oxygen is released). Due to entry of hydrogen into the oxygen vacancy, an electron serving as a carrier is generated in some cases. Further, in some cases, bonding of part of hydrogen to oxygen bonded to a metal element causes generation of an electron serving as a carrier. Thus, a transistor including an oxide semiconductor which contains hydrogen is likely to be normally on.

Accordingly, it is preferable that hydrogen be reduced as much as possible in the oxide semiconductor film 218. Specifically, the hydrogen concentration of the oxide semiconductor film 218, which is measured by secondary ion mass spectrometry (SIMS), is lower than or equal to $5\times10^{19}$ atoms/cm$^3$, lower than or equal to $1\times10^{19}$ atoms/cm$^3$, lower than or equal to $5\times10^{18}$ atoms/cm$^3$, lower than or equal to $1\times10^{18}$ atoms/cm$^3$, lower than or equal to $5\times10^{17}$ atoms/cm$^3$, or lower than or equal to $1\times10^{16}$ atoms/cm$^3$.

When silicon or carbon which is one of elements belonging to Group 14 is contained in the oxide semiconductor film 218, oxygen vacancies are increased, and the oxide semiconductor film 218 becomes an n-type film. Thus, the concentration of silicon or carbon (the concentration is measured by SIMS) of the oxide semiconductor film 218 is lower than or equal to $2\times10^{18}$ atoms/cm$^3$, or lower than or equal to $2\times10^{17}$ atoms/cm$^3$.

Further, the concentration of alkali metal or alkaline earth metal of the oxide semiconductor film 218, which is measured by SIMS, is lower than or equal to $1\times10^{18}$ atoms/cm$^3$, or lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 218.

Further, when containing nitrogen, the oxide semiconductor film 218 easily has n-type conductivity by generation of electrons serving as carriers and an increase of carrier density. Thus, a transistor including an oxide semiconductor which contains nitrogen is likely to be normally on. For this reason, nitrogen in the oxide semiconductor film is preferably reduced as much as possible; the concentration of nitrogen which is measured by SIMS is preferably set to, for example, lower than or equal to $5\times10^{18}$ atoms/cm$^3$.

The oxide semiconductor film 218 is formed according to the deposition model described in Embodiment 2. The oxide semiconductor film 218 may have a non-single-crystal structure. Non-single-crystal structures include the c-axis aligned crystalline oxide semiconductor (CAAC-OS), the polycrystalline structure, and the microcrystalline structure which are described in Embodiment 2, and an amorphous structure, for example. Among the non-single-crystal structures, the amorphous structure has the highest density of defect states, whereas CAAC-OS has the lowest density of defect states. Therefore, the oxide semiconductor film 218 is preferably CAAC-OS.

Note that the oxide semiconductor film 218 may be a mixed film including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure including, for example, two or more of a region having an amorphous structure, a region having a microcrystalline structure, a region having a polycrystalline structure, a CAAC-OS region, and a region having a single-crystal structure in some cases.

Furthermore, in the transistor 250 described in this embodiment, the oxide insulating film 223 is formed in contact with the oxide semiconductor film 218, and the oxide insulating film 224 in contact with the oxide insulating film 223 is formed.

The oxide insulating film 223 is an oxide insulating film which is permeable to oxygen. Note that the oxide insulating film 223 also serves as a film which relieves damage to the oxide semiconductor film 218 at the time of forming the oxide insulating film 224 later.

A silicon oxide film, a silicon oxynitride film, or the like with a thickness greater than or equal to 5 nm and less than or equal to 150 nm, or greater than or equal to 5 nm and less than or equal to 50 nm can be used as the oxide insulating film 223. Note that in this specification, a "silicon oxynitride film" refers to a film that contains oxygen at a higher proportion than nitrogen, and a "silicon nitride oxide film" refers to a film that contains nitrogen at a higher proportion than oxygen.

Further, it is preferable that the amount of defects in the oxide insulating film 223 be small, typically the spin density corresponding to a signal which appears at g=2.001 due to a dangling bond of silicon, be lower than or equal to $3\times10^{17}$ spins/cm$^3$ by ESR measurement. This is because if the density of defects in the oxide insulating film 223 is high, oxygen is bonded to the defects and the amount of oxygen that permeates the oxide insulating film 223 is decreased.

Further, it is preferable that the amount of defects at the interface between the oxide insulating film 223 and the oxide semiconductor film 218 be small, typically the spin density corresponding to a signal which appears at g=1.93 due to an oxygen vacancy in the oxide semiconductor film 218 be lower than or equal to $1\times10^{17}$ spins/cm$^3$, more preferably lower than or equal to the lower limit of detection by ESR measurement.

The oxide insulating film 224 is formed in contact with the oxide insulating film 223. The oxide insulating film 224 is formed using an oxide insulating film which contains oxygen at a higher proportion than the stoichiometric composition. Part of oxygen is released by heating from the oxide insulating film which contains oxygen at a higher proportion than the stoichiometric composition. The oxide insulating film containing oxygen at a higher proportion than the stoichiometric composition is an oxide insulating film of which the amount of released oxygen converted into oxygen atoms is greater than or equal to $1.0\times10^{18}$ atoms/cm$^3$, or greater than or equal to $3.0\times10^{20}$ atoms/cm$^3$ in TDS analysis.

A silicon oxide film, a silicon oxynitride film, or the like with a thickness greater than or equal to 30 nm and less than or equal to 500 nm, or greater than or equal to 50 nm and less than or equal to 400 nm can be used as the oxide insulating film 224.

Further, it is preferable that the amount of defects in the oxide insulating film 224 be small, typically the spin density corresponding to a signal which appears at g=2.001 due to a dangling bond of silicon, be lower than $1.5\times10^{18}$ spins/cm$^3$, more preferably lower than or equal to $1\times10^{18}$ spins/cm$^3$ by ESR measurement. Note that the oxide insulating film 224 is provided more apart from the oxide semiconductor film 218 than the oxide insulating film 223 is; thus, the oxide insulating film 224 may have higher defect density than the oxide insulating film 223.

Other details of the transistor 250 are described below.

There is no particular limitation on a material and the like of the substrate 211 as long as the material has heat resistance high enough to withstand at least heat treatment performed later. For example, a glass substrate, a ceramic substrate, a quartz substrate, or a sapphire substrate may be used as the substrate 211. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used. Still alternatively, any of these substrates provided with a semiconductor element may be used as the substrate 211. In the case where a glass substrate is used as the substrate 211, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 211, and the transistor 250 may be provided directly on the flexible substrate. Alternatively, a separation layer may be provided between the substrate 211 and the transistor 250. The separation layer can be used when part or the whole of a semiconductor device formed over the separation layer is completed and separated from the substrate 211 and transferred to another substrate. In such a case, the transistor 250 can be transferred to a substrate having low heat resistance or a flexible substrate as well.

The gate electrode 215 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese and zirconium may be used. The gate electrode 215 may have a single-layer structure or a stacked structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The gate electrode 215 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

The gate insulating film 217 can be formed to have a single-layer structure or a stacked-layer structure using, for example, any of silicon oxide, silicon oxynitride, silicon nitride oxide, silicon nitride, aluminum oxide, hafnium oxide, gallium oxide, Ga—Zn-based metal oxide, and the like.

The gate insulating film 217 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

The thickness of the gate insulating film 217 is greater than or equal to 5 nm and less than or equal to 400 nm, greater than or equal to 10 nm and less than or equal to 300 nm, or greater than or equal to 50 nm and less than or equal to 250 nm.

The pair of electrodes 221 and 222 is formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

Further, it is possible to prevent outward diffusion of oxygen from the oxide semiconductor film 218 and entry of hydrogen, water, or the like into the oxide semiconductor film 218 from the outside by providing the nitride insulating film 225 having a blocking effect against oxygen, hydrogen, water, alkali metal, alkaline earth metal, and the like over the oxide insulating film 224. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, aluminum oxide, aluminum oxynitride, gallium oxide, gallium oxynitride, yttrium oxide, yttrium oxynitride, hafnium oxide, and hafnium oxynitride can be given.

Next, a method for manufacturing the transistor 250 illustrated in FIGS. 22A to 22C is described with reference to FIGS. 23A to 23D.

Figure 23A:
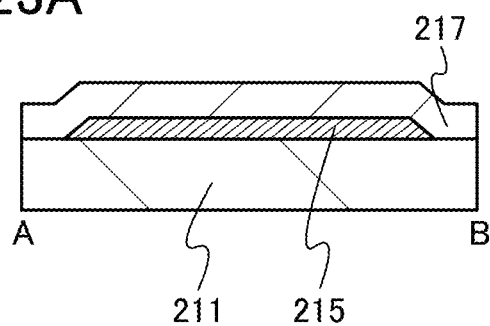
FIGS. 23A to 23D are cross-sectional views illustrating one embodiment of a transistor.

As illustrated in FIG. 23A, the gate electrode 215 is formed over the substrate 211, and the gate insulating film 217 is formed over the gate electrode 215.

Here, a glass substrate is used as the substrate 211.

A method for forming the gate electrode 215 is described below. First, a conductive film is formed by a sputtering method, a CVD method, an evaporation method, or the like. Then, a mask is formed over the conductive film by a photolithography process. Next, part of the conductive film is etched with the use of the mask to form the gate electrode 215. After that, the mask is removed.

Note that the gate electrode 215 may be formed by an electrolytic plating method, a printing method, an inkjet method, or the like instead of the above formation method.

Here, a 100-nm-thick tungsten film is formed by a sputtering method. Next, a mask is formed by a photolithography process, and the tungsten film is subjected to dry etching with the use of the mask to form the gate electrode 215.

The gate insulating film 217 is formed by a sputtering method, a CVD method, an evaporation method, or the like.

Moreover, in the case of forming a gallium oxide film as the gate insulating film 217, a metal organic chemical vapor deposition (MOCVD) method can be employed.

Here, the gate insulating film 217 is formed by stacking a 400-nm-thick silicon nitride film and a 50-nm-thick silicon oxynitride film by a plasma CVD method.

Figure 23B:
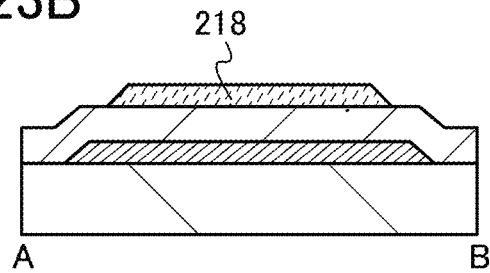

Next, as illustrated in FIG. 23B, the oxide semiconductor film 218 is formed over the gate insulating film 217.

A formation method of the oxide semiconductor film 218 is described below. An oxide semiconductor film which is to be the oxide semiconductor film 218 is formed over the gate insulating film 217. Then, after a mask is formed over the oxide semiconductor film by a photolithography process, the oxide semiconductor film is partly etched using the mask. Thus, the oxide semiconductor film 218 which is over the gate insulating film 217 and subjected to element isolation so as to partly overlap with the gate electrode 215 is formed as illustrated in FIG. 23B. After that, the mask is removed.

The oxide semiconductor film which is to be the oxide semiconductor film 218 can be formed by a sputtering method, a coating method, a pulsed laser deposition method, a laser ablation method, or the like.

Here, the oxide semiconductor film is formed by a sputtering method using the deposition apparatus described in Embodiment 3 which includes a sputtering chamber as a deposition chamber. In the sputtering chamber, a sputtering target manufactured in accordance with Embodiment 1 is placed.

As a sputtering gas, a rare gas (typically argon), an oxygen gas, or a mixed gas of a rare gas and oxygen is used as appropriate. In the case of using the mixed gas of a rare gas and oxygen, the proportion of oxygen is preferably higher than that of a rare gas.

In order to obtain a highly purified intrinsic or substantially highly purified intrinsic oxide semiconductor film, it is necessary to highly purify a sputtering gas as well as to evacuate the chamber to a high vacuum. As an oxygen gas or an argon gas used for a sputtering gas, a gas which is highly purified to have a dew point of −40° C. or lower, −80° C. or lower, −100° C. or lower, or −120° C. or lower is used, whereby entry of moisture or the like into the oxide semiconductor film can be minimized.

Here, a 35-nm-thick In—Ga—Zn oxide film is formed as the oxide semiconductor film by a sputtering method using a sputtering target with an atomic ratio of In:Ga:Zn=1:1:1.05. Next, a mask is formed over the oxide semiconductor film, and part of the oxide semiconductor film is selectively etched. Thus, the oxide semiconductor film 218 is formed.

Figure 23C:
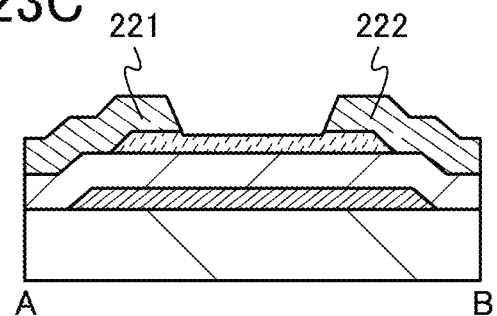

Next, the pair of electrodes 221 and 222 is formed as illustrated in FIG. 23C.

A method for forming the pair of electrodes 221 and 222 is described below. First, a conductive film is formed by a sputtering method, a CVD method, an evaporation method, or the like. Then, a mask is formed over the conductive film by a photolithography process. Next, the conductive film is etched with the use of the mask to form the pair of electrodes 221 and 222. After that, the mask is removed.

Here, a 50-nm-thick tungsten film, a 400-nm-thick aluminum film, and a 100-nm-thick titanium film are sequentially stacked by a sputtering method. Next, a mask is formed over the titanium film by a photolithography process and the tungsten film, the aluminum film, and the titanium film are dry-etched with use of the mask to form the pair of electrodes 221 and 222.

Figure 23D:
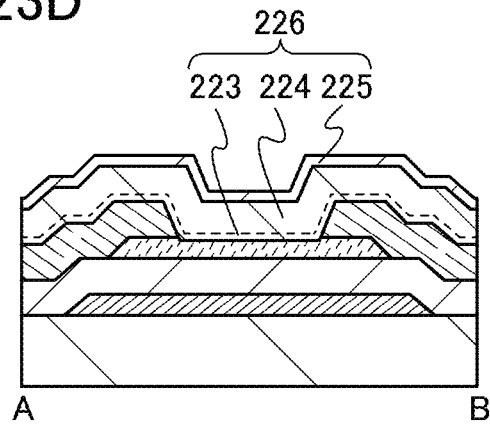

Next, as shown in FIG. 23D, the oxide insulating film 223 is formed over the oxide semiconductor film 218 and the pair of electrodes 221 and 222. Next, the oxide insulating film 224 is formed over the oxide insulating film 223.

As the oxide insulating film 223, a silicon oxide film or a silicon oxynitride film can be formed under the following conditions: the substrate placed in a treatment chamber of a plasma CVD apparatus that is vacuum-evacuated is held at a temperature higher than or equal to 280° C. and lower than or equal to 400° C., the pressure is greater than or equal to 20 Pa and less than or equal to 250 Pa, or greater than or equal to 100 Pa and less than or equal to 250 Pa with introduction of a source gas into the treatment chamber, and a high-frequency power is supplied to an electrode provided in the treatment chamber.

A deposition gas containing silicon and an oxidizing gas are preferably used as the source gas of the oxide insulating film 223. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

With the use of the above conditions, an oxide insulating film which is permeable to oxygen can be formed as the oxide insulating film 223. Further, by providing the oxide insulating film 223, damage to the oxide semiconductor film 218 can be reduced in a step of forming the oxide insulating film 224 which is formed later. Consequently, the amount of oxygen vacancies in the oxide semiconductor film can be reduced.

Under the above film formation conditions, the bonding strength of silicon and oxygen becomes strong in the above substrate temperature range. Thus, as the oxide insulating film 223, a dense and hard oxide insulating film which is permeable to oxygen, typically, a silicon oxide film or a silicon oxynitride film of which etching using hydrofluoric acid of 0.5 wt % at 25° C. is performed at a rate of lower than or equal to 10 nm/min, or lower than or equal to 8 nm/min can be formed.

Here, as the oxide insulating film 223, a 50-nm-thick silicon oxynitride film is formed by a plasma CVD method in which silane with a flow rate of 30 sccm and dinitrogen monoxide with a flow rate of 4000 sccm are used as a source gas, the pressure in the treatment chamber is 200 Pa, the substrate temperature is 220° C., and a high-frequency power of 150 W is supplied to parallel-plate electrodes with the use of a 27.12 MHz high-frequency power source. Under the above conditions, a silicon oxynitride film which is permeable to oxygen can be formed.

As the oxide insulating film 224, a silicon oxide film or a silicon oxynitride film is formed under the following conditions: the substrate placed in a treatment chamber of the plasma CVD apparatus that is vacuum-evacuated is held at a temperature higher than or equal to 180° C. and lower than or equal to 280° C., or higher than or equal to 200° C. and lower than or equal to 240° C., the pressure is greater than or equal to 100 Pa and less than or equal to 250 Pa, or greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, or greater than or equal to 0.25 W/cm$^2$ and less than or equal to 0.35 W/cm$^2$ is supplied to an electrode provided in the treatment chamber.

A deposition gas containing silicon and an oxidizing gas are preferably used as the source gas of the oxide insulating film 224. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

Here, as the oxide insulating film 224, a 400-nm-thick silicon oxynitride film is formed by a plasma CVD method in which silane with a flow rate of 200 sccm and dinitrogen monoxide with a flow rate of 4000 sccm are used as the source gas, the pressure in the treatment chamber is 200 Pa, the substrate temperature is 220° C., and the high-frequency power of 1500 W is supplied to the parallel-plate electrodes with the use of a 27.12 MHz high-frequency power source. Note that a plasma CVD apparatus used here is a parallel-plate plasma CVD apparatus in which the electrode area is 6000 cm$^2$, and the power per unit area (power density) into which the supplied power is converted is 0.25 W/cm$^2$.

Next, heat treatment is performed. The heat treatment is performed typically at a temperature of higher than or equal to 250° C. and lower than the strain point of the substrate, higher than or equal to 300° C. and lower than or equal to 550° C., or higher than or equal to 350° C. and lower than or equal to 510° C.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

The heat treatment may be performed under an atmosphere of nitrogen, oxygen, ultra-dry air (air with a water content of 20 ppm or less, 1 ppm or less, or 10 ppb or less), or a rare gas (argon, helium, or the like). The atmosphere of nitrogen, oxygen, ultra-dry air, or a rare gas preferably does not contain hydrogen, water, and the like.

Note that as a heat treatment apparatus used for the heat treatment, the heating mechanism provided in the substrate heating chamber 4005 described in Embodiment 3 can be used as appropriate.

By the heat treatment, part of oxygen contained in the oxide insulating film 224 can be moved to the oxide semiconductor film 218, so that the amount of oxygen vacancies contained in the oxide semiconductor film 218 can be further reduced.

Further, in the case where water, hydrogen, or the like is contained in the oxide insulating film 223 and the oxide insulating film 224, when the nitride insulating film 225 having a function of blocking water, hydrogen, and the like is formed later and heat treatment is performed, water, hydrogen, or the like contained in the oxide insulating film 223 and the oxide insulating film 224 is moved to the oxide semiconductor film 218, so that defects are generated in the oxide semiconductor film 218. However, by the heating, water, hydrogen, or the like contained in the oxide insulating film 223 and the oxide insulating film 224 can be released; thus, variation in electrical characteristics of the transistor 250 can be reduced, and change in threshold voltage can be inhibited.

Note that when the oxide insulating film 224 is formed over the oxide insulating film 223 while being heated, oxygen can be moved to the oxide semiconductor film 218; thus, the heat treatment is not necessarily performed.

Here, heat treatment is performed at 350° C. for one hour in an atmosphere of nitrogen and oxygen.

Next, the nitride insulating film 225 is formed by a sputtering method, a CVD method, or the like.

Note that in the case where the nitride insulating film 225 is formed by a plasma CVD method, the substrate placed in the treatment chamber of the plasma CVD apparatus that is vacuum-evacuated is preferably set to be higher than or equal to 300° C. and lower than or equal to 400° C., more preferably, higher than or equal to 320° C. and lower than or equal to 370° C., so that a dense nitride insulating film can be formed.

Here, in the treatment chamber of a plasma CVD apparatus, a 50-nm-thick silicon nitride film is formed by a plasma CVD method in which silane with a flow rate of 50 sccm, nitrogen with a flow rate of 5000 sccm, and ammonia with a flow rate of 100 sccm are used as the source gas, the pressure in the treatment chamber is 100 Pa, the substrate temperature is 350° C., and high-frequency power of 1000 W is supplied to parallel-plate electrodes with the use of a 27.12 MHz high-frequency power source. Note that the plasma CVD apparatus is a parallel-plate plasma CVD apparatus in which the electrode area is 6000 cm$^2$, and the power per unit area (power density) into which the supplied power is converted is $1.7 \times 10^{-1}$ W/cm$^2$.

By the above-described steps, the protective film 226 including the oxide insulating film 223, the oxide insulating film 224, and the nitride insulating film 225 can be formed.

Next, heat treatment may be performed. The heat treatment is performed typically at a temperature of higher than or equal to 300° C. and lower than or equal to 400° C., or higher than or equal to 320° C. and lower than or equal to 370° C.

Through the above-described process, the transistor 250 can be manufactured.

From the above, as for a semiconductor device including an oxide semiconductor film, a semiconductor device in which the amount of defects is reduced can be obtained. Further, as for a semiconductor device including an oxide semiconductor film, a semiconductor device with improved electrical characteristics can be obtained.

Modification Example 1: Regarding Base Insulating Film

In the transistor 250 described in this embodiment, a base insulating film can be provided between the substrate 211 and the gate electrode 215 as necessary. As a material of the base insulating film, silicon oxide, silicon oxynitride, silicon nitride, silicon nitride oxide, gallium oxide, hafnium oxide, yttrium oxide, aluminum oxide, aluminum oxynitride, and the like can be given as examples. Note that when silicon nitride, gallium oxide, hafnium oxide, yttrium oxide, aluminum oxide, or the like is used as a material of the base insulating film, it is possible to suppress diffusion of impurities such as alkali metal, water, and hydrogen into the oxide semiconductor film 218 from the substrate 211.

The base insulating film can be formed by a sputtering method, a CVD method, or the like.

Modification Example 2: Regarding Gate Insulating Film

In the transistor 250 described in this embodiment, the gate insulating film 217 can have a stacked-layer structure as necessary.

The gate insulating film 217 can have a stacked-layer structure in which a nitride insulating film and an oxide insulating film are stacked in that order from the gate electrode 215 side. When the nitride insulating film is provided on the gate electrode 215 side, an impurity, typically hydrogen, nitrogen, alkali metal, alkaline earth metal, or the like, can be prevented from moving from the gate electrode 215 to the oxide semiconductor film 218.

Further, when the oxide insulating film is provided on the oxide semiconductor film 218 side, density of defect states at the interface between the gate insulating film 217 and the oxide semiconductor film 218 can be reduced. Consequently, a transistor whose electrical characteristics are hardly degraded can be obtained. Note that it is preferable to form, as the oxide insulating film, an oxide insulating film containing oxygen at a higher proportion than the stoichiometric composition like the oxide insulating film 224. This is because density of defect states at the interface between the gate insulating film 217 and the oxide semiconductor film 218 can be further reduced.

The gate insulating film 217 can have a stacked-layer structure in which a nitride insulating film with few defects, a nitride insulating film with a high blocking property against hydrogen, and an oxide insulating film are stacked in that order from the gate electrode 215 side. When the nitride insulating film with few defects is provided in the gate insulating film 217, the withstand voltage of the gate insulating film 217 can be improved. Further, when the nitride insulating film with a high blocking property against hydrogen is provided, hydrogen can be prevented from moving from the gate electrode 215 and the nitride insulating film with few defects to the oxide semiconductor film 218.

The gate insulating film 217 can have a stacked-layer structure in which a nitride insulating film with a high blocking property against an impurity, the nitride insulating film with few defects, the nitride insulating film with a high blocking property against hydrogen, and the oxide insulating film are stacked in that order from the gate electrode 215 side. When the nitride insulating film with a high blocking property against an impurity is provided in the gate insulating film 217, an impurity, typically hydrogen, nitrogen, alkali metal, alkaline earth metal, or the like, can be prevented from moving from the gate electrode 215 to the oxide semiconductor film 218.

Modification Example 3: Regarding Pair of Electrodes

Figure 24:
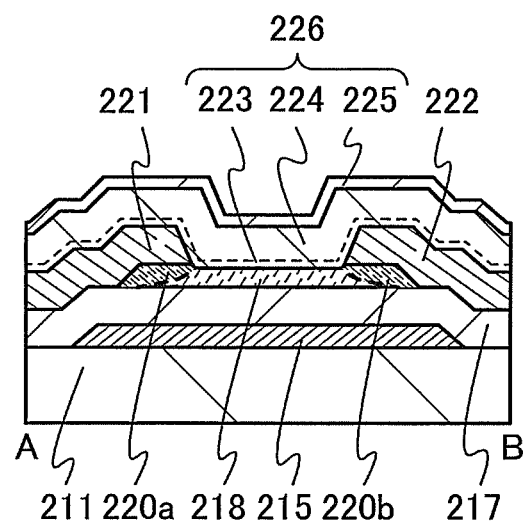
FIG. 24 is a cross-sectional view illustrating one embodiment of a transistor.

As for the pair of electrodes 221 and 222 provided in the transistor 250 described in this embodiment, it is preferable to use a conductive material which is easily bonded to oxygen, such as tungsten, titanium, aluminum, copper, molybdenum, chromium, or tantalum, or an alloy thereof. Thus, oxygen contained in the oxide semiconductor film 218 and the conductive material contained in the pair of electrodes 221 and 222 are bonded to each other, so that an oxygen deficient region is formed in the oxide semiconductor film 218. Further, in some cases, part of constituent elements of the conductive material that forms the pair of electrodes 221 and 222 is mixed into the oxide semiconductor film 218. Consequently, as shown in FIG. 24, low-resistance regions 220a and 220b are formed in the vicinity of regions of the oxide semiconductor film 218 which are in contact with the pair of electrodes 221 and 222. The low-resistance regions 220a and 220b are formed between the gate insulating film 217 and the pair of electrodes 221 and 222 so as to be in contact with the pair of electrodes 221 and 222. Since the low-resistance regions 220a and 220b have high conductivity, contact resistance between the oxide semiconductor film 218 and the pair of electrodes 221 and 222 can be reduced, and thus, the on-state current of the transistor can be increased.

Modification Example 4: Regarding Oxide Semiconductor Film

In the method for manufacturing the transistor 250 described in this embodiment, after the pair of electrodes 221 and 222 is formed, the oxide semiconductor film 218 may be exposed to plasma generated in an oxygen atmosphere, so that oxygen may be supplied to the oxide semiconductor film 218. Atmospheres of oxygen, ozone, dinitrogen monoxide, nitrogen dioxide, and the like can be given as examples of oxidizing atmospheres. Further, in the plasma treatment, the oxide semiconductor film 218 is preferably exposed to plasma generated with no bias applied to the substrate 211 side. Consequently, the oxide semiconductor film 218 can be supplied with oxygen without being damaged; accordingly, the amount of oxygen vacancies in the oxide semiconductor film 218 can be reduced. Moreover, impurities, e.g., halogen such as fluorine or chlorine remaining on the surface of the oxide semiconductor film 218 due to the etching treatment can be removed.

Note that the structures, methods, and the like described in this embodiment can be used as appropriate in combination with any of the structures, methods, and the like described in other embodiments, modification examples thereof, and examples.

Embodiment 5

In this embodiment, a semiconductor device having a transistor in which the amount of defects in an oxide semiconductor film can be further reduced as compared to Embodiment 4 is described with reference to drawings. The transistor described in this embodiment is different from that in Embodiment 4 in that a multilayer film having an oxide semiconductor film and oxide in contact with the oxide semiconductor film is included.

Figure 25A:
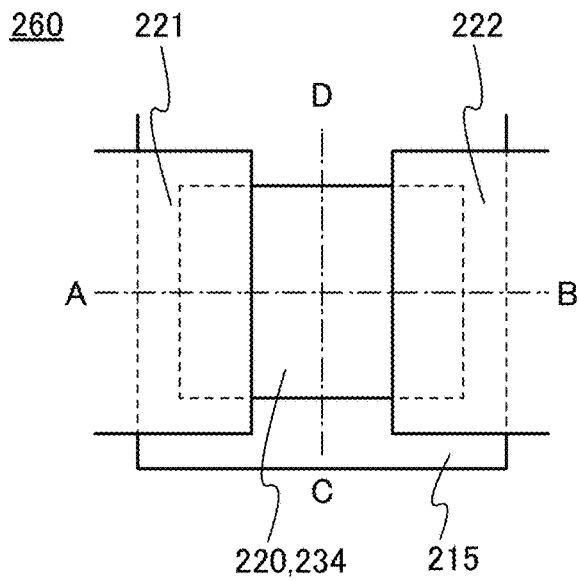
FIGS. 25A to 25D are a top view and cross-sectional views illustrating embodiments of transistors.
Figure 25C:
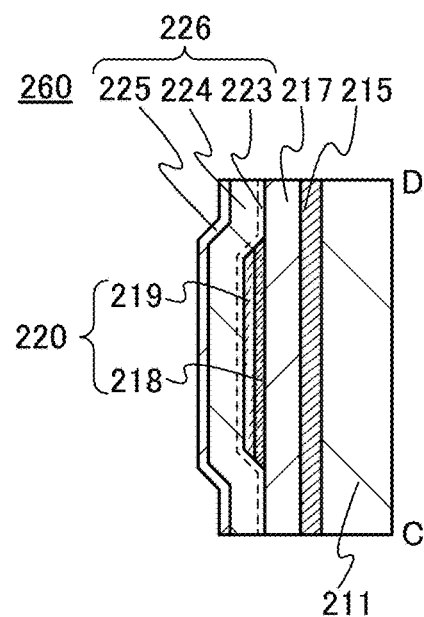
Figure 25B:
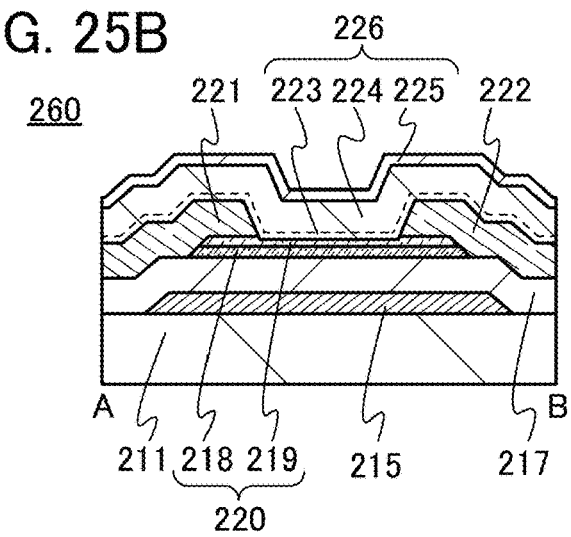

FIGS. 25A to 25C are a top view and cross-sectional views of a transistor 260 included in the semiconductor device. FIG. 25A is a top view of the transistor 260, FIG. 25B is a cross-sectional view taken along dashed-dotted line A-B in FIG. 25A, and FIG. 25C is a cross-sectional view taken along dashed-dotted line C-D in FIG. 25A. Note that in FIG. 25A, the substrate 211, one or more of components of the transistor 260 (e.g., the gate insulating layer 217), the oxide insulating film 223, the oxide insulating film 224, the nitride insulating film 225, and the like are not illustrated for clarity.

The transistor 260 shown in FIGS. 25A to 25C includes a multilayer film 220 overlapping with the gate electrode 215 with the gate insulating film 217 provided therebetween, and the pair of electrodes 221 and 222 in contact with the multilayer film 220. Furthermore, the protective film 226 including the oxide insulating film 223, the oxide insulating film 224, and the nitride insulating film 225 is formed over the gate insulating film 217, the multilayer film 220, and the pair of electrodes 221 and 222.

In the transistor 260 described in this embodiment, the multilayer film 220 includes the oxide semiconductor film 218 and the oxide film 219. That is, the multilayer film 220 has a two-layer structure. Further, part of the oxide semiconductor film 218 serves as a channel region. Furthermore, the oxide insulating film 223 is formed in contact with the multilayer film 220, and the oxide insulating film 224 is formed in contact with the oxide insulating film 223. That is, the oxide film 219 is provided between the oxide semiconductor film 218 and the oxide insulating film 223.

The oxide film 219 is an oxide film containing one or more elements which form the oxide semiconductor film 218. Since the oxide film 219 contains one or more elements which form the oxide semiconductor film 218, interface scattering is unlikely to occur at the interface between the oxide semiconductor film 218 and the oxide film 219. Thus, the transistor can have a high field-effect mobility because the movement of carriers is not hindered at the interface.

The oxide film 219 is typically In—Ga oxide, In—Zn oxide, or In-M-Zn oxide (M represents Al, Ti, Ga, Y, Zr, La, Cs, Nd, or Hf). The energy at the conduction band bottom of the oxide film 219 is closer to a vacuum level than that of the oxide semiconductor film 218 is, and typically, the difference between the energy at the conduction band bottom of the oxide film 219 and the energy at the conduction band bottom of the oxide semiconductor film 218 is any one of 0.05 eV or more, 0.07 eV or more, 0.1 eV or more, and 0.15 eV or more, and any one of 2 eV or less, 1 eV or less, 0.5 eV or less, and 0.4 eV or less. That is, the difference between the electron affinity of the oxide film 219 and the electron affinity of the oxide semiconductor film 218 is any one of 0.05 eV or more, 0.07 eV or more, 0.1 eV or more, and 0.15 eV or more, and any one of 2 eV or less, 1 eV or less, 0.5 eV or less, and 0.4 eV or less.

The oxide film 219 preferably contains In because carrier mobility (electron mobility) can be increased.

When the oxide film 219 contains a larger amount of Al, Ti, Ga, Y, Zr, La, Cs, Nd, or Hf in an atomic ratio than the amount of In in an atomic ratio, any of the following effects may be obtained:
(1) the energy gap of the oxide film 219 is widened;
(2) the electron affinity of the oxide film 219 decreases;
(3) an impurity from the outside is blocked;
(4) an insulating property increases as compared to the oxide semiconductor film 218; and
(5) oxygen vacancies are less likely to be generated in the oxide film 219 containing a larger amount of Al, Ti, Ga, Y, Zr, La, Cs, Nd, or Hf in an atomic ratio than the amount of In in an atomic ratio because Al, Ti, Ga, Y, Zr, La, Cs, Nd, or Hf is a metal element which is strongly bonded to oxygen.

In the case where the oxide film 219 is an In-M-Zn oxide film (M represents Al, Ti, Ga, Y, Zr, La, Cs, Nd, or Hf), the atomic ratio of metal elements of a sputtering target used for forming the In-M-Zn oxide film preferably satisfies M>In and Zn>M. As the atomic ratio of metal elements of such a sputtering target, In:Ga:Zn=1:3:4, In:Ga:Zn=1:3:5, In:Ga:Zn=1:3:6, In:Ga:Zn=1:3:7, In:Ga:Zn=1:3:8, In:Ga:Zn=1:3:9, In:Ga:Zn=1:3:10, In:Ga:Zn=1:4:5, In:Ga:Zn=1:4:6, In:Ga:Zn=1:4:7, In:Ga:Zn=1:4:8, In:Ga:Zn=1:4:9, In:Ga:Zn=1:4:10, In:Ga:Zn=1:5:6, In:Ga:Zn=1:5:7, In:Ga:Zn=1:5:8, In:Ga:Zn=1:5:9, In:Ga:Zn=1:5:10, In:Ga:Zn=1:6:7, In:Ga:Zn=1:6:8, In:Ga:Zn=1:6:9, or In:Ga:Zn=1:6:10 is preferable.

In the case where the oxide film 219 is an In-M-Zn oxide film, the proportions of In and M when summation of In and M is assumed to be 100 atomic % are preferably as follows: the atomic percentage of In is less than 50 atomic % and the atomic percentage of M is greater than or equal to 50 atomic %, or the atomic percentage of In is less than 25 atomic % and the atomic percentage of M is greater than or equal to 75 atomic %.

Further, in the case where each of the oxide semiconductor film 218 and the oxide film 219 is an In-M-Zn oxide film (M represents Al, Ti, Ga, Y, Zr, La, Cs, Nd, or Hf), the proportion of M (M represents Al, Ti, Ga, Y, Zr, La, Cs, Nd, or Hf) in the oxide film 219 is higher than that in the oxide semiconductor film 218. Typically, the proportion of M in the oxide film 219 is 1.5 or more times, twice or more, or three or more times as high as that in the oxide semiconductor film 218.

Furthermore, in the case where each of the oxide semiconductor film 218 and the oxide film 219 is an In-M-Zn oxide film (M represents Al, Ti, Ga, Y, Zr, La, Cs, Nd, or Hf), when In:M:Zn=$x_1$:$y_1$:$z_1$ [atomic ratio] is satisfied in the oxide film 219 and In:M:Zn=$x_2$:$y_2$:$z_2$ [atomic ratio] is satisfied in the oxide semiconductor film 218, $y_1/x_1$ is higher than $y_2/x_2$, or $y_1/x_1$ be 1.5 or more times as high as $y_2/x_2$. Alternatively, $y_1/x_1$ is twice or more as high as $y_2/x_2$, or $y_1/x_1$ is three or more times as high as $y_2/x_2$. In this case, it is preferable that in the oxide semiconductor film, $y_2$ be higher than or equal to $x_2$ because a transistor including the oxide semiconductor film can have stable electrical characteristics. However, when $y_2$ is larger than or equal to three or more times $x_2$, the field-effect mobility of the transistor including the oxide semiconductor film is reduced. Accordingly, $y_2$ is preferably smaller than three times $x_2$.

A formation process which is similar to that of the oxide semiconductor film in Embodiment 4 can be used for the oxide semiconductor film 218.

The oxide film 219 is preferably formed using the sputtering target described in Embodiment 1, and typically, a sputtering target with an atomic ratio of In M:Zn=1:3:3.05 to 1:3:10 or a sputtering target with an atomic ratio of In:M:Zn=1:6:6.05 to 1:6:10 can be used. Note that the atomic ratio of M/In and the atomic ratio of Zn/In in the oxide film 219 formed using such a sputtering target are lower than those in the sputtering target. The atomic ratio of Zn to M (Zn/M) in an In—Ga—Zn oxide film is higher than or equal to 0.5.

By a sputtering method using such a sputtering target, a film of an In—Ga—Zn oxide that has a homologous structure and is CAAC-OS can be formed.

The oxide film 219 also serves as a film which relieves damage to the oxide semiconductor film 218 at the time of forming the oxide insulating film 224 later. Consequently, the amount of oxygen vacancies in the oxide semiconductor film 218 can be reduced. In addition, by forming the oxide film 219, mixing of a constituent element of an insulating film, e.g., the oxide insulating film, formed over the oxide semiconductor film 218 to the oxide semiconductor film 218 can be inhibited.

The thickness of the oxide film 219 is greater than or equal to 3 nm and less than or equal to 100 nm, or greater than or equal to 3 nm and less than or equal to 50 nm.

The oxide film 219 may have a non-single-crystal structure, for example, like the oxide semiconductor film 218. Non-single-crystal structures include the CAAC-OS which is described in Embodiment 2, a polycrystalline structure, a microcrystalline structure, and an amorphous structure, for example. Among the non-single-crystal structures, the amorphous structure has the highest density of defect states, whereas CAAC-OS has the lowest density of defect states. Therefore, the oxide film 219 is preferably CAAC-OS.

Note that the oxide semiconductor film 218 and the oxide film 219 may each be a mixed film including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure including, for example, two or more of a region having an amorphous structure, a region having a microcrystalline structure, a region having a polycrystalline structure, a CAAC-OS region, and a region having a single-crystal structure in some cases. Furthermore, a microcrystalline structure and CAAC-OS may be stacked as the oxide semiconductor film 218 and the oxide film 219, respectively. Alternatively, the oxide semiconductor film 218 may have a stacked-layer structure of a microcrystalline structure and CAAC-OS, and the oxide film 219 may be CAAC-OS.

It is preferable that the oxide semiconductor film 218 and the oxide film 219 each be CAAC-OS, in which case the crystallinity at the interface between the oxide semiconductor film 218 and the oxide film 219 can be increased.

Note that a channel formation region refers to a region in the multilayer film 220 which overlaps with the gate electrode 215 and is positioned between the pair of electrodes 221 and 222. Further, a channel region refers to a region in the channel formation region through which current mainly flows. Here, a channel region is part of the oxide semiconductor film 218 which is positioned between the pair of electrodes 221 and 222. A channel length refers to a distance between the pair of electrodes 221 and 222.

Here, the oxide film 219 is provided between the oxide semiconductor film 218 and the oxide insulating film 223. Hence, if trap states are formed between the oxide film 219 and the oxide insulating film 223 owing to impurities and defects, electrons flowing in the oxide semiconductor film 218 are less likely to be captured by the trap states because there is a distance between the trap states and the oxide semiconductor film 218. Accordingly, the amount of on-state current of the transistor can be increased, and the field-effect mobility can be increased. When electrons are captured by the trap states, the electrons become negative fixed charges. As a result, a threshold voltage of the transistor changes. However, by the distance between the oxide semiconductor film 218 and the trap states, capture of the electrons by the trap states can be reduced, and accordingly a change of the threshold voltage can be reduced.

Further, impurities from the outside can be blocked by the oxide film 219, and accordingly, the amount of impurities which move from the outside to the oxide semiconductor film 218 can be reduced. Further, an oxygen vacancy is less likely to be formed in the oxide film 219. Consequently, the impurity concentration and the amount of oxygen vacancies in the oxide semiconductor film 218 can be reduced.

Note that the oxide semiconductor film 218 and the oxide film 219 are not formed by simply stacking each film, but are formed to form a continuous junction (here, in particular, a structure in which the energy of the bottom of the conduction band is changed continuously between the films). In other words, a stacked-layer structure in which there exists no impurity which forms a defect level such as a trap center or a recombination center at each interface is provided. If an impurity exists between the oxide semiconductor film 218 and the oxide film 219 which are stacked, a continuity of the energy band is damaged, and the carrier is captured or recombined at the interface and then disappears.

In order to form such a continuous junction it is necessary to form films continuously without being exposed to air, with use of the multi-chamber deposition apparatus including a load lock chamber which is described in Embodiment 3.

Figure 25D:
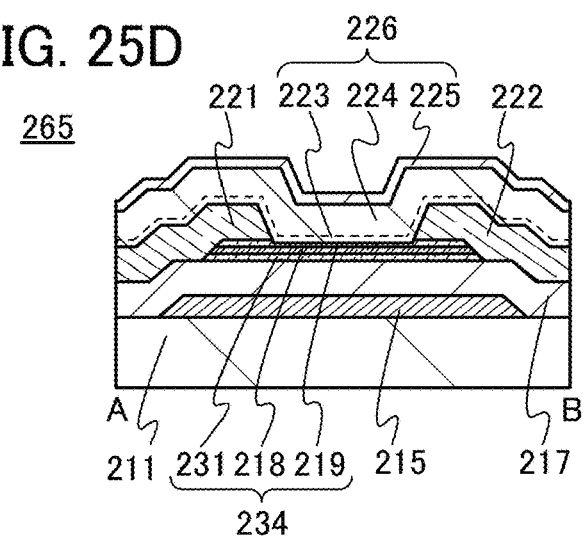

As in a transistor 265 shown in FIG. 25D, a multilayer film 234 overlapping with the gate electrode 215 with the gate insulating film 217 provided therebetween, and the pair of electrodes 221 and 222 in contact with the multilayer film 234 may be included.

The multilayer film 234 includes an oxide film 231, the oxide semiconductor film 218, and the oxide film 219. That is, the multilayer film 234 has a three-layer structure. The oxide semiconductor film 218 serves as a channel region.

Further, the gate insulating film 217 and the oxide film 231 are in contact with each other. That is, the oxide film 231 is provided between the gate insulating film 217 and the oxide semiconductor film 218.

The multilayer film 234 and the oxide insulating film 223 are in contact with each other. The oxide insulating film 223 and the oxide insulating film 224 are in contact with each other. That is, the oxide film 219 is provided between the oxide semiconductor film 218 and the oxide insulating film 223.

The oxide film 231 can be formed using a material and a formation method of the oxide film 219 described in Embodiment 4.

When the thickness of the oxide film 231 is smaller than that of the oxide semiconductor film 218, the amount of change in threshold voltage of the transistor can be reduced.

In the transistor described in this embodiment, the oxide film 231 is provided between the gate insulating film 217 and the oxide semiconductor film 218, and the oxide film 219 is provided between the oxide semiconductor film 218 and the oxide insulating film 223. Thus, it is possible to reduce the concentration of silicon or carbon in the vicinity of the interface between the oxide film 231 and the oxide semiconductor film 218, the concentration of silicon or carbon in the oxide semiconductor film 218, or the concentration of silicon or carbon in the vicinity of the interface between the oxide film 219 and the oxide semiconductor film 218.

Since the transistor 265 having such a structure includes very few defects in the multilayer film 234 including the oxide semiconductor film 218, the electrical characteristics of the transistor can be improved, and typically, the on-state current can be increased and the field-effect mobility can be improved. Further, in a BT stress test and a BT photostress test which are examples of a stress test, the amount of change in threshold voltage is small, and thus, reliability is high.

Note that the structures, methods, and the like described in this embodiment can be used as appropriate in combination with any of the structures, methods, and the like described in other embodiments, modification examples thereof, and examples.

Embodiment 6

In this embodiment, a transistor having a different structure from the transistors in Embodiments 4 and 5 will be described with reference to FIG. 26. A transistor 280 described in this embodiment includes a plurality of gate electrodes facing each other with an oxide semiconductor film provided therebetween.

Figure 26:
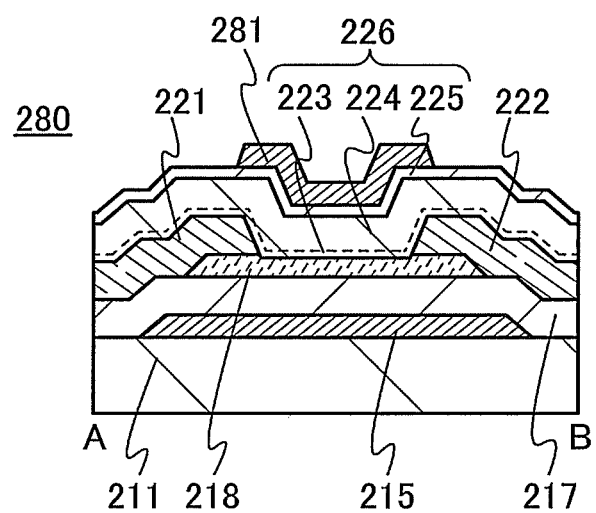
FIG. 26 is a cross-sectional view illustrating one embodiment of a transistor.

The transistor 280 shown in FIG. 26 includes the gate electrode 215 provided over the substrate 211. Moreover, the gate insulating film 217 over the substrate 211 and the gate electrode 215, the oxide semiconductor film 218 overlapping with the gate electrode 215 with the gate insulating film 217 provided therebetween, and the pair of electrodes 221 and 222 being in contact with the oxide semiconductor film 218 are included. Furthermore, the protective film 226 including the oxide insulating film 223, the oxide insulating film 224, and the nitride insulating film 225 is formed over the gate insulating film 217, the oxide semiconductor film 218, and the pair of electrodes 221 and 222. Further, a gate electrode 281 overlapping with the oxide semiconductor film 218 with the protective film 226 provided therebetween is included.

The gate electrode 281 can be formed in a manner similar to that of the gate electrode 215 described in Embodiment 4.

The transistor 280 described in this embodiment has the gate electrode 215 and the gate electrode 281 facing each other with the oxide semiconductor film 218 provided therebetween. By applying different potentials to the gate electrode 215 and the gate electrode 281, the threshold voltage of the transistor 280 can be controlled.

Further, when the oxide semiconductor film 218 in which the amount of oxygen vacancies is reduced is included, the electrical characteristics of the transistor can be improved. Further, the transistor in which the amount of change in threshold voltage is small and which is highly reliable is obtained.

Note that the structures, methods, and the like described in this embodiment can be used as appropriate in combination with any of the structures, methods, and the like described in other embodiments, modification examples thereof, and examples.

Embodiment 7

In this embodiment, a transistor having a different structure from the transistors in Embodiments 4 to 6 will be described with reference to FIGS. 27A to 27C.

In this embodiment, a semiconductor device having a transistor in which the amount of defects in an oxide semiconductor film can be further reduced as compared to Embodiments 4 to 6 is described with reference to drawings. The transistor described in this embodiment is different from those in Embodiments 4 to 6 in that the back channel side of the oxide semiconductor film 218 is covered with the protective film and is not exposed to plasma generated in the etching treatment for forming the pair of electrodes.

Figure 27A:
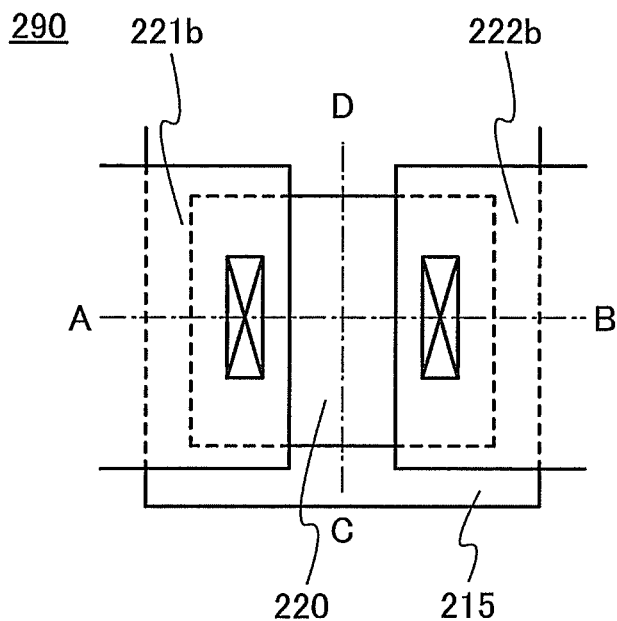
FIGS. 27A to 27C are a top view and cross-sectional views illustrating one embodiment of a transistor.
Figure 27C:
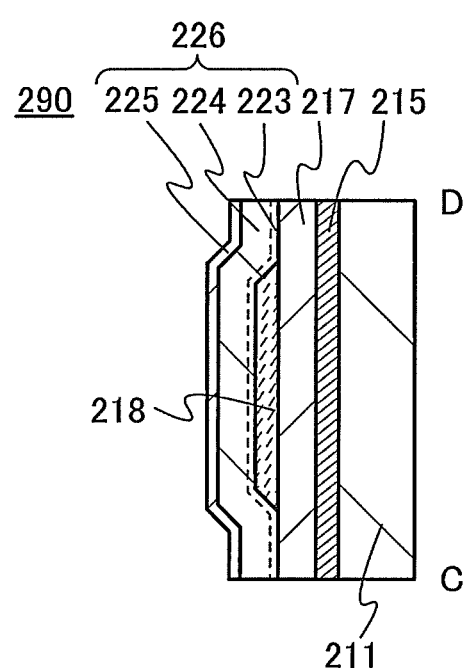
Figure 27B:
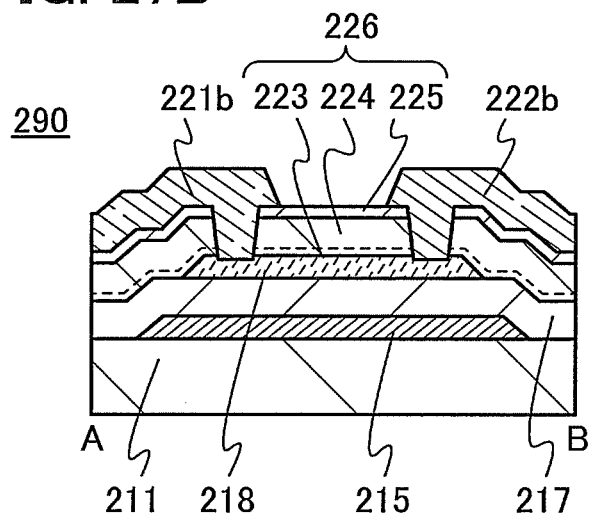

FIGS. 27A to 27C are a top view and cross-sectional views of a transistor 290 included in the semiconductor device. FIG. 27A is a top view of the transistor 290, FIG. 27B is a cross-sectional view taken along dashed-dotted line A-B in FIG. 27A, and FIG. 27C is a cross-sectional view taken along dashed-dotted line C-D in FIG. 27A. Note that in FIG. 27A, the substrate 211, one or more components of the transistor 290 (e.g., the gate insulating layer 217), the oxide insulating film 223, the oxide insulating film 224, the nitride insulating film 225, and the like are not illustrated for clarity.

The transistor 290 shown in FIGS. 27A to 27C includes the gate electrode 215 provided over the substrate 211. Moreover, the gate insulating film 217 over the substrate 211 and the gate electrode 215, and the oxide semiconductor film 218 overlapping with the gate electrode 215 with the gate insulating film 217 provided therebetween are provided. Further, the protective film 226 including the oxide insulating film 223, the oxide insulating film 224, and the nitride insulating film 225 is provided over the gate insulating film 217 and the oxide semiconductor film 218, and a pair of electrodes 221b and 222b which is formed over the protective film 226 and is connected to the oxide semiconductor film 218 in the opening of the protective film 226 is provided.

Next, a method for manufacturing the transistor 290 is described.

In a manner similar to Embodiment 4, the gate electrode 215 is formed over the substrate 211, and the gate insulating film 217 is formed over the substrate 211 and the gate electrode 215. Next, the oxide semiconductor film 218 is formed over the gate insulating film 217.

Next, in a manner similar to Embodiment 4, after the oxide insulating film 223 is formed over the gate insulating film 217 and the oxide semiconductor film 218 while heating is performed at a temperature higher than or equal to 220° C. and lower than or equal to 400° C., the oxide insulating film 224 and the nitride insulating film 225 are formed. Note that after the oxide insulating film 224 is formed, heat treatment is performed to supply part of oxygen contained in the oxide insulating film 224 to the oxide semiconductor film 218.

Next, parts of the oxide insulating film 223, the oxide insulating film 224, and the nitride insulating film 225 are etched to form an opening which exposes part of the oxide semiconductor film 218. After that, the pair of electrodes 221b and 222b in contact with the oxide semiconductor film 218 is formed in a manner similar to Embodiment 4.

In this embodiment, the oxide semiconductor film 218 is covered with the protective film 226 at the time of etching the pair of electrodes 221b and 222b; thus, the oxide semiconductor film 218, particularly a back channel region of the oxide semiconductor film 218, is not damaged by the etching for forming the pair of electrodes 221b and 222b. Further, the oxide insulating film 224 is formed using an oxide insulating film which contains oxygen at a higher proportion than the stoichiometric composition. Therefore, part of oxygen contained in the oxide insulating film 224 can be moved to the oxide semiconductor film 218, so that the amount of oxygen vacancies in the oxide semiconductor film 218 can be reduced.

By the above-described process, defects contained in the oxide semiconductor film 218 can be reduced, and thus, the reliability of the transistor 290 can be improved.

Note that the structures, methods, and the like described in this embodiment can be used as appropriate in combination with any of the structures, methods, and the like described in other embodiments, modification examples thereof, and examples.

Embodiment 8

In this embodiment, a transistor having a different structure from the transistors in Embodiments 4 to 7 will be described with reference to FIGS. 28A to 28C.

In this embodiment, a semiconductor device having a transistor in which the amount of defects in an oxide semiconductor film can be further reduced as compared to Embodiments 4 to 7 is described with reference to drawings. The transistor described in this embodiment is different from those in Embodiments 4 to 7 in that the back channel side of the oxide semiconductor film 218 is covered with the protective film and is not exposed to plasma generated in the etching treatment for forming the pair of electrodes in a manner similar to Embodiment 5.

Figure 28A:
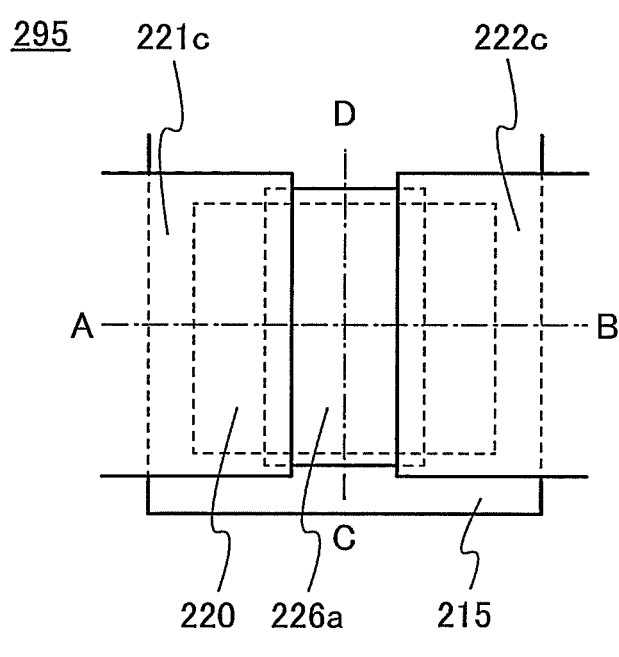
FIGS. 28A to 28C are a top view and cross-sectional views illustrating one embodiment of a transistor.
Figure 28C:
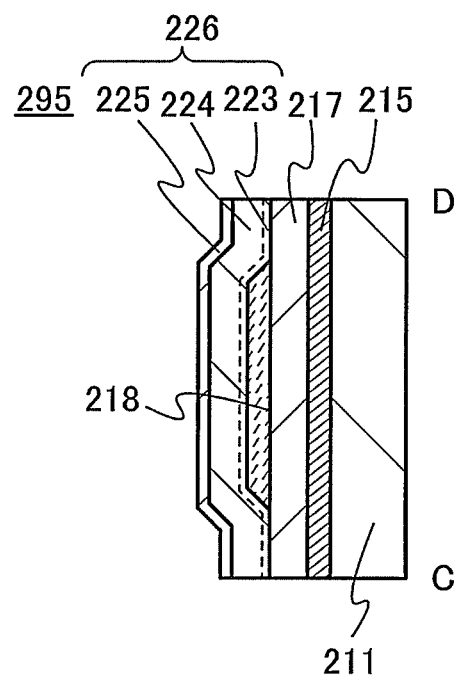
Figure 28B:
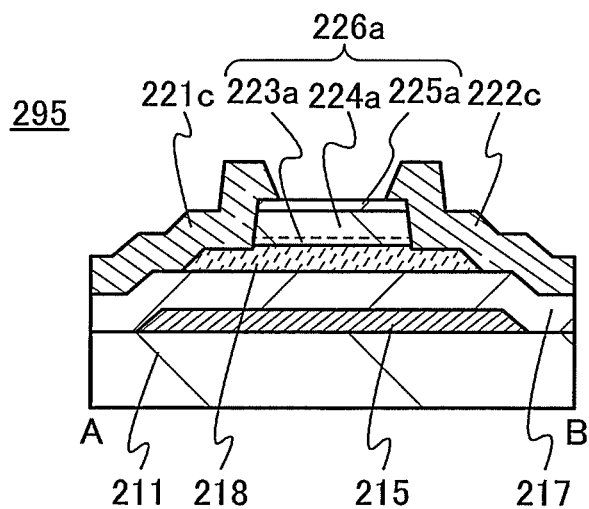

FIGS. 28A to 28C are a top view and cross-sectional views of a transistor 295 included in the semiconductor device. The transistor 295 shown in FIGS. 28A to 28C is a channel protective type transistor. FIG. 28A is a top view of the transistor 295, FIG. 28B is a cross-sectional view taken along dashed-dotted line A-B in FIG. 28A, and FIG. 28C is a cross-sectional view taken along dashed-dotted line C-D in FIG. 28A. Note that in FIG. 28A, the substrate 211 and one or more components of the transistor 295 (e.g., the gate insulating film 217) are not illustrated for clarity.

The transistor 295 shown in FIGS. 28A to 28C includes the gate electrode 215 over the substrate 211. Moreover, the gate insulating film 217 over the substrate 211 and the gate electrode 215, and the oxide semiconductor film 218 overlapping with the gate electrode 215 with the gate insulating film 217 provided therebetween are provided. Further, a protective film 226a including an oxide insulating film 223a, an oxide insulating film 224a, and a nitride insulating film 225a is provided over the gate insulating film 217 and the oxide semiconductor film 218, and a pair of electrodes 221c and 222c which is formed over the gate insulating film 217, the oxide semiconductor film 218, and the protective film 226a is provided.

Next, a method for manufacturing the transistor 295 is described.

In a manner similar to Embodiment 4, the gate electrode 215 is formed over the substrate 211, and the gate insulating film 217 is formed over the substrate 211 and the gate electrode 215. Next, the oxide semiconductor film 218 is formed over the gate insulating film 217.

Next, in a manner similar to Embodiment 4, after the oxide insulating film 223 is formed over the gate insulating film 217 and the oxide semiconductor film 218 while heating is performed at a temperature higher than or equal to 220° C. and lower than or equal to 400° C., the oxide insulating film 224 and the nitride insulating film 225 are formed. Note that after the oxide insulating film 224 is formed, heat treatment is performed to supply part of oxygen contained in the oxide insulating film 224 to the oxide semiconductor film 218.

Next, parts of the oxide insulating film 223, the oxide insulating film 224, and the nitride insulating film 225 are etched to form the protective film 226a including the oxide insulating film 223a, the oxide insulating film 224a, and the nitride insulating film 225a.

Next, the pair of electrodes 221c and 222c in contact with the oxide semiconductor film 218 is formed in a manner similar to Embodiment 4.

In this embodiment, the oxide semiconductor film 218 is covered with the protective film 226a at the time of etching the pair of electrodes 221c and 222c; thus, the oxide semiconductor film 218 is not damaged by the etching for forming the pair of electrodes 221c and 222c. Further, the oxide insulating film 224a is formed using an oxide insulating film which contains oxygen at a higher proportion than the stoichiometric composition. Therefore, part of oxygen contained in the oxide insulating film 224a can be moved to the oxide semiconductor film 218, so that the amount of oxygen vacancies in the oxide semiconductor film 218 can be reduced.

Note that the nitride insulating film 225a is formed in the protective film 226a in FIGS. 28A to 28C; however, the protective film 226a may have a stacked-layer structure of the oxide insulating film 223a and the oxide insulating film 224a. In that case, the nitride insulating film 225a is preferably formed after the pair of electrodes 221c and 222c is formed. Thus, hydrogen, water, or the like can be prevented from entering the oxide semiconductor film 218 from the outside.

By the above-described process, defects contained in the oxide semiconductor film 218 can be reduced, and thus, the reliability of the transistor 295 can be improved.

Embodiment 9

In this embodiment, a top-gate transistor and a manufacturing method thereof will be described.

Figure 29A:
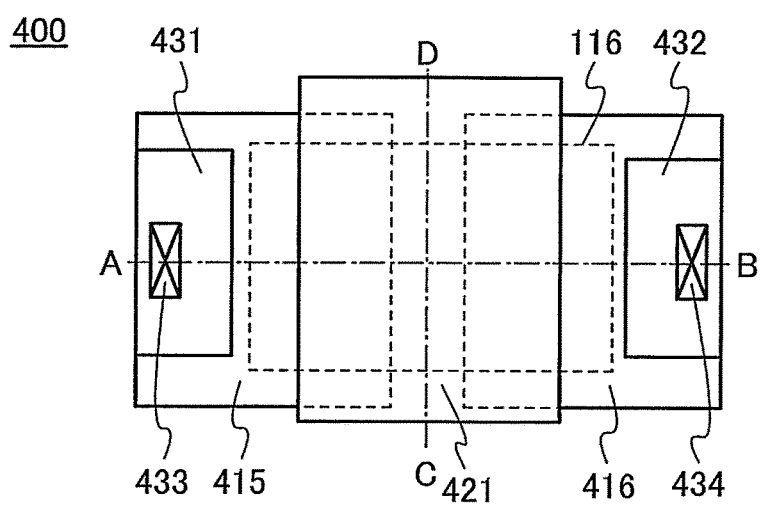
FIGS. 29A to 29C are a top view and cross-sectional views illustrating one embodiment of a transistor.
Figure 29C:
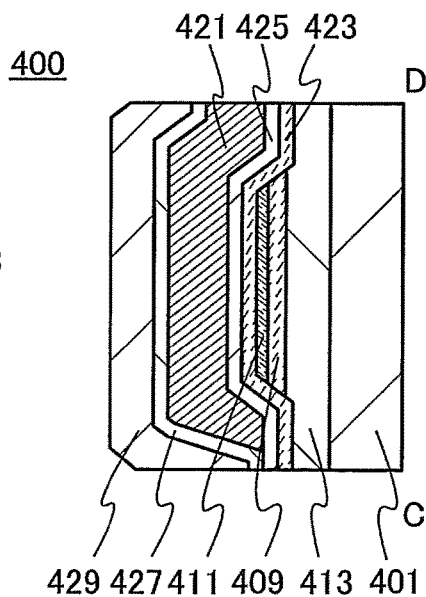
Figure 29B:
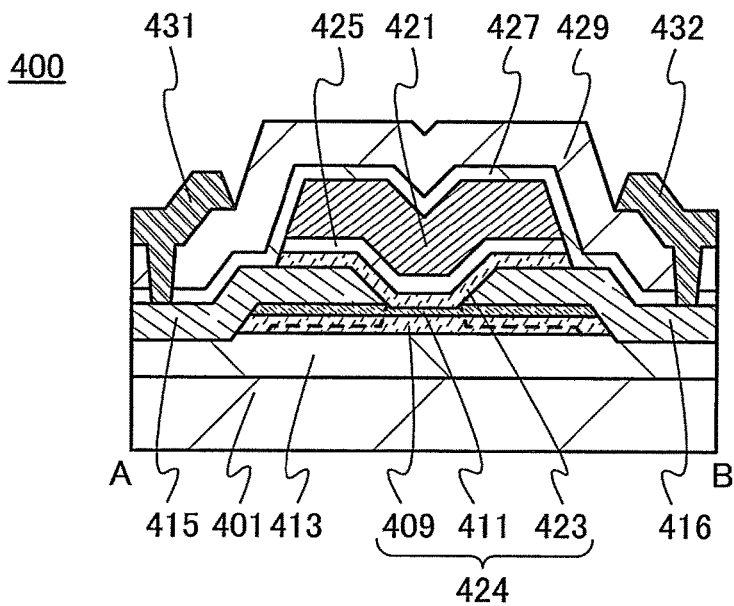

FIGS. 29A to 29C are a top view and cross-sectional views of a transistor 400 of a semiconductor device. FIG. 29A is a top view of the transistor 400, FIG. 29B is a cross-sectional view taken along dashed-dotted line A-B in FIG. 29A, and FIG. 29C is a cross-sectional view taken along dashed-dotted line C-D in FIG. 29A. Note that in FIG. 29A, a substrate 401, an oxide insulating film 413, one or more of components of the transistor 400 (e.g., an oxide film 423, a gate insulating film 425), an insulating film 427, an insulating film 429, and the like are not illustrated for clarity.

The transistor 400 illustrated in FIGS. 29A to 29C includes an oxide film 409 over the oxide insulating film 413 over the substrate 401, an oxide semiconductor film 411 over the oxide film 409, a pair of electrodes 415 and 416 in contact with the oxide semiconductor film 411, the oxide film 423 in contact with the oxide insulating film 413, the oxide semiconductor film 411, and the pair of electrodes 415 and 416, the gate insulating film 425 in contact with the oxide film 423, and a gate electrode 421 overlapping with the oxide semiconductor film 411 with the gate insulating film 425 provided therebetween. Note that the oxide film 409, the oxide semiconductor film 411, and the oxide film 423 are collectively referred to as a multilayer film 424. The insulating film 427 covering the gate insulating film 425 and the gate electrode 421 and the insulating film 429 covering the insulating film 427 may be provided. In openings 433 and 434 in the gate insulating film 425, the insulating film 427, and the insulating film 429, wirings 431 and 432 in contact with the pair of electrodes 415 and 416 may be provided.

Components of the transistor 400 are described below.

As the substrate 401, the substrate 211 described in Embodiment 4 can be used as appropriate.

As a material of the oxide insulating film 413 serving as a base insulating film, silicon oxide, silicon oxynitride, silicon nitride, silicon nitride oxide, gallium oxide, hafnium oxide, yttrium oxide, aluminum oxide, aluminum oxynitride, and the like can be given as examples. Note that when silicon nitride, gallium oxide, hafnium oxide, yttrium oxide, aluminum oxide, or the like is used as a material of the oxide insulating film 413 serving as a base insulating film, it is possible to suppress diffusion of impurities such as alkali metal, water, and hydrogen into the oxide semiconductor film from the substrate 401.

The oxide insulating film 413 can be formed using an oxide insulating film which contains oxygen at a higher proportion than the stoichiometric composition. In other words, an oxide insulating film from which part of oxygen is released by heating can be formed. With use of such a film, the oxygen in the oxide insulating film 413 is transferred to the oxide semiconductor film 411; thus, the density of defect states at the interface between the oxide insulating film 413 and the oxide film 409 can be reduced, and oxygen vacancies can be further reduced by filling oxygen vacancies in the oxide semiconductor film 411.

For the oxide film 409 and the oxide film 423 included in the multilayer film 424, the material of the oxide films 219 and 231 in Embodiment 5 can be used as appropriate, and for the oxide semiconductor film 411, the material of the oxide semiconductor film 218 in Embodiment 5 can be used as appropriate.

The thickness of the oxide semiconductor film 411 is greater than or equal to 3 nm and less than or equal to 200 nm, greater than or equal to 3 nm and less than or equal to 100 nm, or greater than or equal to 3 nm and less than or equal to 50 nm.

The thickness of the oxide film 409 and the oxide film 423 is greater than or equal to 0.3 nm and less than or equal to 200 nm, greater than or equal to 3 nm and less than or equal to 100 nm, or greater than or equal to 3 nm and less than or equal to 50 nm. Note that the thickness of the oxide film 409 is preferably larger than that of the oxide semiconductor film 411. The thickness of the oxide film 423 is preferably smaller than that of the oxide semiconductor film 411.

In the case where the thickness of the oxide film 409 is too small, electrons are captured at the interface between the oxide film 409 and the oxide semiconductor film 411, and the on-state current of the transistor is decreased. On the other hand, in the case where the thickness of the oxide film 409 is too large, the amount of oxygen transferred from the oxide insulating film 413 to the oxide semiconductor film 411 is decreased, and thus it is difficult to reduce the amount of oxygen vacancies in the oxide semiconductor film 411. Therefore, the thickness of the oxide film 409 is preferably larger than that of the oxide semiconductor film 411, and greater than or equal to 20 nm and less than or equal to 200 nm. Furthermore, it is preferable that the thickness of the oxide film 423 be smaller than that of the oxide semiconductor film 411 and the thickness of the oxide film 409 be larger than that of the oxide semiconductor film 411, in which case a transistor in which the amount of change in threshold voltage is small can be manufactured.

In the case where the oxide film 423 is a semiconductor, many electrons are induced in the oxide film 423. The oxide film 423 in which electrons are induced blocks an electric field of the gate electrode 421; thus, an electric field applied to the oxide semiconductor film 411 is weakened. As a result, the on-state current of the transistor is decreased. Therefore, the thickness of the oxide film 423 is preferably smaller than that of the oxide semiconductor film 411, and greater than or equal to 0.3 nm and less than or equal to 10 nm.

The oxide films 409 and 423 and the oxide semiconductor film 411 are formed according to the deposition model described in Embodiment 2. The oxide films 409 and 423 and the oxide semiconductor film 411 may have a non-single-crystal structure. Non-single-crystal structures include the CAAC-OS, the polycrystalline structure, and the microcrystalline structure which are described in Embodiment 2, and an amorphous structure, for example. Among the non-single-crystal structures, the amorphous structure has the highest density of defect states, whereas CAAC-OS has the lowest density of defect states. Therefore, the oxide films 409 and 423 and the oxide semiconductor film 411 are each preferably CAAC-OS.

Note that the oxide films 409 and 423 and the oxide semiconductor film 411 may each be a mixed film including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure including, for example, two or more of a region having an amorphous structure, a region having a microcrystalline structure, a region having a polycrystalline structure, a CAAC-OS region, and a region having a single-crystal structure in some cases. Furthermore, a microcrystalline structure, CAAC-OS, and CAAC-OS may be stacked as the oxide film 409, the oxide semiconductor film 411, and the oxide film 423, respectively. Alternatively, the oxide film 409 may have a stacked-layer structure of a microcrystalline structure and CAAC-OS, and the oxide semiconductor film 411 and the oxide film 423 may be CAAC-OS.

As the pair of electrodes 415 and 416, the pair of electrodes 221 and 222 described in Embodiment 4 can be used as appropriate.

As the gate insulating film 425, the gate insulating film 217 described in Embodiment 4 can be used as appropriate.

As the gate electrode 421, the gate electrode 215 described in Embodiment 4 can be used as appropriate.

As the insulating films 427 and 429, the oxide insulating film 223 and the oxide insulating film 224 described in Embodiment 4 can be used as appropriate. Note that an aluminum oxide film, a hafnium oxide film, a yttrium oxide film, or the like which can be used as an oxygen blocking film can be used as the insulating film 427.

In the case where side surfaces of the oxide film 423, the gate insulating film 425, and the gate electrode 421 are substantially aligned with each other and the insulating film 427 is in contact with surfaces of the pair of electrodes 415 and 416, the oxide film 423, the gate insulating film 425, and the gate electrode 421, release of oxygen from the multilayer film 424 in later heat treatment can be reduced. Thus, variation in electrical characteristics of the transistor can be reduced, and change in threshold voltage can be inhibited.

Although a stacked-layer structure of the insulating films 427 and 429 is used here, a single-layer structure may be used.

The wirings 431 and 432 can be formed using a material similar to that of the pair of electrodes 415 and 416, as appropriate.

In the transistor in this embodiment, an edge portion of the oxide film 423 and an edge portion of the gate insulating film 425 are substantially aligned with an edge portion of the gate electrode 421. The oxide film 423 and the gate insulating film 425 having such shapes can be formed by forming the gate electrode 421 in FIG. 31A and etching the oxide film 417 and the gate insulating film 419 without an increase in the number of photomasks.

In the transistor 400, an etching residue generated at the time of forming the gate electrode 421 can be removed when the oxide film 423 and the gate insulating film 425 are formed; thus, leakage current generated between the gate electrode 421 and the wirings 431 and 432 can be reduced.

A method for manufacturing the above semiconductor device is described with reference to FIGS. 30A to 30D and FIGS. 31A to 31C.

Figure 30A:
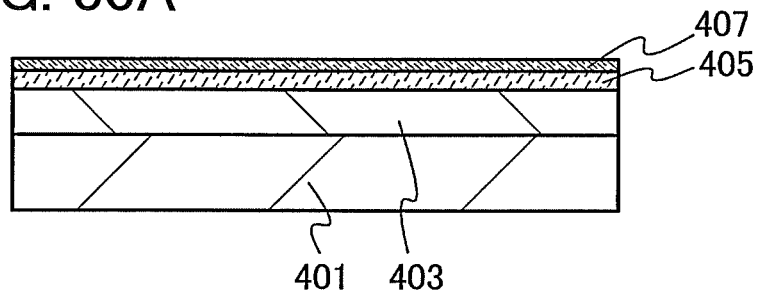
FIGS. 30A to 30D are cross-sectional views illustrating one embodiment of a method for manufacturing a transistor.

As illustrated in FIG. 30A, over the substrate 401, an oxide insulating film 403 serving as a base insulating film is formed, and an oxide film 405 and an oxide semiconductor film 407 are formed over the oxide insulating film 403.

Here, a glass substrate is used as the substrate 401.

The oxide insulating film 403 can be formed by a sputtering method or a CVD method.

In the case where an oxide insulating film containing oxygen in excess of the stoichiometric composition is formed as the oxide insulating film 403 in a manner similar to that of the oxide insulating film 224 described in Embodiment 4, the oxide insulating film can be formed by a CVD method, a sputtering method, or the like. Alternatively, after the oxide insulating film is formed by a CVD method, a sputtering method, or the like, oxygen may be added to the oxide insulating film by an ion implantation method, an ion doping method, plasma treatment, or the like.

Here, a 300-nm-thick silicon oxide film formed by a sputtering method is used as the oxide insulating film 403.

The oxide film 405 and the oxide semiconductor film 407 can be formed by a sputtering method, a coating method, a pulsed laser deposition method, a laser ablation method, or the like.

Here, a 20-nm-thick In—Ga—Zn oxide film is formed as the oxide film 405 by a sputtering method using a sputtering target with an atomic ratio of In:Ga:Zn=1:3:4.

Next, by performing heat treatment, oxygen is preferably transferred from the oxide insulating film 403 to the oxide film 405 and the oxide semiconductor film 407. Furthermore, impurities included in the oxide film 405 and the oxide semiconductor film 407 are preferably removed.

The heat treatment is performed typically at a temperature of higher than or equal to 250° C. and lower than the strain point of the substrate, higher than or equal to 300° C. and lower than or equal to 550° C., or higher than or equal to 350° C. and lower than or equal to 510° C.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

The heat treatment may be performed under an atmosphere of nitrogen, oxygen, ultra-dry air (air with a water content of 20 ppm or less, 1 ppm or less, or 10 ppb or less), or a rare gas (argon, helium, or the like). The atmosphere of nitrogen, oxygen, ultra-dry air, or a rare gas preferably does not contain hydrogen, water, and the like.

Here, after heat treatment is performed at 450° C. for 1 hour in a nitrogen atmosphere, heat treatment is performed at 450° C. for 1 hour in an oxygen atmosphere.

By the heat treatment, part of oxygen in the oxide insulating film 403 serving as a base insulating film and the oxide film 409 to which oxygen is added is transferred to the oxide semiconductor film 407, so that the amount of oxygen vacancies in the oxide semiconductor film 407 is reduced. Note that in the oxide film 409 to which oxygen is added, the oxygen content is reduced by the heat treatment.

Through the above steps, oxygen vacancies in the oxide semiconductor film can be reduced.

Note that the heat treatment may be performed in a later step, not in this step. In other words, in another heating step performed later, part of oxygen in the oxide insulating film 403 may be transferred to the oxide semiconductor film 407. In this case, the number of heating steps can be reduced.

Figure 30B:
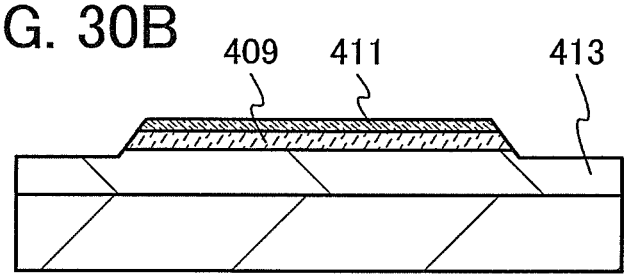

Then, after a mask is formed over the oxide semiconductor film 407 by a photolithography process, the oxide film 409 and the oxide semiconductor film 407 are each partly etched using the mask. Accordingly, the oxide film 409 and the oxide semiconductor film 411 are formed as illustrated in FIG. 30B. After that, the mask is removed. Note that in the etching step, the oxide insulating film 403 is partly etched in some cases. Here, the oxide insulating film 403 which is partly etched is referred to as the oxide insulating film 413.

Figure 30C:
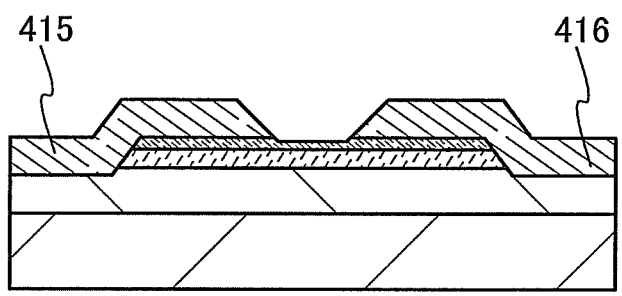

Next, as illustrated in FIG. 30C, the pair of electrodes 415 and 416 is formed over the oxide semiconductor film 411.

A method for forming the pair of electrodes 415 and 416 is described below. First, a conductive film is formed by a sputtering method, a CVD method, an evaporation method, or the like. Then, a mask is formed over the conductive film by a photolithography process. Next, the conductive film is etched with the use of the mask to form the pair of electrodes 415 and 416. After that, the mask is removed.

Here, a 50-nm-thick titanium film, a 400-nm-thick aluminum film, and a 100-nm-thick titanium film are sequentially stacked by a sputtering method. Next, a mask is formed over the titanium film by a photolithography process and the titanium film, the aluminum film, and the titanium film are dry-etched with use of the mask to form the pair of electrodes 415 and 416.

After the pair of electrodes 415 and 416 is formed, cleaning treatment is preferably performed to remove an etching residue. A short circuit of the pair of electrodes 415 and 416 can be suppressed by this cleaning treatment. The cleaning treatment can be performed using an alkaline solution such as a tetramethylammonium hydroxide (TMAH) solution, or an acidic solution such as diluted hydrofluoric acid, an oxalic acid solution, or a phosphoric acid solution.

Figure 30D:
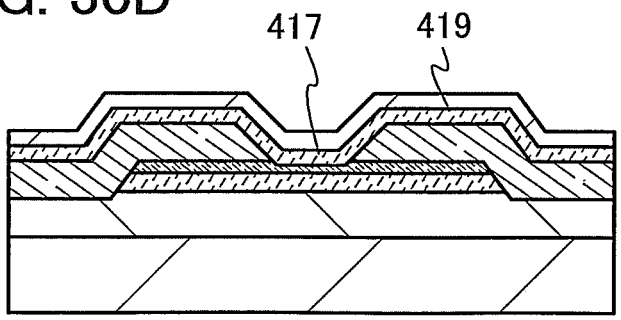

Next, as illustrated in FIG. 30D, an oxide film 417 is formed over the oxide semiconductor film 411 and the pair of electrodes 415 and 416, and a gate insulating film 419 is formed over the oxide film 417.

The oxide film 417 can be formed in a manner similar to that of the oxide film 409. The gate insulating film 419 can be formed by a sputtering method, a CVD method, or the like.

Here, a 5-nm-thick In—Ga—Zn oxide film is formed as the oxide film 417 by a sputtering method using a sputtering target with an atomic ratio of In:Ga:Zn=1:3:4.

Figure 31A:
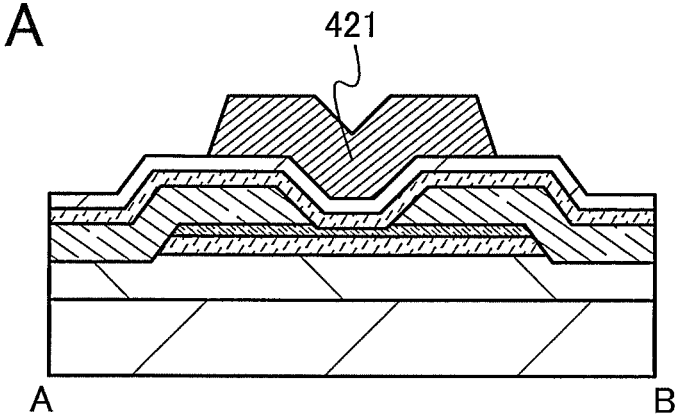
FIGS. 31A to 31C are cross-sectionals views illustrating one embodiment of a method for manufacturing a transistor.

Then, as illustrated in FIG. 31A, the gate electrode 421 is formed in a region which is over the gate insulating film 419 and overlaps with the oxide semiconductor film 411.

A method for forming the gate electrode 421 is described below. First, a conductive film is formed by a sputtering method, a CVD method, an evaporation method, or the like. Then, a mask is formed over the conductive film by a photolithography process. Next, part of the conductive film is etched with the use of the mask to form the gate electrode 421. After that, the mask is removed.

Note that the gate electrode 421 may be formed by an electrolytic plating method, a printing method, an inkjet method, or the like instead of the above formation method.

Here, a 15-nm-thick tantalum nitride film and a 135-nm-thick tungsten film are formed in this order by a sputtering method. Next, a mask is formed by a photolithography process, and the tantalum nitride film and the tungsten film are subjected to dry etching with the use of the mask to form the gate electrode 421.

Figure 31B:
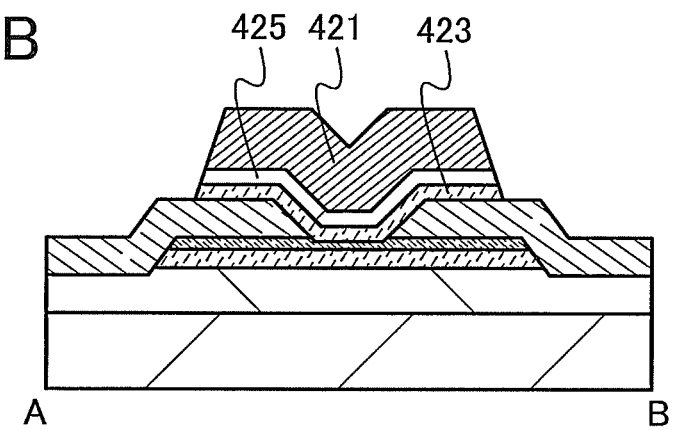

Next, as illustrated in FIG. 31B, the oxide film 417 and the gate insulating film 419 are etched using the gate electrode 421 as a mask to form the oxide film 423 and the gate insulating film 425. In this manner, the oxide film 423 and the gate insulating film 425 can be formed without an increase in the number of photomasks. Furthermore, an edge portion of the oxide film 423 and an edge portion of the gate insulating film 425 are substantially aligned with an edge portion of the gate electrode 421.

In the transistor 450, an etching residue generated at the time of forming the gate electrode 421 can be removed when the oxide film 423 and the gate insulating film 425 are formed; thus, leakage current generated between the gate electrode 421 and the wirings 431 and 432 which are formed later can be reduced.

Figure 31C:
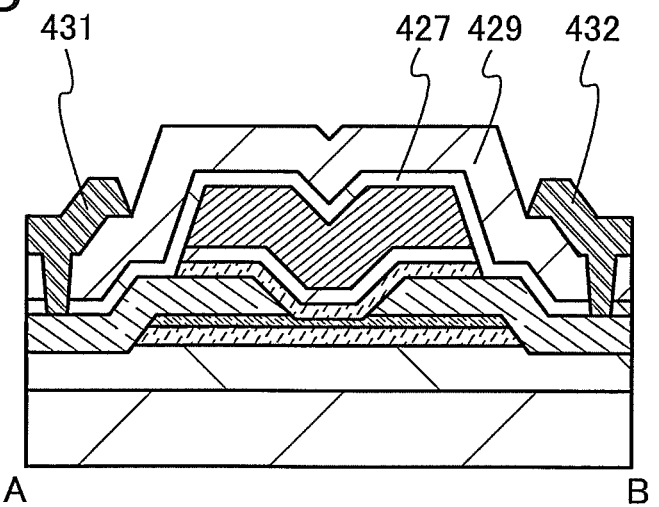

Next, as illustrated in FIG. 31C, the insulating film 427 and the insulating film 429 are stacked in this order over the pair of electrodes 415 and 416 and the gate electrode 421. Next, heat treatment is performed. After openings are formed in the insulating film 427 and the insulating film 429, the wirings 431 and 432 are formed.

The insulating film 427 and the insulating film 429 can be formed by a sputtering method, a CVD method, or the like as appropriate. When an oxygen blocking film is used as the insulating film 427, release of oxygen from the multilayer film 424 in later heat treatment can be reduced. Thus, variation in electrical characteristics of the transistor can be reduced, and change in threshold voltage can be inhibited.

Here, a 300-nm-thick silicon oxynitride film is formed by a plasma CVD method as the insulating film 427, and a 50-nm-thick silicon nitride film is formed by a sputtering method as the insulating film 429.

The heat treatment is performed typically at a temperature of higher than or equal to 150° C. and lower than the strain point of the substrate, higher than or equal to 250° C. and lower than or equal to 500° C., or higher than or equal to 300° C. and lower than or equal to 450° C. Here, heat treatment is performed at 350° C. for one hour in an atmosphere of nitrogen and oxygen.

The wirings 431 and 432 can be formed in a manner similar to that of the pair of electrodes 415 and 416. Alternatively, the wirings 431 and 432 can be formed by a damascene method.

Through the above steps, a transistor which has a multilayer film including an oxide semiconductor film and having a low density of localized levels and which has excellent electrical characteristics can be manufactured. In addition, a highly reliable transistor in which a variation in electrical characteristics with time or a variation in electrical characteristics due to a stress test is small can be manufactured.

Note that the structures, methods, and the like described in this embodiment can be used as appropriate in combination with any of the structures, methods, and the like described in other embodiments, modification examples thereof, and examples.

Embodiment 10

Although the variety of films such as the metal films, the oxide semiconductor films, and the inorganic insulating films which are described in the above embodiments can be formed by a sputtering method or a plasma chemical vapor deposition (CVD) method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the metal film, the oxide semiconductor film, and the inorganic insulating film which are described in the above embodiments can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed using a deposition apparatus employing ALD, two kinds of gases, i.e., ozone ($O_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed using a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced a plurality of times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced a plurality of times to form an In—O layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Further, instead of an In(CH$_3$)$_3$ gas, an In(C$_2$H$_5$)$_3$ gas may be used. Furthermore, a Zn(CH$_3$)$_2$ gas may be used.

Note that the structures, methods, and the like described in this embodiment can be used as appropriate in combination with any of the structures, methods, and the like described in other embodiments, modification examples thereof, and examples.

Example 1

In this example, In—Ga—Zn oxide films were formed using sputtering targets each containing an In—Ga—Zn oxide. The atomic ratios and the crystal structures of the sputtering targets and the films formed will be described.
<Structure of Sample>

First, a method for forming samples will be described.

In this example, each sample was formed by forming a 100-nm-thick In—Ga—Zn oxide film over a quartz substrate.

Here, the In—Ga—Zn oxide film was formed using a sputtering target containing an In—Ga—Zn oxide under the conditions where a mixed gas of oxygen and argon at a flow rate ratio of 1:2 was supplied as a sputtering gas to a deposition chamber, the pressure inside the deposition chamber was controlled to 0.4 Pa, and a DC power of 200 W was supplied.

Note that a sample including an In—Ga—Zn oxide film formed using a sputtering target containing an In—Ga—Zn oxide including metal elements at an atomic ratio of In:Ga:Zn=1:3:2 is referred to as a sample 1. Note that the substrate temperature was set at 200° C.

Note that a sample including an In—Ga—Zn oxide film formed using a sputtering target containing an In—Ga—Zn oxide including metal elements at an atomic ratio of In:Ga:Zn=1:3:4 is referred to as a sample 2. Note that the substrate temperature was set at 200° C.

Note that a sample including an In—Ga—Zn oxide film formed using a sputtering target containing an In—Ga—Zn oxide including metal elements at an atomic ratio of In:Ga:Zn=1:3:6 is referred to as a sample 3. Note that the substrate temperature was set at 200° C.

Note that a sample including an In—Ga—Zn oxide film formed using a sputtering target containing an In—Ga—Zn oxide including metal elements at an atomic ratio of In:Ga:Zn=1:6:2 is referred to as a sample 4. Note that the substrate temperature was set at 200° C.

Note that a sample including an In—Ga—Zn oxide film formed using a sputtering target containing an In—Ga—Zn oxide including metal elements at an atomic ratio of In:Ga:Zn=1:6:4 is referred to as a sample 5. Note that the substrate temperature was set at 200° C.

Note that a sample including an In—Ga—Zn oxide film formed using a sputtering target containing an In—Ga—Zn oxide including metal elements at an atomic ratio of In:Ga:Zn=1:6:8 is referred to as a sample 6. Note that the substrate temperature was set at 200° C.

Note that a sample including an In—Ga—Zn oxide film formed using a sputtering target containing an In—Ga—Zn oxide including metal elements at an atomic ratio of In:Ga:Zn=1:6:10 is referred to as a sample 7. Note that the substrate temperature was set at 200° C.

Note that a sample including an In—Ga—Zn oxide film formed using a sputtering target containing an In—Ga—Zn oxide including metal elements at an atomic ratio of In:Ga:Zn=0:2:1 is referred to as a sample 8. Note that the substrate temperature was set at 200° C.

Note that a sample including an In—Ga—Zn oxide film formed using a sputtering target containing an In—Ga—Zn oxide including metal elements at an atomic ratio of In:Ga:Zn=3:1:2 is referred to as a sample 9. Note that the substrate temperature was set at 200° C.

Note that a sample including an In—Ga—Zn oxide film formed using a sputtering target containing an In—Ga—Zn oxide including metal elements at an atomic ratio of In:Ga:Zn=1:1:1 is referred to as a sample 10. Note that the substrate temperature was set at 300° C.
<XPS>

Figure 32:
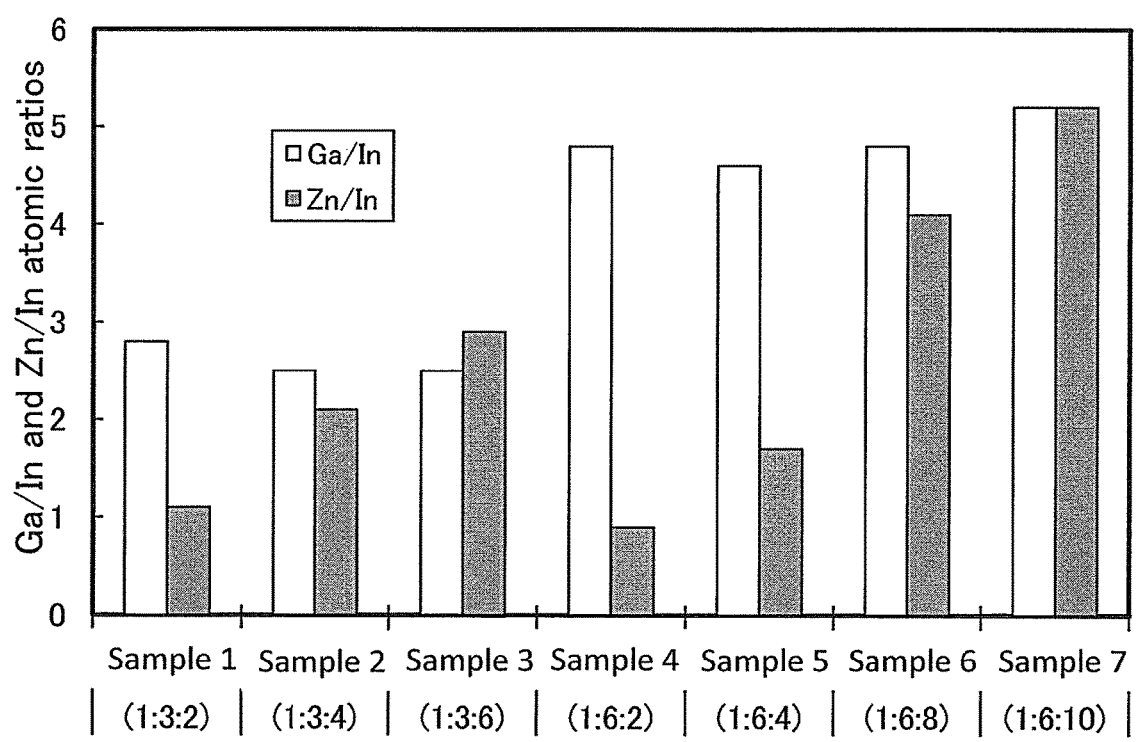
FIG. 32 shows atomic ratios of In—Ga—Zn oxide films which are found from XPS analysis results.

Next, the atomic ratios of the metal elements included in the In—Ga—Zn oxide films of the samples 1 to 10 and those in the sputtering targets used to form the samples 1 to 10 were quantified by X-ray photoelectron spectroscopy (XPS) analysis. FIG. 32 shows the atomic ratios of Ga to In and the atomic ratios of Zn to In. Note that in FIG. 32, the atomic ratio of In:Ga:Zn in each sputtering target used for deposition is in parentheses.

FIG. 32 shows that the atomic ratio of Ga to In and the atomic ratio of Zn to In in each In—Ga—Zn oxide film formed are lower than the atomic ratio of Ga to In and the atomic ratio of Zn to In in each sputtering target.
<XRD>

Next, the crystal structures of the In—Ga—Zn oxide films included in the samples 1 to 10 were measured by X-ray diffraction (XRD). Note that the samples 1 to 10 were each formed under two conditions where the sputtering gas for forming the In—Ga—Zn oxide film was a mixed gas of oxygen and argon at a flow rate ratio of 1:2 and where the sputtering gas was only oxygen.

FIGS. 33A and 33B, FIGS. 34A and 34B, and FIGS. 35A and 35B show results of X-ray diffraction measurement of the In—Ga—Zn oxide films formed. As typical examples, results of X-ray diffraction measurement of the sample 1, the sample 2, and the sample 3 are shown in FIGS. 33A and 33B, FIGS. 34A and 34B, and FIGS. 35A and 35B, respectively. Note that the In—Ga—Zn oxide films of the samples 1 to 3 which were formed using only oxygen as a sputtering gas were measured.

Figure 33A:
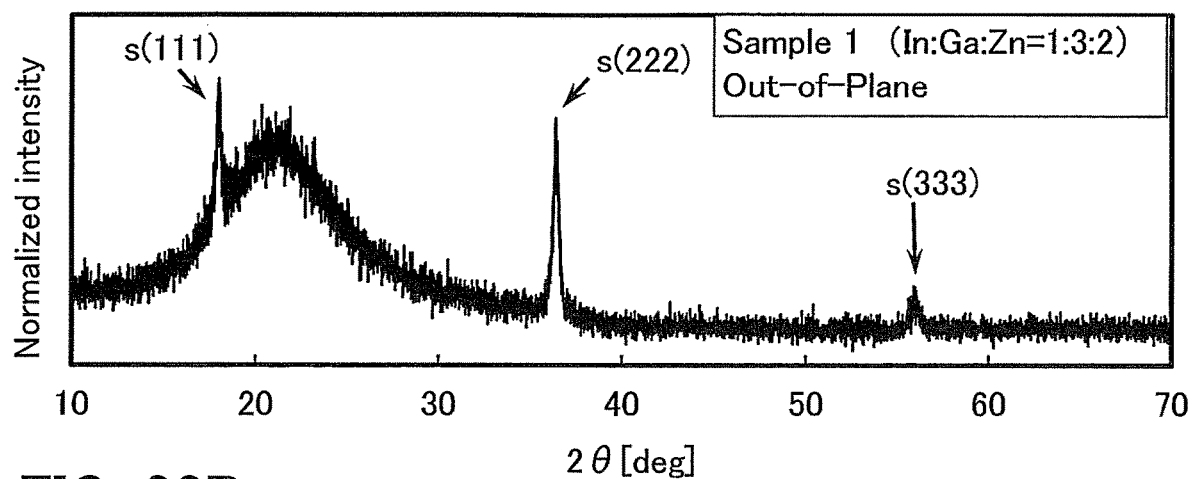
FIGS. 33A and 33B show results of X-ray diffraction measurement of an In—Ga—Zn oxide film.
Figure 33B:
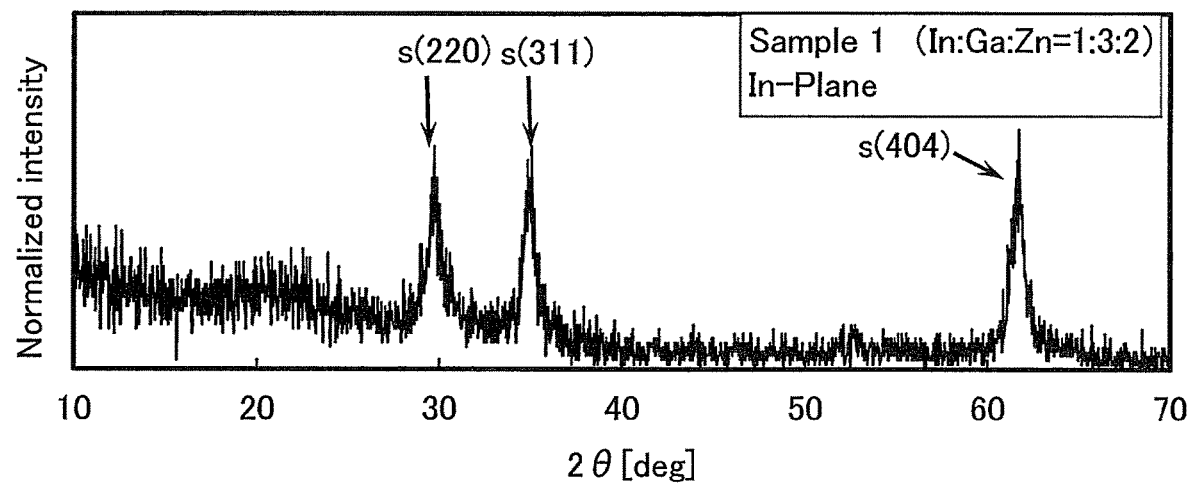
Figure 34A:
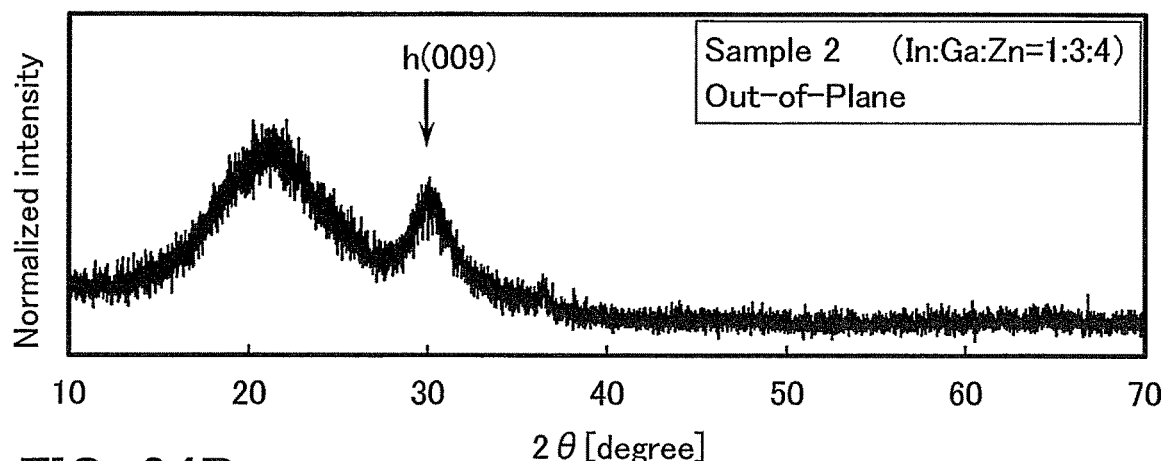
FIGS. 34A and 34B show results of X-ray diffraction measurement of an In—Ga—Zn oxide film.
Figure 34B:
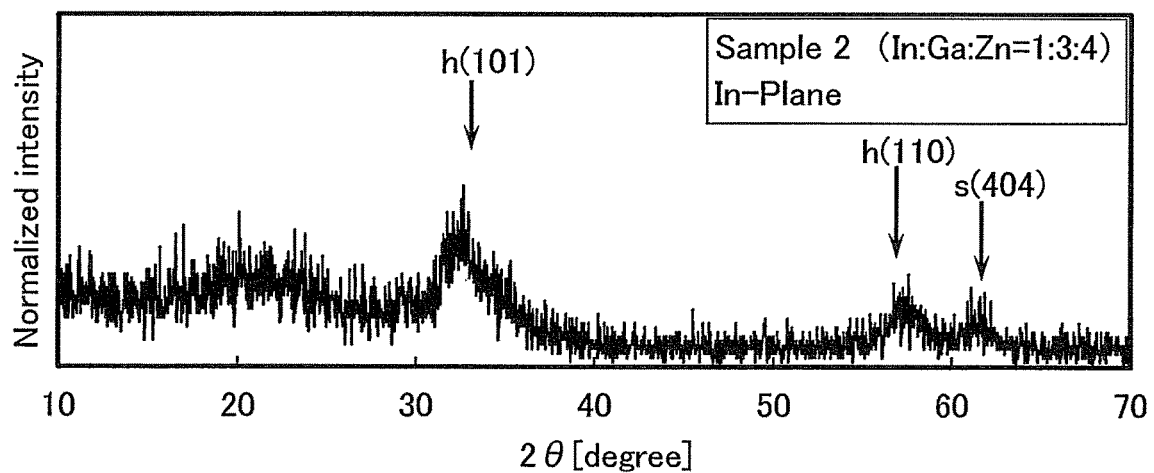
Figure 35A:
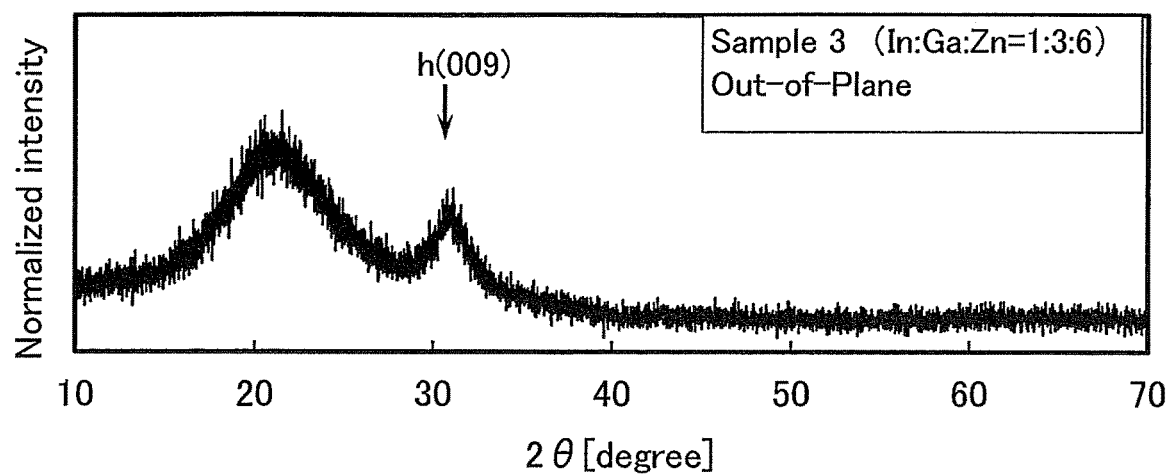
FIGS. 35A and 35B show results of X-ray diffraction measurement of an In—Ga—Zn oxide film.
Figure 35B:
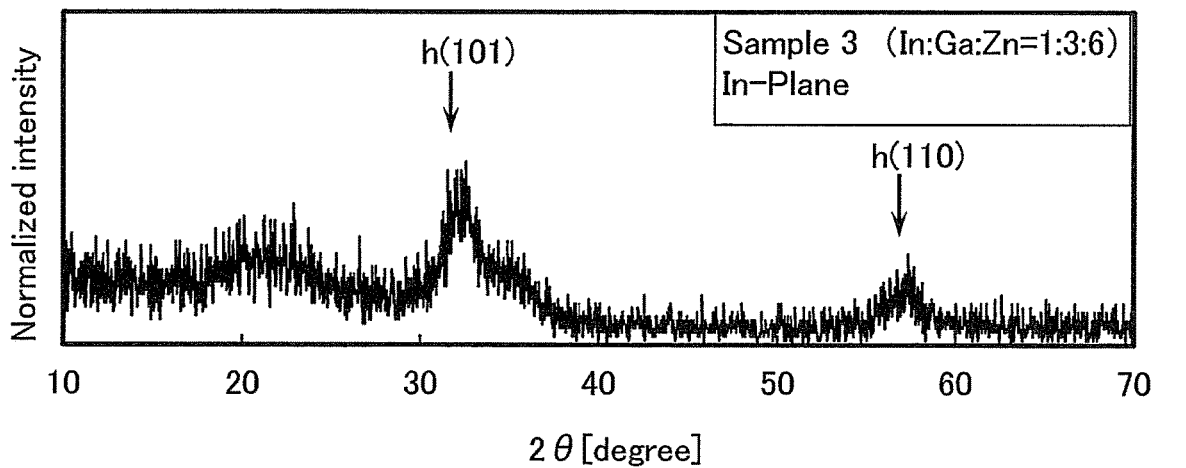

FIGS. 33A, 34A, and 35A each show an XRD spectrum measured by an out-of-plane method, where the vertical axis represents X-ray diffraction intensity (arbitrary unit) and the horizontal axis represents diffraction angle 2θ (deg.). FIGS. 33B, 34B, and 35B each show an XRD spectrum measured by an in-plane method, where the vertical axis represents X-ray diffraction intensity (arbitrary unit) and the horizontal axis represents diffraction angle 2θ (deg.).

In FIGS. 33A and 33B, FIGS. 34A and 34B, and FIGS. 35A and 35B, the letter "h" represents a homologous structure, and the letter "s" represents a spinel structure. The orientation of a plane of a crystal structure is in parentheses.

The In—Ga—Zn oxide film of the sample 1 shown in FIGS. 33A and 33B has a spinel structure. The In—Ga—Zn oxide film of the sample 2 shown in FIGS. 34A and 34B has a spinel structure and a homologous structure. The In—Ga—Zn oxide film of the sample 3 shown in FIGS. 35A and 35B has a homologous structure.

FIGS. 33A and 33B, FIGS. 34A and 34B, and FIGS. 35A and 35B suggest that an In—Ga—Zn oxide film having a homologous structure can be formed by using a sputtering target containing Zn at a higher ratio than that of Ga.

Figure 36:
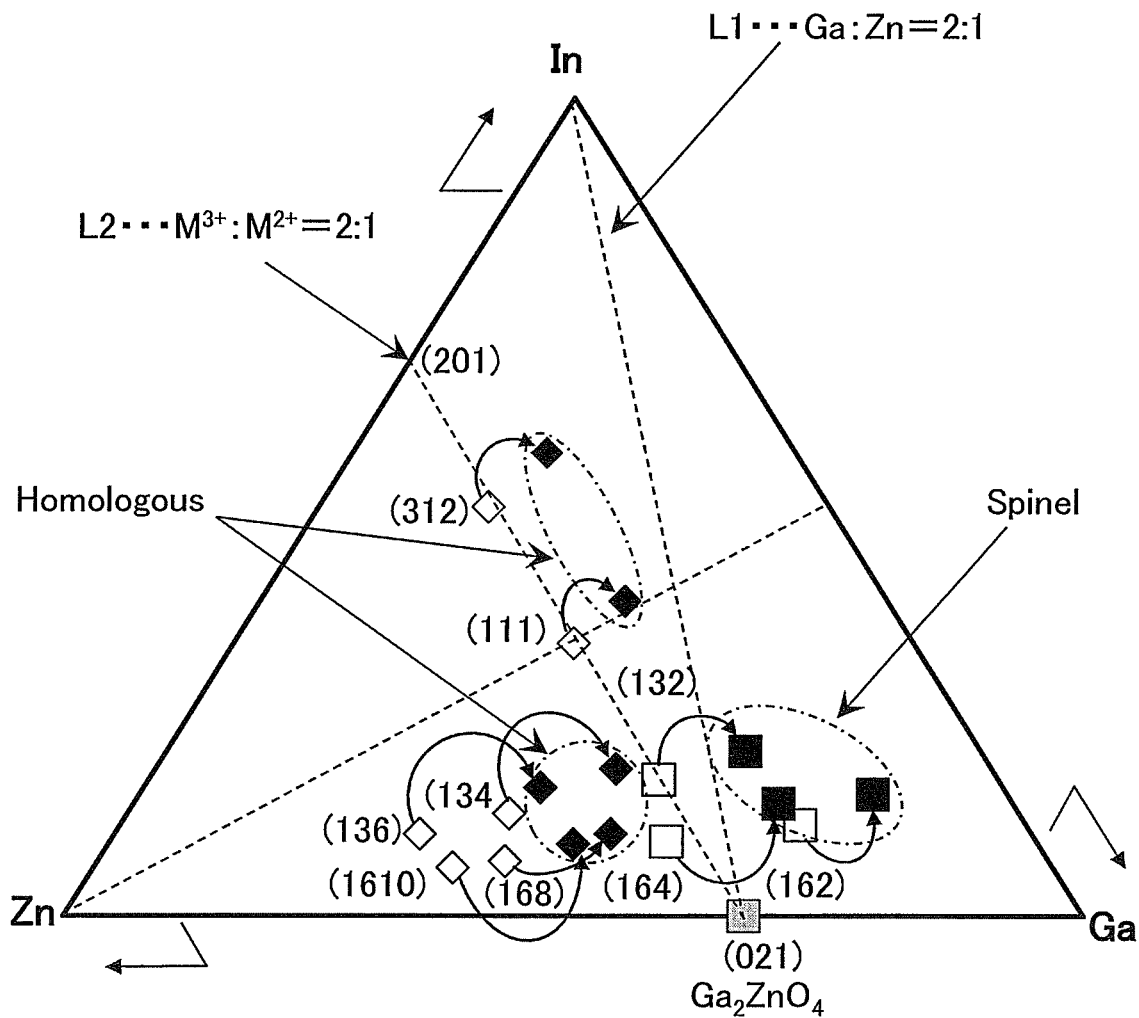
FIG. 36 is a ternary phase diagram of sputtering targets and In—Ga—Zn oxide films.

FIG. 36 shows a ternary phase diagram where the composition ratio of In to Ga and Zn in the In—Ga—Zn oxide film of each sample and that in the sputtering target used to form the sample are plotted on the basis of the results of XPS measurement in FIG. 32 and the results of X-ray diffraction measurement in FIGS. 33A and 33B, FIGS. 34A and 34B, and FIGS. 35A and 35B. Note that in FIG. 36, the composition ratio of In to Ga and Zn in each sputtering target is in parentheses. In FIG. 36, the amount of oxygen is excluded.

In FIG. 36, rhombuses indicate a homologous structure, and squares indicate a spinel structure. The compositions of the sputtering targets are plotted as white rhombuses and white squares, and the compositions of the In—Ga—Zn oxide films formed are plotted as black rhombuses and black squares.

FIG. 36 shows that the compositions of the In—Ga—Zn oxide films formed are different from the compositions of the sputtering targets.

Broken line L1 indicates a metal element ratio of Ga:Zn=2:1. Broken line L2 indicates a composition ratio of trivalent metal ions ($M^{3+}$) to divalent metal ions ($M^{2+}$) of $M^{3+}:M^{2+}=2:1$.

FIG. 36 shows that the In—Ga—Zn oxide films having a spinel structure are formed in a region on the right side of broken line L1, i.e., a region where the amount of Ga with respect to Zn increases, whereas the In—Ga—Zn oxide films having a homologous structure are formed in a region on the left side of broken line L1, i.e., a region where the amount of Zn with respect to Ga increases.

Table 2 shows the composition ratio of In to Ga and Zn, the atomic ratio of Zn to Ga (Zn/Ga), and the crystal structure of each of the In—Ga—Zn oxide films included in the samples 1 to 9, and the composition ratio of In to Ga and Zn in the sputtering target used to form the film. More specifically, Table 2 shows composition ratios measured in In—Ga—Zn oxide films formed by using a sputtering gas containing 33% of oxygen (in volume, and diluted with argon). Further, the crystal structures are indicated in cases of films formed by using a sputtering gas containing 33% of oxygen (in volume, and diluted with argon) and for films formed by using a sputtering gas containing 100% of oxygen.

TABLE 2

| Sample | Target Composition | | | | Composition ($O_2 = 33\%$) | | | Zn/Ga | In—Ga—Zn oxide film Crystal structure | |
| --- | --- | --- | --- | --- | --- | --- | --- | --- | --- | --- |
| | | In | Ga | Zn | In | Ga | Zn | | $O_2 = 33\%$ | $O_2 = 100\%$ |
| Sample 1 | (132) | 1 | 3 | 2 | 1 | 2.82 | 1.15 | 0.41 | no peak | spinel |
| Sample 4 | (162) | 1 | 6 | 2 | 1 | 4.84 | 0.89 | 0.18 | spinel | spinel |
| Sample 5 | (164) | 1 | 6 | 4 | 1 | 4.61 | 1.68 | 0.36 | no peak | spinel |
| Sample 8 | (021) | 0 | 2 | 1 | 0 | 2 | 1 | 0.50 | spinel | spinel |
| Sample 2 | (134) | 1 | 3 | 4 | 1 | 2.51 | 2.05 | 0.82 | homologous | homologous (spinel) |
| Sample 3 | (136) | 1 | 3 | 6 | 1 | 2.48 | 2.89 | 1.17 | homologous | homologous (spinel) |
| Sample 6 | (188) | 1 | 6 | 8 | 1 | 4.84 | 4 12 | 0 85 | homologous | homologous spinel |
| Sample 7 | (1610) | 1 | 6 | 10 | 1 | 5.20 | 5.20 | 1.00 | homologous | homologous (spinel) |
| Sample 9 | (312) | 3 | 1 | 2 | 3 | 1.01 | 1.29 | 1.28 | homologous | homologous |

Table 2 suggests that the In—Ga—Zn oxide films formed using the sputtering targets containing Zn at a higher ratio than that of Ga have a homologous structure.

Table 2 also suggests that the In—Ga—Zn oxide films in which the ratio of Zn to Ga (Zn/Ga) is higher than 0.5 have a homologous structure.

The above results suggest that an In—Ga—Zn oxide film having a homologous structure can be formed by using a sputtering target containing Zn at a higher ratio than that of Ga.

<TEM>

FIGS. 37A to 37D show cross-sectional images (bright-field images) obtained by observing cross-sectional atomic arrangement of the samples 2 and 3 using a transmission electron microscope (TEM). Here, regions in the vicinity of surfaces of the In—Ga—Zn oxide films of the samples were observed at an acceleration voltage of 300 kV and at a magnification of 8,000,000 times. In FIGS. 37A to 37D, the ratio of In to Ga and Zn in the sputtering targets for the samples 2 and 3 is indicated in parentheses.

FIG. 37A is a cross-sectional image of the sample 2, and FIG. 37B is a partial enlarged cross-sectional image of FIG. 37A. FIG. 37C is a cross-sectional image of the sample 3, and FIG. 37D is a partial enlarged cross-sectional image of FIG. 37C.

As shown in FIGS. 37A to 37D, it can be seen that the samples 2 and 3 have orderly atomic arrangement parallel to upper surfaces thereof. This suggests that the In—Ga—Zn oxide films of the samples 2 and 3 are CAAC-OS films.

<HAADF-STEM>

FIGS. 38A and 38B show cross-sectional images obtained by observing cross-sectional atomic arrangement of the samples 2 and 3 by high-angle annular dark field scanning transmission electron microscopy (HAADF-STEM). Here, the In—Ga—Zn oxide films of the samples were observed at an acceleration voltage of 200 kV and at a magnification of 8,000,000 times.

FIG. 38A is a cross-sectional image obtained by observing the sample 2, and FIG. 38B is a cross-sectional image obtained by observing the sample 3.

In a HAADF-STEM image, a contrast proportional to the square of an atomic number is obtained; therefore, a brighter dot indicates an atom with a larger mass. In FIGS. 38A and 38B, bright dots indicated by arrows represent In atoms, and dark dots therebetween represent Ga or Zn atoms. Note that it is difficult to distinguish Ga and Zn from each other because they have roughly the same mass. In addition, oxygen atoms having a small mass are not observed.

FIG. 38A shows that In, Ga, or Zn atoms are arranged in parallel layers. There are two or three layers of Ga or Zn atoms between layers of In atoms indicated by the arrows.

FIG. 38B shows that In, Ga, or Zn atoms are arranged in parallel layers. There are three or four layers of Ga or Zn atoms between layers of In atoms indicated by the arrows.

FIGS. 38A and 38B show that the In—Ga—Zn oxide films of the samples 2 and 3 each have a homologous structure because there are periodic layers including In atoms, between which there are a plurality of layers including Ga or Zn atoms. In other words, an In—Ga—Zn oxide film having a homologous structure can be formed by using a sputtering target containing Zn at a higher ratio than that of Ga.

Example 2

In this example, films of In—Ga—Zn oxides having different compositions were stacked using sputtering targets containing In—Ga—Zn oxides having different compositions. Band diagrams and crystal structures of the films formed will be described.

Here, the samples 1 to 4, 6, 7, and 10 described in Example 1 were used. Note that a silicon wafer was used as the substrate for each of the samples 1 to 4, 6, 7, and 10.

Furthermore, a sample was formed by stacking over a silicon wafer the In—Ga—Zn oxide film (20 nm thick) of the sample 1, the In—Ga—Zn oxide film (15 nm thick) of the sample 10, and the In—Ga—Zn oxide film (5 nm thick) of the sample 1 in this order. This sample is referred to as a sample 11.

A sample was formed by stacking over a silicon wafer the In—Ga—Zn oxide film (20 nm thick) of the sample 2, the In—Ga—Zn oxide film (15 nm thick) of the sample 10, and the In—Ga—Zn oxide film (10 nm thick) of the sample 2 in this order. This sample is referred to as a sample 12.

A sample was formed by stacking over a silicon wafer the In—Ga—Zn oxide film (20 nm thick) of the sample 3, the In—Ga—Zn oxide film (10 nm thick) of the sample 10, and the In—Ga—Zn oxide film (15 nm thick) of the sample 3 in this order. This sample is referred to as a sample 13.

<Band Diagram>

An energy difference between the conduction band bottom $E_c$ and the valence band top $E_v$, i.e., the energy gap $E_g$, of the In—Ga—Zn oxide film of each of the samples 1 to 4, 6, 7, and 10 formed in Example 1 was measured using a spectroscopic ellipsometer. Furthermore, an energy difference between the vacuum level $E_{vac}$ and the valence band top $E_v$, i.e., the ionization potential Ip, was measured by ultraviolet photoelectron spectroscopy (UPS). Then, an energy difference between the vacuum level $E_{vac}$ and the conduction band bottom $E_c$, i.e., the electron affinity $\chi$, was calculated by calculating a difference between the ionization potential Ip and the energy gap $E_g$. Band diagrams thus obtained are shown in FIG. 39.

Figure 39:
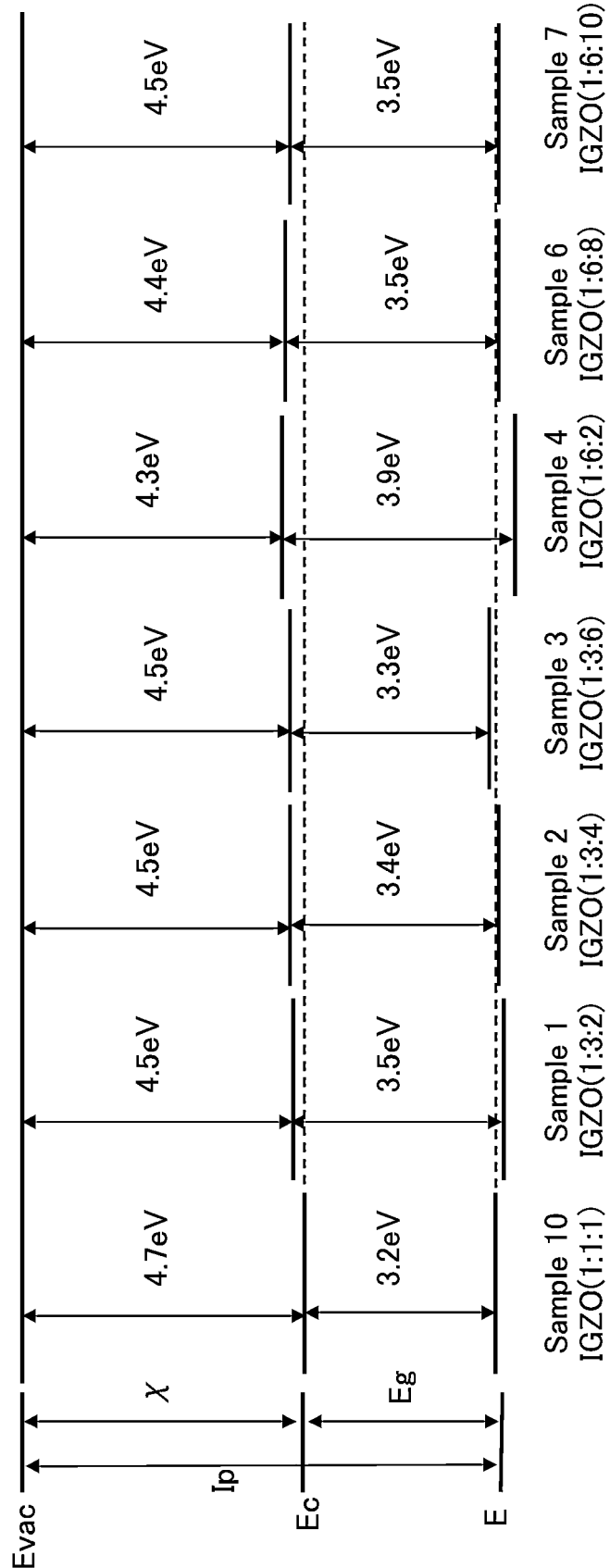
FIG. 39 shows band diagrams of In—Ga—Zn oxide films.

As shown in FIG. 39, the samples 1 to 4, 6, and 7 have smaller electron affinity $\chi$ than that of the sample 10, and the energy differences are greater than or equal to 0.2 eV and less than or equal to 0.4 eV.

Next, band diagrams of the samples 12 and 13 are described with reference to FIGS. 40A and 40B.

Figure 40A:
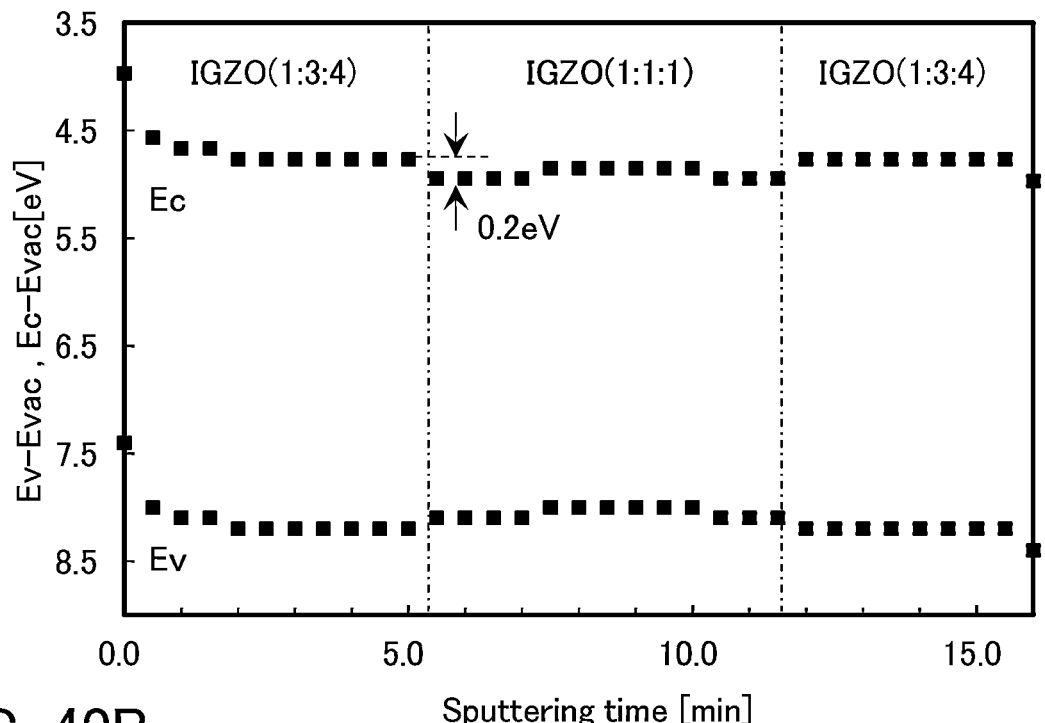
FIGS. 40A and 40B show band diagrams of In—Ga—Zn oxide films.
Figure 40B:
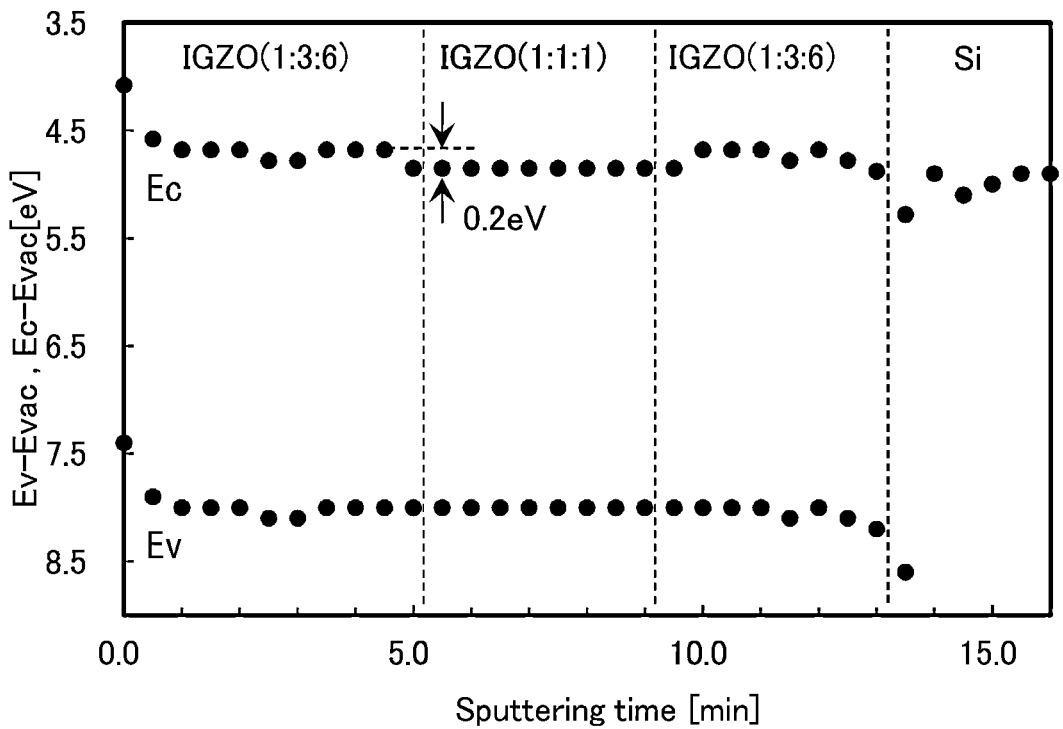

FIG. 40A shows a band diagram obtained by measuring the ionization potential Ip and the energy gap $E_g$ of the sample 12, and FIG. 40B shows a band diagram obtained by measuring the ionization potential Ip and the energy gap $E_g$ of the sample 13. In each of FIGS. 40A and 40B, the horizontal axis represents sputtering time, and the vertical axis represents the energy difference between the valence band top $E_v$ and the vacuum level $E_{vac}$ ($E_v$–$E_{vac}$) and the energy difference between the conduction band bottom $E_c$ and the vacuum level $E_{vac}$ ($E_c$–$E_{vac}$).

Here, the energy difference between the vacuum level $E_{vac}$ and the valence band top $E_v$, i.e., the ionization potential Ip, of the In—Ga—Zn oxide film of each of the samples 12 and 13 was plotted which was measured by ultraviolet photoelectron spectroscopy while a surface of the In—Ga—Zn oxide film was sputtered with argon ions. Furthermore, the energy difference between the conduction band bottom $E_c$ and the valence band top $E_v$, i.e., the energy gap $E_g$, was measured using a spectroscopic ellipsometer. Next, the energy difference between the vacuum level $E_{vac}$ and the conduction band bottom $E_c$, the electron affinity $\chi$, was calculated by calculating the difference between the ionization potential Ip and the energy gap $E_g$. Then, the valence band top $E_v$ and the conduction band bottom $E_c$ were plotted.

FIG. 40A shows that the energy difference between the conduction band bottom $E_c$ of the In—Ga—Zn oxide film of the sample 2 and that of the In—Ga—Zn oxide film of the sample 10 is 0.2 eV. It can be seen that the In—Ga—Zn oxide film of the sample 10 serves as a well when provided between the In—Ga—Zn oxide films of the sample 2.

FIG. 40B shows that the energy difference between the conduction band bottom $E_c$ of the In—Ga—Zn oxide film of the sample 3 and that of the In—Ga—Zn oxide film of the sample 10 is 0.2 eV. It can be seen that the In—Ga—Zn oxide film of the sample 10 serves as a well when provided between the In—Ga—Zn oxide films of the sample 3.

<TEM>

Figure 41:
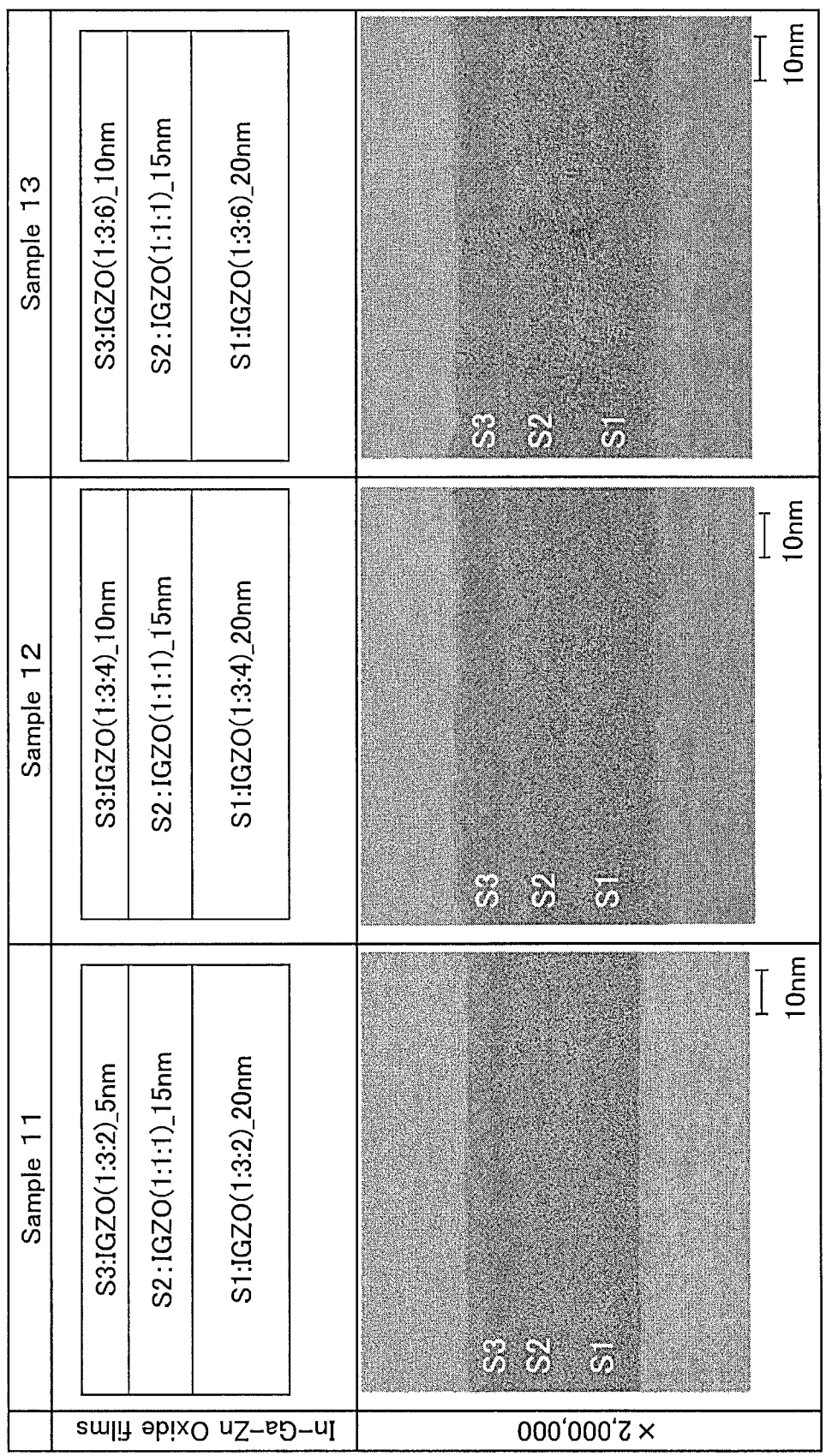
FIG. 41 shows cross-sectional TEM images of samples 11 to 13.
Figure 42:
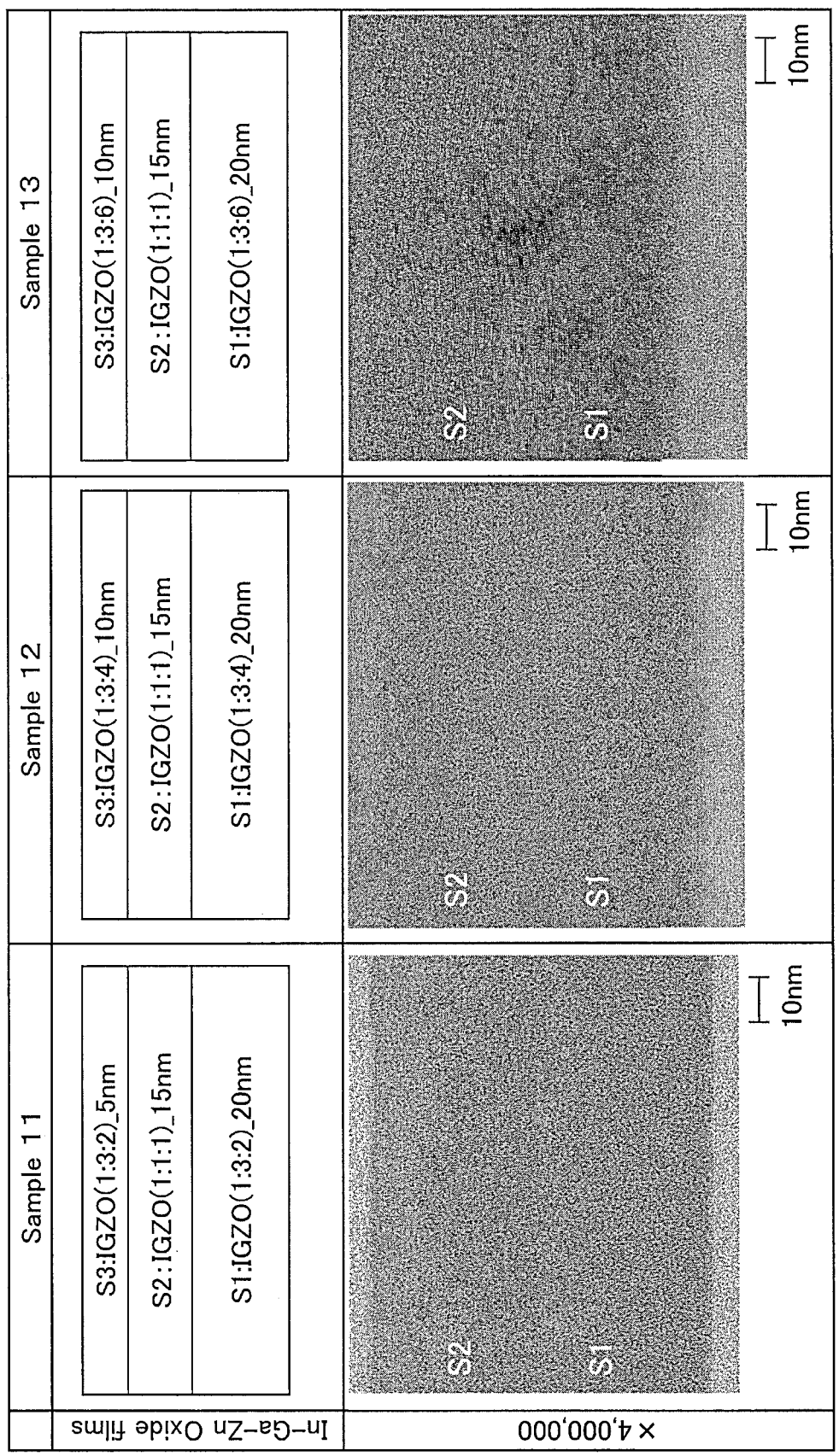
FIG. 42 shows cross-sectional TEM images of samples 11 to 13.

FIGS. 41 to 43 show cross-sectional images (bright-field images) obtained by observing cross-sectional atomic arrangement of the samples 11 to 13 using a transmission electron microscope (TEM). Here, the In—Ga—Zn oxide films of the samples were observed at an acceleration voltage of 300 kV and at magnifications of 2,000,000 times and 4,000,000 times.

FIG. 41 shows cross-sectional images of the samples 11 to 13 observed at a magnification of 2,000,000 times. FIG. 42 shows cross-sectional images of the samples 11 to 13 observed at a magnification of 4,000,000 times. FIG. 43 shows partial enlarged cross-sectional images of FIG. 42. In FIGS. 41 to 43, the In—Ga—Zn oxide film stacked are denoted by S1, S2, and S3 sequentially from the substrate side. In FIG. 43, white broken lines indicate the vicinity of the interface between S1 and S2.

As shown in FIG. 41, in the samples 12 and 13, S1 to S3 formed using different sputtering targets have uniform crystallinity.

As shown in FIG. 42, in the sample 11, crystallinity is not observed in S1, and crystallinity is observed only in S2. On the other hand, in the samples 12 and 13, crystallinity is observed in S1 to S3.

As shown in FIG. 43, it can be seen that the In—Ga—Zn oxide films of the samples 12 and 13 have orderly atomic arrangement parallel to the upper surfaces. At the interface between S1 and S2, orderly parallel atomic arrangement can be seen. This suggests that S1 and S2 of each of the samples 12 and 13 are CAAC-OS films, and that there is little crystal distortion at the interface between S1 and S2.

An In—Ga—Zn oxide film having a homologous structure can be formed by using a sputtering target containing Zn at a higher ratio than that of Ga. Furthermore, a CAAC-OS film can be formed by using a sputtering target containing Zn at a higher ratio than that of Ga. An In—Ga—Zn oxide film including a plurality of layers stacked using sputtering targets having different compositions has a uniform crystal structure throughout the film and has little crystal distortion at the interface between the layers.

Therefore, the amount of defects in the In—Ga—Zn oxide film formed in this example can be reduced, changes in electrical characteristics of a semiconductor device formed using the In—Ga—Zn oxide film can be reduced, and the reliability thereof can be improved.

This application is based on Japanese Patent Application serial no. 2013-038402 filed with Japan Patent Office on Feb. 28, 2013, the entire contents of which are hereby incorporated by reference.

What is claimed is:

1. A semiconductor device comprising:
    a gate electrode;
    a gate insulating film over the gate electrode;
    a first oxide film over the gate insulating film, the first oxide film comprising In, Ga and Zn;
    a second oxide film over the first oxide film, the second oxide film comprising In, Ga and Zn; and
    a source electrode and a drain electrode over the second oxide film,
    wherein the first oxide film comprises a microcrystal,
    wherein the second oxide film comprises a c-axis aligned crystal part, and
    wherein an atomic ratio of metal elements of the second oxide film satisfies Zn>Ga and Ga>In.

2. The semiconductor device according to claim 1, wherein the c-axes of the c-axis aligned crystal part are aligned in a direction parallel to a normal vector of a surface where the second oxide film is formed or a top surface of the second oxide film.

3. The semiconductor device according to claim 1,
    wherein a direction of an a-axis of a first region of the second oxide film is different from a direction of an a-axis of a second region of the second oxide film, and
    wherein a direction of a b-axis of the first region of the second oxide film is different from a direction of a b-axis of the second region of the second oxide film.

4. The semiconductor device according to claim 1, wherein an electron diffraction pattern of the second oxide film shows a plurality of bright spots.

5. The semiconductor device according to claim 1,
    wherein the second oxide film comprises crystals aligned in a c-axis direction in the c-axis aligned crystal part, and
    wherein a size of the crystals of the second oxide film is greater than or equal to 1 nm and less than or equal to 100 nm.

* * * * *